United States Patent
Kaneko et al.

(10) Patent No.: US 12,227,669 B2
(45) Date of Patent: Feb. 18, 2025

(54) RESIN COMPOSITION, FILM, COLOR FILTER, SOLID-STATE IMAGING ELEMENT, IMAGE DISPLAY DEVICE, RESIN, AND COMPOUND

(71) Applicant: FUJIFILM Corporation, Tokyo (JP)

(72) Inventors: Yushi Kaneko, Shizuoka (JP); Akio Mizuno, Shizuoka (JP); Yutaro Fukami, Shizuoka (JP); Masaomi Makino, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 500 days.

(21) Appl. No.: 17/560,255

(22) Filed: Dec. 23, 2021

(65) Prior Publication Data

US 2022/0112399 A1 Apr. 14, 2022

Related U.S. Application Data

(63) Continuation of application No. PCT/JP2020/025752, filed on Jul. 1, 2020.

(30) Foreign Application Priority Data

Jul. 11, 2019 (JP) ................................. 2019-128980
Feb. 27, 2020 (JP) ................................. 2020-031112

(51) Int. Cl.
| C09D 7/41 | (2018.01) |
| C08G 81/02 | (2006.01) |
| C08K 5/00 | (2006.01) |
| C09D 187/00 | (2006.01) |
| G02B 5/20 | (2006.01) |

(52) U.S. Cl.
CPC ........ *C09D 187/005* (2013.01); *C08G 81/024* (2013.01); *C08K 5/0041* (2013.01); *C09D 7/41* (2018.01); *G02B 5/20* (2013.01)

(58) Field of Classification Search
CPC .... C09D 7/41; C09D 187/005; C08K 5/0041; C08G 81/024; G02B 5/20
See application file for complete search history.

(56) References Cited

FOREIGN PATENT DOCUMENTS

| JP | H047333 | 1/1992 | |
| JP | H047333 A * | 1/1992 | ............. C08G 73/10 |
| JP | H083500 | 1/1996 | |
| JP | H083500 A * | 1/1996 | ............. C09D 11/00 |
| JP | 2008029901 | 2/2008 | |
| JP | 2011231281 | 11/2011 | |
| JP | 2011231281 A * | 11/2011 | ............. C08G 73/10 |
| JP | WO2010047346 A1 * | 3/2012 | ............. C08G 73/10 |
| WO | 2008007776 | 1/2008 | |
| WO | 2010047346 | 4/2010 | |

OTHER PUBLICATIONS

Helmut Keul ⇧, Stefan Mommer, Martin Möller, Poly(amide urethane)s with functional/reactive side groups based on a bis-cyclic bio-based monomer/coupling agent, European Polymer Journal 49 (2013) 853-864 855. (Year: 2013).*
Helmut Keul et al., "Poly(amide urethane)s with functional/reactive side groups based on a bis-cyclic bio-based monomer/coupling agent," European Polymer Journal, Apr. 2013, pp. 853-864.
"International Search Report (Form PCT/ISA/210) of PCT/JP2020/025752," mailed on Sep. 29, 2020, with English translation thereof, pp. 1-7.
"Written Opinion of the International Searching Authority (Form PCT/ISA/237)" of PCT/JP2020/025752, mailed on Sep. 29, 2020, with English translation thereof, pp. 1-8.
"Office Action of Japan Counterpart Application" with English translation thereof, issued on Nov. 22, 2022, p. 1-p. 12.

* cited by examiner

*Primary Examiner* — Bijan Ahvazi
(74) *Attorney, Agent, or Firm* — JCIPRNET

(57) ABSTRACT

Provided are a resin composition including a pigment, a resin including a repeating unit represented by Formula (1), and a solvent; a film formed of the resin composition; a color filter; a solid-state imaging element; an image display device; a resin; and a compound.

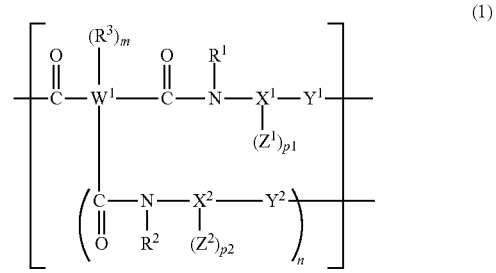

14 Claims, No Drawings

RESIN COMPOSITION, FILM, COLOR FILTER, SOLID-STATE IMAGING ELEMENT, IMAGE DISPLAY DEVICE, RESIN, AND COMPOUND

CROSS-REFERENCE TO RELATED APPLICATIONS

This application is a Continuation of PCT International Application No. PCT/JP2020/025752 filed on Jul. 1, 2020, which claims priority under 35 U.S.C § 119 (a) to Japanese Patent Application No. 2019-128980 filed on Jul. 11, 2019 and Japanese Patent Application No. 2020-031112 filed on Feb. 27, 2020. Each of the above application(s) is hereby expressly incorporated by reference, in its entirety, into the present application.

BACKGROUND OF THE INVENTION

1. Field of the Invention

The present invention relates to a resin composition including a pigment. The present invention further relates to a film formed of the resin composition, a color filter, a solid-state imaging element, and an image display device. The present invention further relates to a resin and a compound.

2. Description of the Related Art

In recent years, as a digital camera, a mobile phone with a camera, and the like have been further spreading, there has been a greatly increasing demand for a solid-state imaging element such as a charge coupled device (CCD) image sensor. A color filter has been used as a key device in a display or an optical element. The color filter normally includes pixels of three primary colors of red, green, and blue, and acts to separate transmitted light into the three primary colors.

The color filter is manufactured by using a resin composition including a colorant such as a pigment, a resin, and a solvent.

In addition, in a case where the pigment is used as a colorant, in order to improve temporal stability of the resin composition, the pigment is dispersed in the resin composition using a dispersant or the like.

JP2008-029901A discloses a dispersant represented by the following formula.

In the above formula, as $A^1$ to $A^4$,
two are monovalent polymer moieties (P) which has the same or different molecular weights of 200 to 5000, and the other two are the same or different —C(=O)OH or —CH$_2$C(=O)OH,
one is a monovalent polymer moiety (P) which has a molecular weight of 200 to 5000, and the other three are the same or different —C(=O)OH or —CH$_2$C(=O)OH, or
one is a monovalent polymer moiety (P) which has a molecular weight of 200 to 5000, the other two are the same or different —C(=O)OH or —CH$_2$C(=O)OH, and the other one is —C(=O)—X$^a$—R$^a$ (where X$^a$ is —O— or —N(R$^{a2}$)—, R$^a$ is an alkyl group having 1 to 18 carbon atoms or the like, and R$^{a2}$ is a hydrogen atom or an alkyl group having 1 to 18 carbon atoms or the like), and
$X^1$ is a predetermined tetravalent group.

WO2008/007776A discloses a polyester dispersant which is produced by radical polymerization of an ethylenically unsaturated monomer in the presence of a compound (a1) having two hydroxyl groups and one thiol group in the molecule, and is produced by reacting a hydroxyl group in a vinyl polymer (a) having two hydroxyl groups in one terminal region with an acid anhydride group in a tetracarboxylic acid anhydride (b).

SUMMARY OF THE INVENTION

In the resin composition including a pigment, a resin, and a solvent, it is preferable that dispersibility of the pigment is good. In a case where the dispersibility of the pigment is insufficient, the pigment tends to aggregate and coarsen in the resin composition, or the viscosity of the resin composition tends to increase. In addition, even in a case where the viscosity of the resin composition immediately after production is low, the viscosity may increase with time.

According to studies of the present inventor, it has been found that, even in the inventions disclosed in JP2008-029901A and WO2008/007776A, the dispersibility of the pigment is not sufficient and there is room for further improvement.

Therefore, an object of the present invention is to provide a resin composition having excellent dispersibility of a pigment. Another object of the present invention is to provide a film formed of the resin composition, a color filter, a solid-state imaging element, and an image display device. Another object of the present invention is to provide a resin used for a resin composition or the like having excellent dispersibility of a pigment. Another object of the present invention is to provide a compound used for producing the resin and the like.

According to the studies conducted by the present inventors, it has been found that the above-described objects can be achieved by adopting the following configuration, thereby leading to the completion of the present invention. Therefore, the present invention provides the following.

<1> A resin composition comprising:
a pigment;
a resin including a repeating unit represented by Formula (1); and
a solvent,

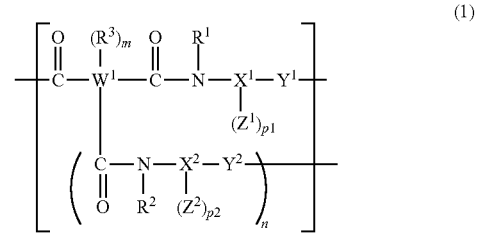

in Formula (1),
m represents an integer of 0 to 4, n represents 0 or 1, and m+n is 0 to 4,
p1 and p2 each independently represent 1 or 2, $W^1$ represents a (2+m+n)-valent linking group, $R^1$ and $R^2$ each independently represent a hydrogen atom, an alkyl group, an aryl group, or a heterocyclic group, $R^3$ represents a substituent, and m pieces of $R^3$'s may be the same or different from each other, $X^1$ represents a (2+p1)-valent linking group, $X^2$ represents a (2+p2)-valent linking group, $Y^1$ and $Y^2$ each independently represent —O— or —NRy-, where Ry represents a hydrogen atom, an alkyl group, an aryl group, or a heterocyclic group, and $Z^1$ and $Z^2$ each independently represent a polymer chain having a weight-average molecular weight of 500 or more.

<2> The resin composition according to <1>, in which n in Formula (1) is 0.

<3> The resin composition according to <1> or <2>, in which m in Formula (1) represents an integer of 1 to 4, and in a case where m is 1, $R^3$ represents a carboxy group, and in a case where m is 2 to 4, at least one of m pieces of $R^3$'s is a carboxy group.

<4> The resin composition according to any one of <1> to <3>, in which $Y^1$ and $Y^2$ in Formula (1) each independently represent —NRy-, where Ry represents a hydrogen atom, an alkyl group, an aryl group, or a heterocyclic group.

<5> The resin composition according to any one of <1> to <4>, in which the polymer chain represented by $Z^1$ and $Z^2$ in Formula (1) includes at least one structural repeating unit selected from a poly(meth)acrylic structural repeating unit, a polystyrene structural repeating unit, a polyether structural repeating unit, or a polyester structural repeating unit.

<6> The resin composition according to any one of <1> to <5>, in which the polymer chain represented by $Z^1$ and $Z^2$ in Formula (1) has an ethylenically unsaturated bond-containing group.

<7> The resin composition according to any one of <1> to <6>, in which the polymer chain represented by $Z^1$ and $Z^2$ in Formula (1) has at least one selected from an epoxy group, an oxetanyl group, or a blocked isocyanate group.

<8> The resin composition according to any one of <1> to <7>, in which the polymer chain represented by $Z^1$ and $Z^2$ in Formula (1) includes a repeating unit represented by any one of Formula (P1-1), ..., or Formula (P1-6),

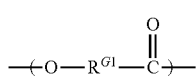

(P1-1)

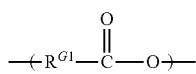

(P1-2)

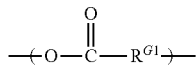

(P1-3)

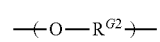

(P1-4)

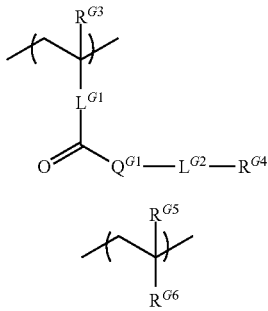

(P1-5)

(P1-6)

in the formulae, $R^{G1}$ and $R^{G2}$ each represent an alkylene group, $R^{G3}$ represents a hydrogen atom, a methyl group, a fluorine atom, a chlorine atom, or a hydroxymethyl group, $Q^{G1}$ represents —O— or —$NR^q$—, where $R^q$ represents a hydrogen atom, an alkyl group, an aryl group, or a heterocyclic group, $L^{G1}$ represents a single bond or an arylene group, $L^{G2}$ represents a single bond or a divalent linking group, $R^{G4}$ represents a hydrogen atom or a substituent, and $R^{G5}$ represents a hydrogen atom or a methyl group and $R^{G6}$ represents an aryl group.

<9> The resin composition according to <8>, in which $R^{G4}$ in Formula (P1-5) is an ethylenically unsaturated bond-containing group, an epoxy group, an oxetanyl group, or a blocked isocyanate group.

<10> The resin composition according to any one of <1> to <9>, in which the (2+p1)-valent linking group represented by $X^1$ in Formula (1) and the (2+p2)-valent linking group represented by $X^2$ are groups including a sulfur atom.

<11> The resin composition according to any one of <1> to <10>, in which the (2+p1)-valent linking group represented by $X^1$ in Formula (1) is a group represented by Formula (X-1), and the (2+p2)-valent linking group represented by $X^2$ is a group represented by Formula (X-2),

(X-1)

(X-2)

in Formula (X-1), $X^{1a}$ represents a (2+p1)-valent hydrocarbon group, p1 represents 1 or 2, *1 is a bonding site with a nitrogen atom adjacent to $X^1$ in Formula (1), *2 is a bonding site with $Y^1$ in Formula (1), and *3 is a bonding site with $Z^1$ in Formula (1), in Formula (X-2), $X^{2a}$ represents a (2+p2)-valent hydrocarbon group, p2 represents 1 or 2, *11 is a bonding site with a nitrogen atom adjacent to $X^2$ in Formula (1), *12 is a bonding site with $Y^2$ in Formula (1), and *13 is a bonding site with $Z^2$ in Formula (1).

<12> The resin composition according to any one of <1> to <11>, further comprising:
a polymerizable compound.
<13> The resin composition according to any one of <1> to <12>, further comprising:
a photopolymerization initiator.
<14> The resin composition according to any one of <1> to <13>,
in which the resin composition is used for forming a colored pixel of a color filter.
<15> The resin composition according to <14>,
in which the resin composition is used for forming a cyan pixel, a magenta pixel, or a yellow pixel.
<16> A film formed of the resin composition according to any one of <1> to <15>.
<17> A color filter comprising:
the film according to <16>.
<18> A solid-state imaging element comprising:
the film according to <16>.
<19> An image display device comprising:
the film according to <16>.
<20> A resin comprising:
a repeating unit represented by Formula (1),

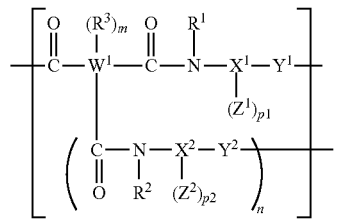

(1)

in Formula (1),
m represents an integer of 0 to 4, n represents 0 or 1, and m+n is 0 to 4,
p1 and p2 each independently represent 1 or 2,
$W^1$ represents a (2+m+n)-valent linking group,
$R^1$ and $R^2$ each independently represent a hydrogen atom, an alkyl group, an aryl group, or a heterocyclic group,
$R^3$ represents a substituent, and m pieces of $R^3$'s may be the same or different from each other,
$X^1$ represents a (2+p1)-valent linking group,
$X^2$ represents a (2+p2)-valent linking group,
$Y^1$ and $Y^2$ each independently represent —O— or —NRy-, where Ry represents a hydrogen atom, an alkyl group, an aryl group, or a heterocyclic group, and
$Z^1$ and $Z^2$ each independently represent a polymer chain having a weight-average molecular weight of 500 or more.
<21> A compound represented by Formula (10),

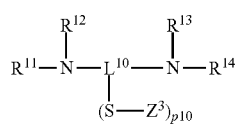

(10)

in Formula (10), $R^{11}$ to $R^{14}$ each independently represent a hydrogen atom or a substituent, $L^{10}$ represents a (2+p10)-valent hydrocarbon group, p10 represents 1 or 2, and $Z^3$ represents a polymer chain having a weight-average molecular weight of 500 or more.

According to the present invention, it is possible to provide a resin composition having excellent dispersibility of a pigment. According to the present invention, it is also possible to provide a film formed of the resin composition, a color filter, a solid-state imaging element, and an image display device. According to the present invention, it is also possible to provide a resin used for a resin composition or the like having excellent dispersibility of a pigment. According to the present invention, it is also possible to provide a compound used for producing the resin and the like.

DESCRIPTION OF THE PREFERRED EMBODIMENTS

Hereinafter, the contents of the present invention will be described in detail.

In the present specification, "to" is used to refer to a meaning including numerical values denoted before and after "to" as a lower limit value and an upper limit value.

In the present specification, unless specified as a substituted group or as an unsubstituted group, a group (atomic group) denotes not only a group (atomic group) having no substituent but also a group (atomic group) having a substituent. For example, an "alkyl group" includes not only an alkyl group having no substituent (unsubstituted alkyl group), but also an alkyl group having a substituent (substituted alkyl group).

In the present specification, unless specified otherwise, "exposure" denotes not only exposure using light but also drawing using a corpuscular beam such as an electron beam or an ion beam. In addition, examples of light used for the exposure include actinic rays or radiation such as a bright line spectrum of a mercury lamp, far ultraviolet rays typified by an excimer laser, extreme ultraviolet rays (EUV light), X-rays, or electron beams.

In the present specification, "(meth)acrylate" denotes either or both of acrylate and methacrylate, "(meth)acryl" denotes either or both of acryl and methacryl, and "(meth) acryloyl" denotes either or both of acryloyl and methacryloyl.

In the present specification, a weight-average molecular weight and a number-average molecular weight are values in terms of polystyrene through measurement by a gel permeation chromatography (GPC) method.

In the present specification, the total solid content refers to a total mass of components other than a solvent from all the components of a composition.

In the present specification, a pigment means a compound which is hardly dissolved in a solvent.

In the present specification, the term "step" is not only an independent step, but also includes a step which is not clearly distinguished from other steps in a case where an intended action of the step is obtained.

In the present specification, in a structural formula, Me represents a methyl group, Et represents an ethyl group, Bu represents a butyl group, and Boc represents a tert-butoxycarbonyl group.

<Resin Composition>

A resin composition according to an embodiment of the present invention includes a pigment, a resin including a repeating unit represented by Formula (1), and a solvent.

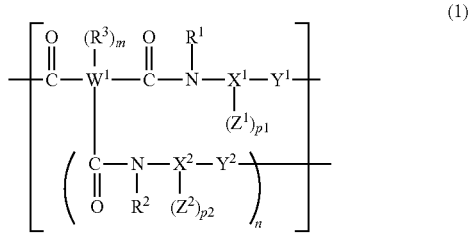
(1)

In Formula (1), m represents an integer of 0 to 4, n represents 0 or 1, and m+n is 0 to 4, p1 and p2 each independently represent 1 or 2, $W^1$ represents a (2+m+n)-valent linking group, $R^1$ and $R^2$ each independently represent a hydrogen atom, an alkyl group, an aryl group, or a heterocyclic group, $R^3$ represents a substituent, and m pieces of $R^3$'s may be the same or different from each other, $X^1$ represents a (2+p1)-valent linking group, $X^2$ represents a (2-p2)-valent linking group, $Y^1$ and $Y^2$ each independently represent —O— or —NRy-, where Ry represents a hydrogen atom, an alkyl group, an aryl group, or a heterocyclic group, and $Z^1$ and 72 each independently represent a polymer chain having a weight-average molecular weight of 500 or more.

The resin composition according to the embodiment of the present invention has excellent dispersibility of the pigment. Although the detailed reason why such an effect is obtained is unclear, in Formula (1), since a structure in which an amide group (—C(═O)—NR$^1$— group) is bonded to $W^1$ which is a (2+m+n)-valent linking group is included, it is presumed that adsorption of the resin on a surface of the pigment is promoted. Among these, in a case where $Y^1$ and $Y^2$ are —NRy-, the dispersibility of the pigment can be further improved.

In addition, by using the resin composition according to the embodiment of the present invention, it is possible to form a film having excellent heat resistance and moisture resistance. Among these, in a case where $Y^1$ and $Y^2$ are —NRy-, the heat resistance and moisture resistance of the obtained film can be further improved. Since the resin including the repeating unit represented by Formula (1) has a structure in which the above-described amide group is bonded to $W^1$, it is presumed that it is difficult to be thermally decomposed or hydrolyzed. Furthermore, it is presumed that cyclization may occur due to heating during film formation (for example, heating at post-baking). For this reason, it is presumed that it is possible to form a film having excellent heat resistance and moisture resistance.

In addition, in a case where a pattern is formed using the resin composition according to the embodiment of the present invention by a photolithography method, a pattern having good rectangularity can be formed. Since the resin including the repeating unit represented by Formula (1) has a structure in which the above-described amide group is bonded to $W^1$, hydrophilicity is high. In addition, since this resin is easily adsorbed on the surface of the pigment, the resin tends to be present in the vicinity of the pigment. Therefore, it is presumed that the developability in the vicinity of the hydrophobic pigment can be effectively enhanced. As a result, a developer can be uniformly permeated into the film to efficiently develop and remove the resin composition in a non-exposed portion, and accordingly, it is presumed that a pattern having good rectangularity could be formed.

The resin composition according to the embodiment of the present invention can be used for a color filter, a near-infrared transmission filter, a near-infrared cut filter, a black matrix, a light-shielding film, a refractive index adjusting film, and the like. In particular, the resin composition according to the embodiment of the present invention can be preferably used as a resin composition for a color filter. Specifically, the resin composition according to the embodiment of the present invention can be preferably used as a resin composition for forming a colored pixel of a color filter. Examples of the colored pixel include a red pixel, a green pixel, a blue pixel, a magenta pixel, a cyan pixel, and a yellow pixel. For example, the resin composition according to the embodiment of the present invention can be used as a resin composition for forming a magenta pixel, a cyan pixel, or a yellow pixel in a color filter. In addition, the resin composition according to the embodiment of the present invention can be used as a resin composition for forming a red pixel, a green pixel, or a blue pixel in a color filter. In addition, the resin composition according to the embodiment of the present invention can also be suitably used for a pixel configuration described in WO2019/102887A. Hereinafter, the resin composition according to the embodiment of the present invention will be described in detail.

<<Pigment>>

The resin composition according to the embodiment of the present invention contains a pigment. Examples of the pigment include a white pigment, a black pigment, a chromatic pigment, and a near-infrared absorbing pigment. In the present invention, the white pigment includes not only a pure white pigment but also a bright gray (for example, grayish-white, light gray, and the like) pigment close to white. In addition, the pigment may be an inorganic pigment or an organic pigment, but from the viewpoint that dispersion stability is more easily improved, an organic pigment is preferable. In addition, as the pigment, a pigment having a maximal absorption wavelength in a wavelength range of 400 to 2000 nm is preferable, and a pigment having a maximal absorption wavelength in a wavelength range of 400 to 700 nm is more preferable. In addition, in a case of using a pigment (preferably a chromatic pigment) having a maximal absorption wavelength in a wavelength range of 400 to 700 nm, the resin composition according to the embodiment of the present invention can be preferably used as a resin composition for forming a colored pixel in a color filter.

(Chromatic Pigment)

The chromatic pigment is not particularly limited, and a known chromatic pigment can be used. Examples of the chromatic pigment include a pigment having a maximal absorption wavelength in a wavelength range of 400 to 700 nm. Examples thereof include a yellow pigment, an orange pigment, a red pigment, a green pigment, a violet pigment, and a blue pigment. Specific examples of these pigments include the following pigments.

Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232

(methine-based), 233 (quinoline-based), 234 (aminoketone-based), 235 (aminoketone-based), 236 (aminoketone-based), and the like (all of which are yellow pigments);

C. I. Pigment Orange 2, 5, 13, 16, 17:1, 31, 34, 36, 38, 43, 46, 48, 49, 51, 52, 55, 59, 60, 61, 62, 64, 71, 73, and the like (all of which are orange pigments);

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, 294, 297 (aminoketone-based) (xanthene-based, Organo Ultramarine, Bluish Red), 295 (monoazo-based), 296 (diazo-based), and the like (all of which are red pigments);

C. I. Pigment Green 7, 10, 36, 37, 58, 59, 62, 63, 64 (phthalocyanine-based), 65 (phthalocyanine-based), 66 (phthalocyanine-based), and the like (all of which are green pigments);

C. I. Pigment Violet 1, 19, 23, 27, 32, 37, 42, 60 (triarylmethane-based), 61 (xanthene-based), and the like (all of which are violet pigments); and C. I. Pigment Blue 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A. In addition, as the green pigment, a compound described in CN2010-6909027A, a phthalocyanine compound described in WO2012/102395A, which has phosphoric acid ester as a ligand, a phthalocyanine compound described in JP2019-008014A, a phthalocyanine compound described in JP2018-180023A, a compound described in JP2019-038958A, and the like can also be used.

In addition, an aluminum phthalocyanine compound having a phosphorus atom can also be used as the blue pigment. Specific examples thereof include the compounds described in paragraphs 0022 to 0030 of JP2012-247591A and paragraph 0047 of JP2011-157478A.

In addition, as the yellow pigment, compounds described in JP2017-201003A, compounds described in JP2017-197719A, compounds described in paragraph Nos. 0011 to 0062 and 0137 to 0276 of JP2017-171912A, compounds described in paragraph Nos. 0010 to 0062 and 0138 to 0295 of JP2017-171913A, compounds described in paragraph Nos. 0011 to 0062 and 0139 to 0190 of JP2017-171914A, compounds described in paragraph Nos. 0010 to 0065 and 0142 to 0222 of JP2017-171915A, quinophthalone compounds described in paragraph Nos. 0011 to 0034 of JP2013-054339A, quinophthalone compounds described in paragraph Nos. 0013 to 0058 of JP2014-026228A, isoindoline compounds described JP2018-062644A, quinophthalone compounds described in JP2018-203798A, quinophthalone compounds described in JP2018-062578A, quinophthalone compounds described in JP6432076B, quinophthalone compounds described in JP2018-155881A, quinophthalone compounds described in JP2018-111757A, quinophthalone compounds described in JP2018-040835A, quinophthalone compounds described in JP2017-197640A, quinophthalone compounds described in JP2016-145282A, quinophthalone compounds described in JP2014-085565A, quinophthalone compounds described in JP2014-021139A, quinophthalone compounds described in JP2013-209614A, quinophthalone compounds described in JP2013-209435A, quinophthalone compounds described in JP2013-181015A, quinophthalone compounds described in JP2013-061622A, quinophthalone compounds described in JP2013-032486A, quinophthalone compounds described in JP2012-226110A, quinophthalone compounds described in JP2008-074987A, quinophthalone compounds described in JP2008-081565A, quinophthalone compounds described in JP2008-074986A, quinophthalone compounds described in JP2008-074985A, quinophthalone compounds described in JP2008-050420A, quinophthalone compounds described in JP2008-031281A, quinophthalone compounds described in JP1973-032765A (JP-S48-032765A), quinophthalone compounds described in JP2019-008014A, a compound represented by Formula (QP1), and a compound represented by Formula (QP2) can also be used.

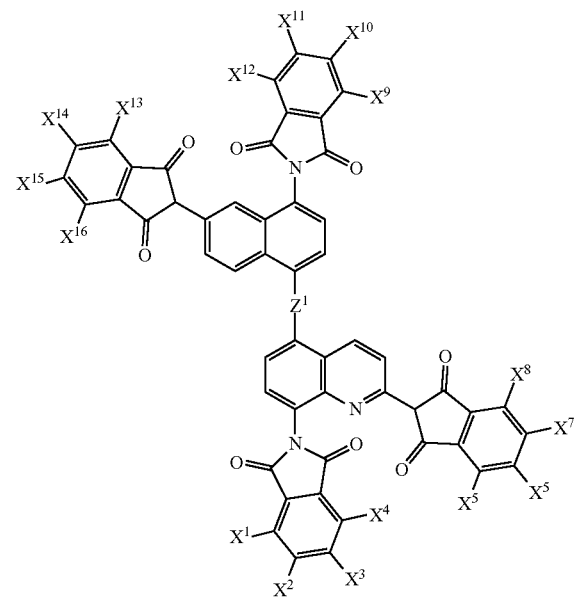

(QP1)

In Formula (QP1), $X^1$ to $X^{16}$ each independently represent a hydrogen atom or a halogen atom, and $Z^1$ represents an alkylene group having 1 to 3 carbon atoms. Specific examples of the compound represented by Formula (QP1) include compounds described in paragraph No. 0016 of JP6443711B.

(QP2)

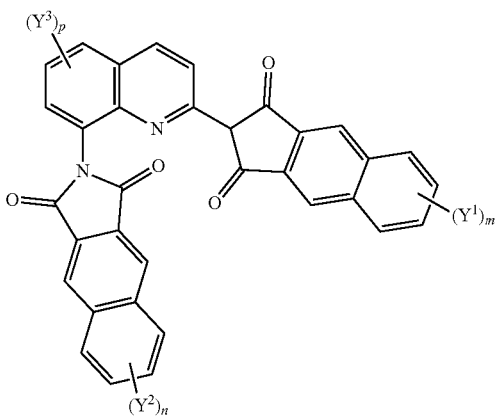

In Formula (QP2), $Y^1$ to $Y^3$ each independently represent a halogen atom. n and m represent an integer of 0 to 6, and p represents an integer of 0 to 5. (n+m) is 1 or more. Specific examples of the compound represented by Formula (QP2) include compounds described in paragraph Nos. 0047 and 0048 of JP6432077B.

A diketopyrrolopyrrole pigment described in JP2017-201384A, in which the structure has at least one substituted bromine atom, a diketopyrrolopyrrole pigment described in paragraph Nos. 0016 to 0022 of JP6248838, a red pigment described in JP6516119B, a red pigment described in JP6525101B, and the like can also be used as the red pigment. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used. As the compound, a compound represented by Formula (DPP1) is preferable, and a compound represented by Formula (DPP2) is more preferable.

(DPP1)

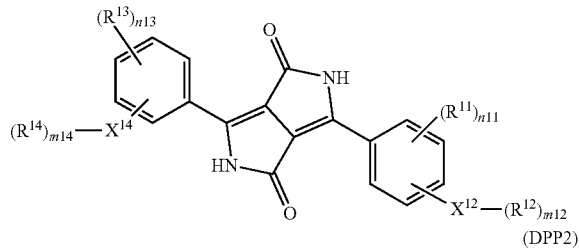

(DPP2)

In the formulae, $R^{11}$ and $R^{13}$ each independently represent a substituent, $R^{12}$ and $R^{14}$ each independently represent a hydrogen atom, an alkyl group, an aryl group, or a heteroaryl group, n11 and n13 each independently represent an integer of 0 to 4, $X^{12}$ and $X^{14}$ each independently represent an oxygen atom, a sulfur atom, or a nitrogen atom, in a case where $X^{12}$ is an oxygen atom or a sulfur atom, m12 represents 1, in a case where $X^{12}$ is a nitrogen atom, m12 represents 2, in a case where $X^{14}$ is an oxygen atom or a sulfur atom, m14 represents 1, and in a case where $X^{14}$ is a nitrogen atom, m14 represents 2. Examples of the substituent represented by $R^{11}$ and $R^{13}$ include groups mentioned in the substituent T described later, and preferred specific examples thereof include an alkyl group, an aryl group, a halogen atom, an acyl group, an alkoxycarbonyl group, an aryloxycarbonyl group, a heteroaryloxycarbonyl group, an amide group, a cyano group, a nitro group, a trifluoromethyl group, a sulfoxide group, and a sulfo group.

In the present invention, the chromatic pigment may be used in combination of two or more kinds thereof. For example, green color may be formed in a combination of C. I. Pigment Green 7, C. I. Pigment Green 36, C. I. Pigment Yellow 139, and C. I. Pigment Yellow 185, or in a combination of C. I. Pigment Green 58, C. I. Pigment Yellow 150, and C. I. Pigment Yellow 185.

In addition, in a case where the chromatic pigment is used in combination of two or more kinds thereof, the combination of two or more chromatic pigments may form black. Examples of such a combination include the following aspects (1) to (7). In a case where two or more chromatic pigments are included in the resin composition and the combination of two or more chromatic pigments forms black, the resin composition according to the embodiment of the present invention can be preferably used as a resin composition for forming the near-infrared transmission filter.

(1) aspect in which a red pigment and a blue pigment are contained.
(2) aspect in which a red pigment, a blue pigment, and a yellow pigment are contained.
(3) aspect in which a red pigment, a blue pigment, a yellow pigment, and a violet pigment are contained.
(4) aspect in which a red pigment, a blue pigment, a yellow pigment, a violet pigment, and a green pigment are contained.
(5) aspect in which a red pigment, a blue pigment, a yellow pigment, and a green pigment are contained.
(6) aspect in which a red pigment, a blue pigment, and a green pigment are contained.
(7) aspect in which a yellow pigment and a violet pigment are contained.

(White Pigment)

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. In addition, the white pigment is preferably a particle having a refractive index of 2.10 or more with respect to light having a wavelength of 589 nm. The above-mentioned refractive index is preferably 2.10 to 3.00 and more preferably 2.50 to 2.75.

In addition, as the white pigment, the titanium oxide described in "Titanium Oxide-Physical Properties and Applied Technology, written by Manabu Kiyono, pages 13 to 45, published in Jun. 25, 1991, published by Gihodo Shuppan Co., Ltd." can also be used.

The white pigment is not limited to a compound formed of a single inorganic substance, and may be particles combined with other materials. For example, it is preferable to use a particle having a pore or other materials therein, a particle having a large number of inorganic particles attached to a core particle, or a core-shell composite particle composed of a core particle formed of polymer particles and a shell layer formed of inorganic fine nanoparticles. With regard to the core-shell composite particle composed of a core particle formed of polymer particles and a shell layer formed of inorganic fine nanoparticles, reference can be made to, for example, the descriptions in paragraph Nos. 0012 to 0042 of JP2015-047520A, the contents of which are incorporated herein by reference.

As the white pigment, hollow inorganic particles can also be used. The hollow inorganic particles refer to inorganic particles having a structure with a cavity therein, and the cavity is enclosed by an outer shell. As the hollow inorganic particles, hollow inorganic particles described in JP2011-075786A, WO2013/061621A, JP2015-164881A, and the like can be used, the contents of which are incorporated herein by reference.

(Black Pigment)

The black pigment is not particularly limited, and a known black pigment can be used. Examples thereof include carbon black, titanium black, and graphite, and carbon black or titanium black is preferable and titanium black is more preferable. The titanium black is black particles containing a titanium atom, and is preferably lower titanium oxide or titanium oxynitride. The surface of the titanium black can be modified, as necessary, according to the purpose of improving dispersibility, suppressing aggregating properties, and the like. For example, the surface of the titanium black can be coated with silicon oxide, titanium oxide, germanium oxide, aluminum oxide, magnesium oxide, or zirconium oxide. In addition, a treatment with a water-repellent substance as described in JP2007-302836A can be performed. Examples of the black pigment include Color Index (C. I.) Pigment Black 1 and 7. It is preferable that the titanium black has a small primary particle diameter of the individual particles and has a small average primary particle diameter. Specifically, the average primary particle diameter thereof is preferably 10 to 45 nm. The titanium black can be used as a dispersion. Examples thereof include a dispersion which includes titanium black particles and silica particles and in which the content ratio of Si atoms to Ti atoms is adjusted to a range of 0.20 to 0.50. With regard to the dispersion, reference can be made to the description in paragraphs 0020 to 0105 of JP2012-169556A, the content of which is incorporated herein by reference. Examples of a commercially available product of the titanium black include Titanium black 10S, 12S, 13R, 13M, 13M-C, 13R-N, 13M-T (trade name; manufactured by Mitsubishi Materials Corporation) and Tilack D (trade name; manufactured by Akokasei Co., Ltd.).

(Near-Infrared Absorbing Pigment)

The near-infrared absorbing pigment is preferably an organic pigment. In addition, the near-infrared absorbing pigment preferably has a maximal absorption wavelength in a wavelength range of more than 700 nm and 1400 nm or less. In addition, the maximal absorption wavelength of the near-infrared absorbing pigment is preferably 1200 nm or less, more preferably 1000 nm or less, and still more preferably 950 nm or less. In addition, in the near-infrared absorbing pigment, $A_{550}/A_{max}$, which is a ratio of an absorbance $A_{550}$ at a wavelength of 550 nm to an absorbance $A_{max}$ at the maximal absorption wavelength, is preferably 0.1 or less, more preferably 0.05 or less, still more preferably 0.03 or less, and particularly preferably 0.02 or less. The lower limit is not particularly limited, but for example, may be 0.0001 or more or may be 0.0005 or more. In a case where the ratio of the above-described absorbance is within the above-described range, a near-infrared absorbing pigment excellent in visible transparency and near-infrared rays shielding property can be obtained. In the present invention, the maximal absorption wavelength of the near-infrared absorbing pigment and values of absorbance at each wavelength are values obtained from an absorption spectrum of a film formed by using a coloring composition including the near-infrared absorbing pigment. The near-infrared absorbing pigment is not particularly limited, and examples thereof include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound. Among these, at least one compound selected from a pyrrolopyrrole compound, a squarylium compound, a cyanine compound, a phthalocyanine compound, or a naphthalocyanine compound is preferable, and a pyrrolopyrrole compound or a squarylium compound is more preferable, and a pyrrolopyrrole compound is particularly preferable.

The content of the pigment in the total solid content of the resin composition is preferably 30 mass % or more, more preferably 40 mass % or more, and still more preferably 50 mass % or more. The upper limit is preferably 80 mass % or less, more preferably 75 mass % or less, and still more preferably 70 mass % or less.

<<Pigment Derivative>>

The resin composition according to the embodiment of the present invention can contain a pigment derivative. Examples of the pigment derivative include a compound having a structure in which a part of a chromophore is substituted with an acid group or a basic group. Examples of the chromophore constituting the pigment derivative include a quinoline skeleton, a benzimidazolone skeleton, a diketopyrrolopyrrole skeleton, an azo skeleton, a phthalocyanine skeleton, an anthraquinone skeleton, a quinacridone skeleton, a dioxazine skeleton, a perinone skeleton, a perylene skeleton, a thioindigo skeleton, an isoindoline skeleton, an isoindolinone skeleton, a quinophthalone skeleton, a threne skeleton, and a metal complex skeleton. Among these, a quinoline skeleton, a benzimidazolone skeleton, a diketopyrrolopyrrole skeleton, an azo skeleton, a quinophthalone skeleton, an isoindoline skeleton, or a phthalocyanine skeleton is preferable, and an azo skeleton or a benzimidazolone skeleton is more preferable. Examples of the acid group include a sulfo group, a carboxy group, a phosphoric acid group, and a salt thereof. Examples of an atom or atomic group constituting the salts include alkali metal ions ($Li^+$, $Na^+$, $K^+$, and the like), alkaline earth metal ions ($Ca^{2+}$, $Mg^{2+}$, and the like), an ammonium ion, an imidazolium ion, a pyridinium ion, and a phosphonium ion. Examples of the basic group include an amino group, a pyridyl group, or a salt thereof, a salt of an ammonium group, and a phthalimidomethyl group. Examples of an atom or atomic group constituting the salts include a hydroxide ion, a halogen ion, a carboxylate ion, a sulfonate ion, and a phenoxide ion.

In the present invention, as the pigment derivative, a pigment derivative having excellent visible transparency (hereinafter, also referred to as a transparent pigment derivative) can be contained. The maximum value ($\varepsilon$max) of the molar absorption coefficient of the transparent pigment derivative in a wavelength range of 400 to 700 nm is preferably 3000 L·mol$^{-1}$·cm$^{-1}$ or less, more preferably 1000 L mol$^{-1}$·cm$^{-1}$ or less, and still more preferably 100

L·mol$^{-1}$·cm$^{-1}$ or less. The lower limit of εmax is, for example, 1 L·mol$^{-1}$·cm$^{-1}$ or more and may be 10 L·mol$^{-1}$·cm$^{-1}$ or more.

Specific examples of the pigment derivative include compounds described in Example described later and compounds described in JP1981-118462A (JP-S56-118462A), JP1988-264674A (JP-S63-264674A), JP1989-217077A (JP-H01-217077A), JP1991-009961A (JP-H03-009961A), JP1991-026767A (JP-H03-026767A), JP1991-153780A (JP-H03-153780A), JP1991-045662A (JP-H03-045662A), JP1992-285669A (JP-H04-285669A), JP1994-145546A (JP-H06-145546A), JP1994-212088A (JP-H06-212088A), JP1994-240158A (JP-H06-240158A), JP1998-030063A (JP-H10-030063A), JP1998-195326A (JP-H10-195326A), paragraph Nos. 0086 to 0098 of WO2011/024896A, paragraph Nos. 0063 to 0094 of WO2012/102399A, paragraph No. 0082 of WO2017/038252A, paragraph No. 0171 of JP2015-151530A, paragraph Nos. 0162 to 0183 of JP2011-252065A, JP2003-081972A, JP5299151B, JP2015-172732A, JP2014-199308A, JP2014-085562A, JP2014-035351A, and JP2008-081565A.

The content of the pigment derivative is preferably 1 to 30 parts by mass and still more preferably 3 to 20 parts by mass with respect to 100 parts by mass of the pigment. The pigment derivative may be used singly or in combination of two or more kinds thereof. In a case where two or more kinds thereof are used in combination, the total amount thereof is preferably within the above-described range.

<<Dye>>

The resin composition according to the embodiment of the present invention can contain a dye. The dye is not particularly limited and a known dye can be used. The dye may be a chromatic dye or may be a near-infrared absorbing dye. Examples of the chromatic dye include a pyrazolcazo compound, an anilinoazo compound, a triarylmethane compound, an anthraquinone compound, an anthrapyridone compound, a benzylidene compound, an oxonol compound, a pyrazolotriazoleazo compound, a pyridoneazo compound, a cyanine compound, a phenothiazine compound, a pyrrolopyrazoleazomethine compound, a xanthene compound, a phthalocyanine compound, a benzopyran compound, an indigo compound, and a pyrromethene compound. Examples of the near-infrared absorbing dye include a pyrrolopyrrole compound, a rylene compound, an oxonol compound, a squarylium compound, a cyanine compound, a croconium compound, a phthalocyanine compound, a naphthalocyanine compound, a pyrylium compound, an azurenium compound, an indigo compound, and a pyrromethene compound.

As the dye, a coloring agent multimer can also be used. The coloring agent multimer has two or more coloring agent structures in one molecule, and preferably has three or more coloring agent structures in one molecule. The upper limit is particularly not limited, but may be 100 or less. A plurality of coloring agent structures included in one molecule may be the same coloring agent structure or different coloring agent structures. The weight-average molecular weight (Mw) of the coloring agent multimer is preferably 2000 to 50000. The lower limit is more preferably 3000 or more and still more preferably 6000 or more. The upper limit is more preferably 30000 or less and still more preferably 20000 or less. As the coloring agent multimer, the compounds described in JP2011-213925A, JP2013-041097A, JP2015-028144A, JP2015-030742A, JP2016-102191A, WO2016/031442A, or the like can also be used.

In a case where the resin composition contains a dye, the content of the dye in the total solid content of the resin composition is preferably 1 mass % or more and more preferably 5 mass % or more. The upper limit is not particularly limited, but is preferably 70 mass % or less, more preferably 65 mass % or less, and still more preferably 60 mass % or less. In addition, the content of the dye is preferably 5 to 50 parts by mass with respect to 100 parts by mass of the pigment. The upper limit is preferably 45 parts by mass or less and more preferably 40 parts by mass or less. The lower limit is preferably 10 parts by mass or more and still more preferably 15 parts by mass or more.

In addition, it is also possible that the resin composition according to the embodiment of the present invention does not substantially contain the dye. The case where the resin composition according to the embodiment of the present invention does not substantially include the dye means that the content of the dye in the total solid content of the resin composition according to the embodiment of the present invention is preferably 0.1 mass % or less, more preferably 0.05 mass % or less, and particularly preferably 0 mass %.

<<Resin>>

The resin composition according to the embodiment of the present invention includes a resin. The resin is blended in, for example, an application for dispersing a pigment or the like in the resin composition or an application as a binder. Mainly, a resin which is used for dispersing a pigment or the like in the resin composition is also referred to as a dispersant. However, such applications of the resin are merely exemplary, and the resin can also be used for other purposes in addition to such applications.

<<<Resin A>>>

The resin composition according to the embodiment of the present invention includes a resin (hereinafter, also referred to as a resin A) including a repeating unit represented by Formula (1). The resin A is also the resin according to the embodiment of the present invention. The resin A is preferably used as a dispersant.

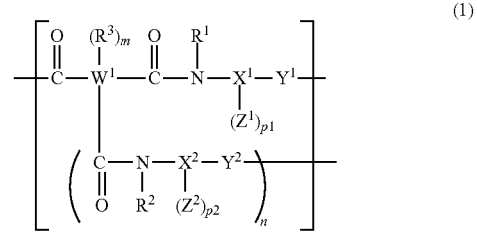

In Formula (1), m represents an integer of 0 to 4, n represents 0 or 1, and m+n is 0 to 4, p1 and p2 each independently represent 1 or 2, $W^1$ represents a (2+m+n)-valent linking group, $R^1$ and $R^2$ each independently represent a hydrogen atom, an alkyl group, an aryl group, or a heterocyclic group, $R^3$ represents a substituent, and m pieces of $R^3$'s may be the same or different from each other, $X^1$ represents a (2+p1)-valent linking group, $X^2$ represents a (2+p2)-valent linking group, $Y^1$ and $Y^2$ each independently represent —O— or —NRy-, where Ry represents a hydrogen atom, an alkyl group, an aryl group, or a heterocyclic group, and $Z^1$ and $Z^2$ each independently represent a polymer chain having a weight-average molecular weight of 500 or more.

In Formula (1), m represents an integer of 0 to 4, and is preferably an integer of 1 to 3, more preferably 2 or 3, and still more preferably 2. In addition, n represents 0 or 1, and is preferably 0. In addition, m+n is preferably 2 to 4, more preferably 2 or 3, and still more preferably 2. In addition, p1 and p2 each independently represent 1 or 2, and are preferably 1.

Examples of the (2+m+n)-valent linking group represented by $W^1$ include a group composed of 1 to 100 carbon atoms, 0 to 10 nitrogen atoms, 0 to 50 oxygen atoms, 1 to 200 hydrogen atoms, and 0 to 20 sulfur atoms. Specific examples of the (2+m+n)-valent linking group represented by W' include a group including an aromatic ring, a group including a hetero ring, and an aliphatic hydrocarbon group. Examples of the aliphatic hydrocarbon group include a saturated or unsaturated acyclic aliphatic hydrocarbon group, and a saturated or unsaturated aliphatic hydrocarbon group including an aliphatic ring. The aliphatic ring may be a single ring or a fused ring. In addition, the aliphatic ring may have a crosslinking structure.

From the reason that foreign matters are unlikely to be generated due to strong affinity for the pigment, the (2+m+n)-valent linking group represented by $W^1$ is preferably a group including an aromatic ring. Examples of the group including an aromatic ring include a group represented by any one of Formula (W-1), Formula (W-2), or Formula (W-3).

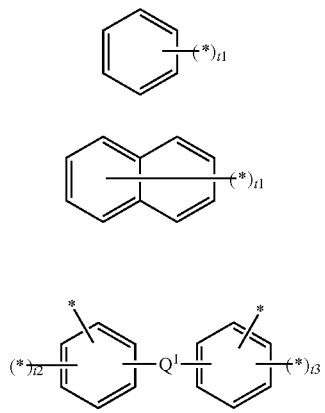

(W-1)

(W-2)

(W-3)

In the formulae, * represents a bonding site.

t1 represents an integer of 2 to 6.

t2 and t3 each independently represent 0 to 4, and t2+t3 is 0 to 4. $Q^1$ represents a single bond, —O—, —CO—, —COOCH$_2$CH$_2$OCO—, —SO$_2$—, —C(CF$_3$)$_2$—, a group represented by Formula (Q-1), or a group represented by Formula (Q-2).

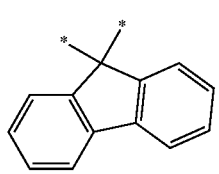

(Q-1)

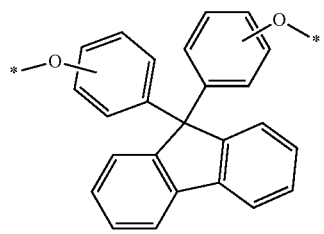

(Q-2)

Specific examples of the (2+m+n)-valent linking group represented by $W^1$ include groups shown below.

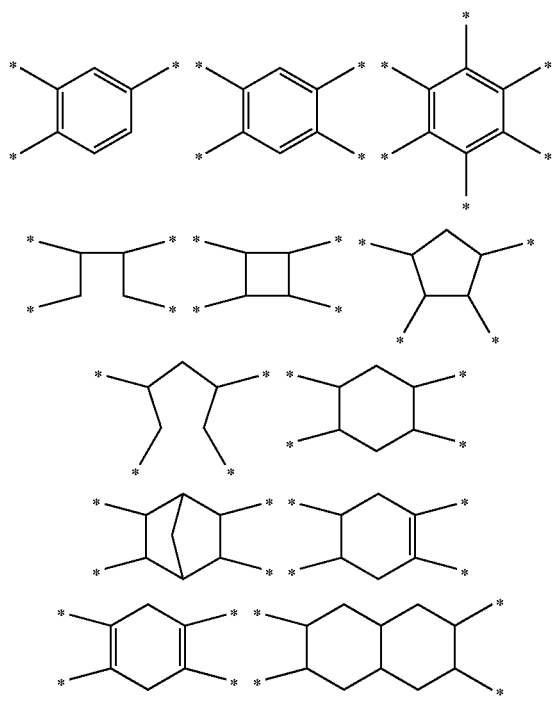

In Formula (1), $R^1$ and $R^2$ each independently represent a hydrogen atom, an alkyl group, an aryl group, or a heterocyclic group, and are preferably a hydrogen atom or an alkyl group and more preferably a hydrogen atom.

The alkyl group represented by $R^1$ and $R^2$ preferably has 1 to 30 carbon atoms, more preferably has 1 to 15 carbon atoms, still more preferably has 1 to 8 carbon atoms, even more preferably has 1 to 5 carbon atoms, and particularly preferably has 1 to 3 carbon atoms. The alkyl group may be any of linear, branched, and cyclic forms, and is preferably linear or branched and more preferably linear.

The aryl group represented by $R^1$ and $R^2$ preferably has 6 to 30 carbon atoms, more preferably has 6 to 20 carbon atoms, and still more preferably has 6 to 12 carbon atoms.

The heterocyclic group represented by $R^1$ and $R^2$ may be a non-aromatic heterocyclic group or an aromatic heterocyclic group. The heterocyclic group is preferably a 5-membered ring or a 6-membered ring. Examples of the kind of the heteroatom constituting the heterocyclic group include a nitrogen atom, an oxygen atom, and a sulfur atom. The number of heteroatoms constituting the heterocyclic group is preferably 1 to 3. The heterocyclic group may be a single ring or a fused ring.

The above-described alkyl group, aryl group, and heterocyclic group may have a substituent or may be unsubstituted. Examples of the substituent include the substituent T shown below.

(Substituent T)

An alkyl group (preferably an alkyl group having 1 to 30 carbon atoms), an alkenyl group (preferably an alkenyl group having 2 to 30 carbon atoms), an alkynyl group (preferably an alkynyl group having 2 to 30 carbon atoms), an aryl group (preferably an aryl group having 6 to 30 carbon atoms), an amino group (preferably an amino group having 0 to 30 carbon atoms), an alkoxy group (preferably an alkoxy group having 1 to 30 carbon atoms), an aryloxy group (preferably an aryloxy group having 6 to 30 carbon atoms), a heteroaryloxy group (preferably a heteroaryloxy group having 1 to 30 carbon atoms), an acyl group (preferably an acyl group having 2 to 30 carbon atoms), an alkoxycarbonyl group (preferably an alkoxycarbonyl group having 2 to 30 carbon atoms), an aryloxycarbonyl group (preferably an aryloxycarbonyl group having 7 to 30 carbon atoms), an acyloxy group (preferably an acyloxy group having 2 to 30 carbon atoms), an acylamino group (preferably an acylamino group having 2 to 30 carbon atoms), an alkoxycarbonylamino group (preferably an alkoxycarbonylamino group having 2 to 30 carbon atoms), an aryloxycarbonylamino group (preferably an aryloxycarbonylamino group having 7 to 30 carbon atoms), a sulfamoyl group (preferably a sulfamoyl group having 0 to 30 carbon atoms), a carbamoyl group (preferably a carbamoyl group having 1 to 30 carbon atoms), an alkylthio group (preferably an alkylthio group having 1 to 30 carbon atoms), an arylthio group (preferably an arylthio group having 6 to 30 carbon atoms), a heteroarylthio group (preferably a heteroarylthio group having 1 to 30 carbon atoms), an alkylsulfonyl group (preferably an alkylsulfonyl group having 1 to 30 carbon atoms), an arylsulfonyl group (preferably an arylsulfonyl group having 6 to 30 carbon atoms), a heteroarylsulfonyl group (preferably a heteroarylsulfonyl group having 1 to 30 carbon atoms), an alkylsulfinyl group (preferably an alkylsulfinyl group having 1 to 30 carbon atoms), an arylsulfinyl group (preferably an arylsulfinyl group having 6 to 30 carbon atoms), a heteroarylsulfinyl group (preferably a heteroarylsulfinyl group having 1 to 30 carbon atoms), a ureido group (preferably a ureido group having 1 to 30 carbon atoms), a phosphoric acid amide group (preferably a phosphoric acid amide group having 1 to 30 carbon atoms), a hydroxy group, a mercapto group, a halogen atom (fluorine atom, chlorine atom, bromine atom, iodine atom, and the like), a cyano group, a sulfo group, a carboxy group, a nitro group, a hydroxamic acid group, a sulfino group, a hydrazino group, an imino group, a heterocyclic group. In a case where the above-described groups can be further substituted, the groups may further have a substituent. Examples of the further substituent include the groups described regarding the substituent T.

In Formula (1), $R^3$ represents a substituent, and m pieces of $R^3$'s may be the same or different from each other. Examples of the substituent represented by $R^3$ include the above-described substituent T. It is preferable that at least one of m pieces of $R^3$'s is a carboxy group. That is, it is preferable that m in Formula (1) represents an integer of 1 to 4, and in a case where m is 1, $R^3$ represents a carboxy group, and in a case where m is 2 to 4, at least one of m pieces of $R^3$'s is a carboxy group. According to this aspect, more excellent dispersibility of the pigment is easily obtained.

Examples of the (2-p1)-valent linking group represented by $X^1$ and the (2+p2)-valent linking group represented by $X^2$ in Formula (1) include a hydrocarbon group; and a group formed by a combination of a hydrocarbon group and at least one selected from —O—, —CO—, —COO—, —OCO—, —NH—, or —S—. Examples of the hydrocarbon group include an aliphatic hydrocarbon group and an aromatic hydrocarbon group. The number of carbon atoms in the aliphatic hydrocarbon group is preferably 1 to 30, more preferably 1 to 20, and still more preferably 1 to 15. The aliphatic hydrocarbon group may be linear, branched, or cyclic. The number of carbon atoms in the aromatic hydrocarbon group is preferably 6 to 30, more preferably 6 to 20, and still more preferably 6 to 10. The hydrocarbon group may have a substituent. Examples of the substituent include a hydroxy group.

The (2+p1)-valent linking group represented by $X^1$ and the (2+p2)-valent linking group represented by $X^2$ are preferably a group including a sulfur atom, and more preferably a group formed by a combination of a hydrocarbon group and —S—. Among these, the (2+p1)-valent linking group represented by $X^1$ is preferably a group represented by Formula (X-1). In addition, the (2+p2)-valent linking group represented by $X^2$ is preferably a group represented by Formula (X-2).

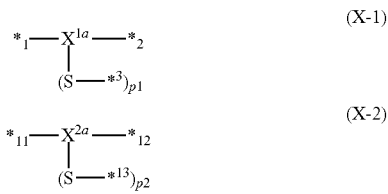

In Formula (X-1), $X^{1a}$ represents a (2+p1)-valent hydrocarbon group, p1 represents 1 or 2, *1 is a bonding site with a nitrogen atom adjacent to $X^1$ in Formula (1), *2 is a bonding site with Y' in Formula (1), and *3 is a bonding site with Z' in Formula (1).

In Formula (X-2), $X^{2a}$ represents a (2+p2)-valent hydrocarbon group, p2 represents 1 or 2, *11 is a bonding site with a nitrogen atom adjacent to $X^2$ in Formula (1), *12 is a bonding site with $Y^2$ in Formula (1), and *13 is a bonding site with $Z^2$ in Formula (1).

Examples of the (2+p1)-valent hydrocarbon group represented by $X^{1a}$ and the (2+p2)-valent hydrocarbon group represented by $X^{2a}$ include an aliphatic hydrocarbon group and an aromatic hydrocarbon group. The number of carbon atoms in the aliphatic hydrocarbon group is preferably 1 to 30, more preferably 1 to 20, and still more preferably 1 to 15. The aliphatic hydrocarbon group may be linear, branched, or cyclic. The number of carbon atoms in the aromatic hydrocarbon group is preferably 6 to 30, more preferably 6 to 20, and still more preferably 6 to 10. The hydrocarbon group may have a substituent. Examples of the substituent include a hydroxy group.

In Formula (1), $Y^1$ and $Y^2$ each independently represent —O— or —NRy-, where Ry represents a hydrogen atom, an alkyl group, an aryl group, or a heterocyclic group. $Y^1$ and $Y^2$ are preferably -NRy-. According to this aspect, excellent dispersibility of the pigment and heat resistance and moisture resistance of the obtained film can be further improved. On the other hand, in a case where $Y^1$ and $Y^2$ are —O—, solubility of the resin A in a solvent can be improved, and properties such as application properties of the resin composition can be improved. The alkyl group, aryl group, and heterocyclic group represented by Ry are synonymous with the alkyl group, aryl group, and heterocyclic group represented by $R^1$ and $R^2$, and the preferred ranges are also the same. Ry is preferably a hydrogen atom or an alkyl group and more preferably a hydrogen atom.

In Formula (1), $Z^1$ and 72 each independently represent a polymer chain having a weight-average molecular weight of 500 or more. The weight-average molecular weight of the polymer chain is preferably 500 to 20000. The lower limit is preferably 1000 or more. The upper limit is preferably 10000 or less, more preferably 5000 or less, and still more preferably 3000 or less. In a case where the weight-average molecular weight of the above-described polymer chain is within the above-described range, more excellent dispersibility of the pigment is easily obtained. The weight-average molecular weight of the polymer chain can be measured by a gel permeation chromatography (GPC) method. More specifically, the weight-average molecular weight of the polymer chain can be calculated from the weight-average molecular weight of a raw material monomer used for introducing the polymer chain. For example, in a case of synthesizing the resin A using the compound represented by Formula (10) described later, the site of the polymer chain $Z^3$ of the compound represented by Formula (10) corresponds to the polymer chains $Z^1$ and $Z^2$ of Formula (1). Therefore, by measuring the weight-average molecular weight of the compound represented by Formula (10) and reducing the molecular weight of sites other than 73 from the weight-average molecular weight of the compound represented by Formula (10), the weight-average molecular weight of the polymer chain can be calculated.

From the viewpoint of dispersibility of the pigment, the number of atoms constituting the bonding chain of the main chain of the polymer chain is preferably 10 or more and more preferably 20 or more. The upper limit is preferably 1000 or less, more preferably 500 or less, still more preferably 100 or less, and particularly preferably 60 or less.

The polymer chain represented by $Z^1$ and $Z^2$ in Formula (1) preferably includes at least one structural repeating unit selected from a poly(meth)acrylic structural repeating unit, a polystyrene structural repeating unit, a polyether structural repeating unit, or a polyester structural repeating unit, more preferably includes at least one structural repeating unit selected from a poly(meth)acrylic structural repeating unit or a polystyrene structural repeating unit, and from the viewpoint of dispersibility and developability of the pigment, still more preferably includes a poly(meth)acrylic structural repeating unit and particularly preferably includes a polyacrylic structural repeating unit. As the poly(meth)acrylic structural repeating unit, from the viewpoint of dispersibility and developability of the pigment, a repeating unit derived from a (meth)acrylic acid alkyl compound in which the number of carbon atoms in the alkoxy portion is 1 to 10 (preferably 1 to 5) is preferable. The polymer chain represented by Z' and $Z^2$ may have a polymerizable group. Examples of the polymerizable group include ethylenically unsaturated bond-containing groups such as a vinyl group, a (meth)allyl group, and a (meth)acryloyl group. In addition, the polymer chain represented by $Z^1$ and $Z^2$ in Formula (1) may have at least one selected from an epoxy group, an oxetanyl group, or a blocked isocyanate group. The polymer chain represented by $Z^1$ and $Z^2$ preferably has at least one selected from an ethylenically unsaturated bond-containing group, an epoxy group, or an oxetanyl group.

The polymer chain represented by $Z^1$ and 72 preferably includes a repeating unit represented by any one of Formulae (P1-1) to (P1-6), more preferably includes a repeating unit represented by Formula (P1-5) or Formula (P1-6), and still more preferably includes a repeating unit represented by Formula (P1-5).

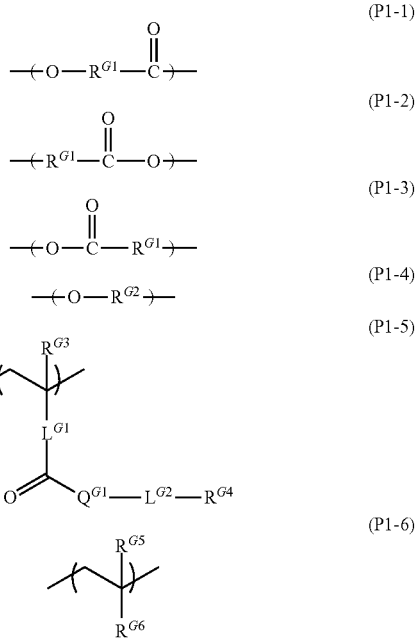

In the formulae, $R^{G1}$ and $R^{G2}$ each represent an alkylene group. As the alkylene group represented by $R^{G1}$ and $R^{G2}$, a linear or branched alkylene group having 1 to 20 carbon atoms is preferable, a linear or branched alkylene group having 2 to 16 carbon atoms is more preferable, and a linear or branched alkylene group having 3 to 12 carbon atoms is still more preferable.

In the formulae, $R^{G3}$ represents a hydrogen atom, a methyl group, a fluorine atom, a chlorine atom, or a hydroxymethyl group, and a hydrogen atom or a methyl group is preferable.

In the formulae, $Q^{G1}$ represents —O— or —NR$^q$—, where R$^q$ represents a hydrogen atom, an alkyl group, an aryl group, or a heterocyclic group. It is preferable that $Q^{G1}$ represents —O—. The alkyl group, aryl group, and heterocyclic group represented by R$^q$ are synonymous with the alkyl group, aryl group, and heterocyclic group represented by $R^1$ and $R^2$, and the preferred ranges are also the same.

In the formulae, $L^{G1}$ represents a single bond or an arylene group, and a single bond is preferable.

In the formulae, $L^{G2}$ represents a single bond or a divalent linking group, and a single bond is preferable. Examples of the divalent linking group include an alkylene group (preferably an alkylene group having 1 to 12 carbon atoms), an arylene group (preferably an arylene group having 6 to 20 carbon atoms), —NH—, —SO—, —SO$_2$—, —CO—, —O—, —COO—, —OCO—, —S—, —NHCO—, —CONH—, and a group including a combination of two or more thereof, and an alkylene group or an arylene group is preferable.

In the formulae, $R^{G4}$ represents a hydrogen atom or a substituent. Examples of the substituent include a hydroxy group, a carboxy group, an alkyl group, an aryl group, a heterocyclic group, an alkoxy group, an aryloxy group, a heterocyclic oxy group, an alkylthioether group, an arylthioether group, a heterothioether group, an ethylenically unsaturated bond-containing group, an epoxy group, an oxetanyl group, and a blocked isocyanate group. The blocked isocyanate group in the present invention is a group capable of generating an isocyanate group by heat, and preferred examples thereof include a group in which an isocyanate group is protected by reacting a blocking agent and an isocyanate group. Examples of the blocking agent include oxime compounds, lactam compounds, phenol compounds, alcohol compounds, amine compounds, active methylene compounds, pyrazole compounds, mercaptan compounds, imidazole compounds, and imide compounds. Examples of the blocking agent include compounds described in paragraph Nos. 0115 to 0117 of JP2017-067930A, the content of which is incorporated herein by reference. In addition, the blocked isocyanate group is preferably a group capable of generating an isocyanate group by heat of 90° C. to 260° C. $R^{G4}$ is preferably an ethylenically unsaturated bond-containing group, an epoxy group, an oxetanyl group, or a blocked isocyanate group, and more preferably an ethylenically unsaturated bond-containing group, an epoxy group, or an oxetanyl group.

In the formulae, $R^{G5}$ represents a hydrogen atom or a methyl group and $R^{G6}$ represents an aryl group. The number of carbon atoms in the aryl group represented by $R^{G6}$ is preferably 6 to 30, more preferably 6 to 20, and still more preferably 6 to 12. The aryl group represented by $R^{G6}$ may have a substituent. Examples of the substituent include a hydroxy group, a carboxy group, an alkyl group, an aryl group, a heterocyclic group, an alkoxy group, an aryloxy group, a heterocyclic oxy group, an alkylthioether group, an arylthioether group, a heterothioether group, a (meth)acryloyl group, an oxetanyl group, a blocked isocyanate group.

The polymer chain represented by $Z^1$ and $Z2$ may include two or more repeating units.

In Formula (1), n represents 0 or 1, and in a case where n is 0, $W^1$ in Formula (1) is a (2+m)-valent linking group. Therefore, in a case where n is 0, Formula (1) has a structure represented by Formula (Ia).

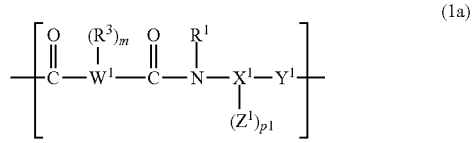
(1a)

In Formula (Ia), m represents an integer of 0 to 4,
p1 represents 1 or 2,
$W^1$ represents a (2+m)-valent linking group,
$R^1$ represents a hydrogen atom, an alkyl group, an aryl group, or a heterocyclic group,
$R^3$ represents a substituent, and m pieces of $R^3$'s may be the same or different from each other,
$X^1$ represents a (2+p1)-valent linking group,
$Y^1$ represents —O— or —NRy-, where Ry represents a hydrogen atom, an alkyl group, an aryl group, or a heterocyclic group, and
$Z^1$ represents a polymer chain having a weight-average molecular weight of 500 or more.

The weight-average molecular weight of the resin A is preferably 3000 to 50000. The upper limit is preferably 40000 or less and more preferably 30000 or less. The lower limit is preferably 4000 or more and more preferably 5000 or more. In a case where the weight-average molecular weight of the resin A is within the above-described range, excellent dispersibility of the pigment is easily obtained.

The acid value of the resin A is preferably 10 to 150 mgKOH/g. The upper limit is preferably 120 mgKOH/g or less and more preferably 100 mgKOH/g or less. The lower limit is preferably 20 mgKOH/g or more and more preferably 40 mgKOH/g or more. In a case where the acid value of the resin A is within the above-described range, excellent dispersibility of the pigment is easily obtained.

Examples of a production method of the resin A include the following methods (A) and (B), and the method (A) is preferable.

(A): method in which, using a compound represented by Formula (MD) as a raw material, a polymer chain Z is formed by polymerization to synthesize a compound represented by (MD-1), and the compound represented by Formula (MD-1) is reacted with at least one compound selected from an acid chloride compound, an ester compound, a carboxylic acid anhydride, or an isocyanate compound (preferably, a carboxylic acid anhydride) to synthesize a resin having the repeating unit represented by Formula (1)

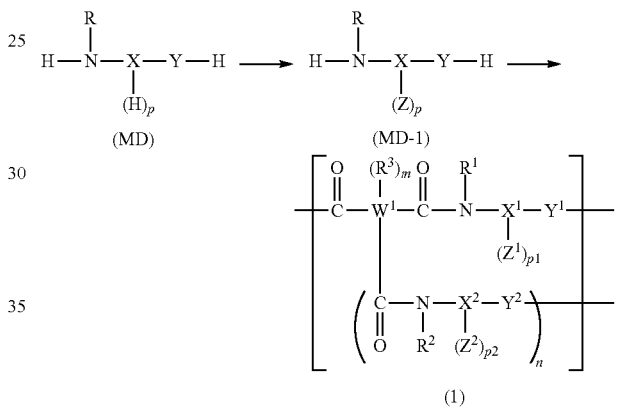
(1)

(B): method in which the compound represented by Formula (MD) is reacted with at least one compound selected from an acid chloride compound, an ester compound, a carboxylic acid anhydride, or an isocyanate compound (preferably, a carboxylic acid anhydride) to synthesize a compound represented by Formula (MD-2), and polymer chains $Z^1$ and $Z^2$ are formed by polymerization to synthesize a resin having the repeating unit represented by Formula (1)

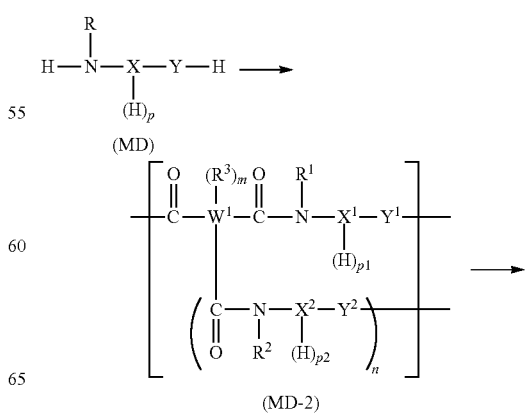
(MD-2)

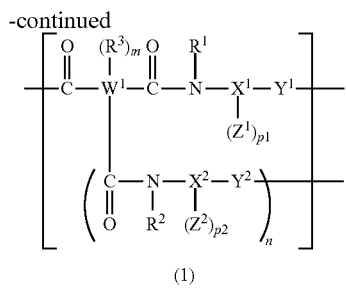

(1)

R, X, Y, and p in Formula (MD) are synonymous with $R^1$, $X^1$, $Y^1$, and p1 in Formula (1). R, X, Y, Z, and p in Formula (MD-1) are synonymous with $R^1$, $X^1$, $Y^1$, $Z^1$, and p1 in Formula (1).

m, n, p1, p2, $W^1$, $R^1$, $R^2$, $R^3$, $X^1$, $X^2$, $Y^1$, and $Y^2$ in Formula (MD-2) are synonymous with m, n, p1, p2, $W^1$, $R^1$, $R^2$, $R^3$, $X^1$, $X^2$, $Y^1$, and $Y^2$ in Formula (1).

The polymer chains Z, $Z^1$, and $Z^2$ can be formed by a method of polymerizing a polymerizable monomer in the presence of a polymerization initiator. Among these, it is preferable to be formed using a thiol compound represented by Formula (S-1). Specifically, it is preferable to polymerize a polymerizable monomer using the thiol compound represented by Formula (S-1) in the presence of a polymerization initiator to form the polymer chain. In a case of passing through the compound of formula (MD-1), an amino base of the thiol compound can be polymerized as it is without protection, but from the viewpoint of reaction selectivity, it is preferable to protect the amino base with a protective group such as alkoxycarbonyl (tert-butoxycarbonyl and the like) or neutralization with an acid. Examples of the polymerizable monomer include a compound having an ethylenically unsaturated bond-containing group. Examples thereof include a (meth)acrylate-based monomer, a (meth)acrylamide-based monomer, a styrene-based monomer, and a vinyl ester-based monomer.

(S-1)

In the above formula, $L^{s1}$ represents a (2+p5)-valent hydrocarbon group and p5 represents 1 or 2.

<<<Other Resins>>>

The resin composition according to the embodiment of the present invention can further include a resin other than the resin A (hereinafter, also referred to other resins).

The weight-average molecular weight (Mw) of the other resin is preferably 2000 to 2000000. The upper limit is preferably 1000000 or less and more preferably 500000 or less. The lower limit is preferably 3000 or more, more preferably 4000 or more, and still more preferably 5000 or more.

Examples of the other resins include a (meth)acrylic resin, a (meth)acrylamide resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamideimide resin, a polyolefin resin, a cyclic olefin resin, a polyester resin, a styrene resin, and a siloxane resin.

The other resins are also preferably a resin having an acid group. Examples of the acid group include a carboxy group, a phosphoric acid group, a sulfo group, and a phenolic hydroxy group. The resin having an acid group can also be used as an alkali-soluble resin or a dispersant. The acid value of the resin having an acid group is preferably 30 to 500 mgKOH/g. The lower limit is more preferably 50 mgKOH/g or more and still more preferably 70 mgKOH/g or more. The upper limit is more preferably 400 mgKOH/g or less, still more preferably 200 mgKOH/g or less, even still more preferably 150 mgKOH/g or less, and most preferably 120 mgKOH/g or less.

As the other resins, a resin including a repeating unit derived from a compound represented by Formula (ED1) and/or a compound represented by Formula (ED2) (hereinafter, these compounds will also be referred to as an "ether dimer") is also preferable.

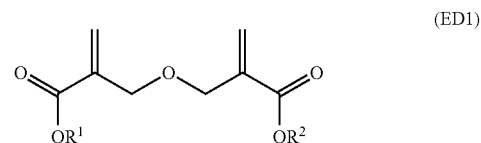

(ED1)

In Formula (ED1), $R^1$ and $R^2$ each independently represent a hydrogen atom or a hydrocarbon group having 1 to 25 carbon atoms, which may have a substituent.

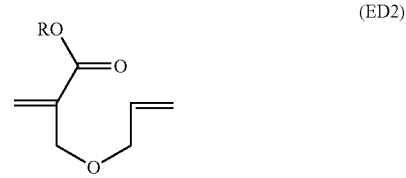

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph No. 0317 of JP2013-029760A, the content of which is incorporated herein by reference.

The other resins are also preferably a resin including a repeating unit having a polymerizable group. By using a resin including a repeating unit having a polymerizable group, it is possible to form a film having excellent color loss resistance, solvent resistance, and heat resistance. Examples of the polymerizable group include ethylenically unsaturated bond-containing groups such as a vinyl group, a (meth)allyl group, and a (meth)acryloyl group.

It is also preferable that the resin composition according to the embodiment of the present invention contains, as the other resins, a resin including a repeating unit derived from a compound represented by Formula (III).

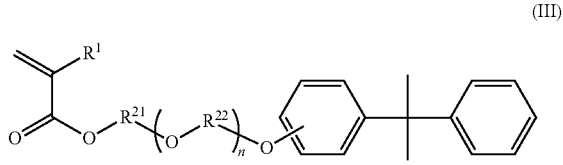

(III)

In the formula, $R^1$ represents a hydrogen atom or a methyl group, $R^{21}$ and $R^{22}$ each independently represent an alkylene group, and n represents an integer of 0 to 15. The number of carbon atoms in the alkylene group represented by $R^{21}$ and $R^{22}$ is preferably 1 to 10, more preferably 1 to 5, still more preferably 1 to 3, and particularly preferably 2 or 3. n represents an integer of 0 to 15, and is preferably an integer of 0 or 5, more preferably an integer of 0 to 4, and still more preferably an integer of 0 to 3.

Examples of the compound represented by Formula (III) include ethylene oxide- or propylene oxide-modified (meth) acrylate of para-cumylphenol. Examples of a commercially available product thereof include ARONIX M-110 (manufactured by TOAGOSEI CO., LTD.).

The other resins are also preferably a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxy group. The acid value of the acidic dispersant (acidic resin) is preferably 10 to 105 mgKOH/g. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The basic group included in the basic dispersant is preferably an amino group.

The resin used as a dispersant preferably includes a repeating unit having an acid group. In a case where the resin used as a dispersant includes a repeating unit having an acid group, the generation of the development residue can be further suppressed in the formation of a pattern by a photolithography method.

It is also preferable that the resin used as a dispersant is a graft resin. With regard to details of the graft resin, reference can be made to the description in paragraph Nos. 0025 to 0094 of JP2012-255128A, the content of which is incorporated herein by reference.

It is also preferable that the resin used as a dispersant is a polyimine-based dispersant including a nitrogen atom in at least one of the main chain or the side chain. As the polyimine-based dispersant, a resin having a main chain which has a partial structure having a functional group of pKa14 or less, and a side chain which has 40 to 10000 atoms, in which at least one of the main chain or the side chain has a basic nitrogen atom, is preferable. The basic nitrogen atom is not particularly limited as long as it is a nitrogen atom exhibiting basicity. With regard to the polyimine-based dispersant, reference can be made to the description in paragraph Nos. 0102 to 0166 of JP2012-255128A, the content of which is incorporated herein by reference.

It is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A.

It is also preferable that the resin used as a dispersant are a resin including a repeating unit having an ethylenically unsaturated bond-containing group in the side chain. The content of the repeating unit having an ethylenically unsaturated bond-containing group in the side chain is preferably 10 mol % or more, more preferably 10 to 80 mol %, and still more preferably 20 to 70 mol % with respect to the total repeating units of the resin.

A commercially available product is also available as the dispersant, and specific examples thereof include DISPERBYK series (for example, DISPERBYK-111, 2001, and the like) manufactured by BYK-Chemie Japan, Solsperse series (for example, Solsperse 20000, 76500, and the like) manufactured by Lubrizol Corporation, and AJISPER series manufactured by Ajinomoto Fine-Techno Co., Inc. In addition, products described in paragraph No. 0129 of JP2012-137564A and products described in paragraph No. 0235 of JP2017-194662A can also be used as the dispersant.

The content of the resin in the total solid content of the resin composition is preferably 5 to 60 mass %. The upper limit is preferably 40 mass % or less and more preferably 30 mass % or less. The lower limit is preferably 10 mass % or more and more preferably 15 mass % or more.

The content of the resin A is preferably 5 to 100 parts by mass with respect to 100 parts by mass of the pigment. The upper limit is preferably 60 parts by mass or less and more preferably 40 parts by mass or less. The lower limit is preferably 10 parts by mass or more and more preferably 20 parts by mass or more. In a case where the ratio of the resin A and the pigment is within the above-described range, excellent dispersibility of the pigment can be obtained.

The content of the resin A in the total solid content of the resin composition is preferably 5 to 60 mass %. The upper limit is preferably 40 mass % or less and more preferably 30 mass % or less. The lower limit is preferably 10 mass % or more and more preferably 15 mass % or more.

The content of the resin A in the total amount of the resin included in the resin composition is preferably 5 to 100 mass %, more preferably 10 to 100 mass %, and still more preferably 15 to 100 mass %.

In a case where the resin composition according to the embodiment of the present invention includes other resins, the content of the other resins is preferably 5 to 150 parts by mass with respect to 100 parts by mass of the resin A. The upper limit is preferably 100 parts by mass or less and more preferably 80 parts by mass or less. The lower limit is preferably 10 parts by mass or more and more preferably 15 parts by mass or more. In addition, the content of the other resins in the total solid content of the resin composition is preferably 1 to 30 mass %. The upper limit is preferably 20 mass % or less and more preferably 15 mass % or less. The lower limit is preferably 3 mass % or more and more preferably 5 mass % or more.

<<Solvent>>

The resin composition according to the embodiment of the present invention contains a solvent. Basically, the solvent is not particularly limited as long as it satisfies the solubility of the respective components and the application properties of the resin composition. As the solvent, an organic solvent is preferable. Examples of the organic solvent include an ester-based solvent, a ketone-based solvent, an alcohol-based solvent, an amide-based solvent, an ether-based solvent, and a hydrocarbon-based solvent. With regard to details thereof, reference can be made to the description in paragraph No. 0223 of WO2015/166779A, the content of which is incorporated herein by reference. In addition, an ester-based solvent substituted with a cyclic alkyl group or a ketone-based solvent substituted with a cyclic alkyl group can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether, propylene glycol monomethyl ether acetate, 3-methoxy-N,N-dimethylpropanamide, and 3-butoxy-N,N-dimethylpropanamide. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

In the present invention, an organic solvent having a low metal content is preferably used. For example, the metal content in the organic solvent is preferably 10 mass parts per billion (ppb) or less. Optionally, an organic solvent having a metal content at a mass parts per trillion (ppt) level may be used. For example, such an organic solvent is available from Toyo Gosei Co., Ltd. (The Chemical Daily, Nov. 13, 2015). Examples of a method for removing impurities such as a metal from the organic solvent include distillation (such as molecular distillation and thin-film distillation) and filtration using a filter. The filter pore size of the filter used for the filtration is preferably 10 μm or less, more preferably 5 μm or less, and still more preferably 3 μm or less. As a material of the filter, polytetrafluoroethylene, polyethylene, or nylon is preferable.

The content of the solvent in the resin composition is preferably 10 to 95 mass %, more preferably 20 to 90 mass %, and still more preferably 30 to 90 mass %.

<<Polymerizable Compound>>

The resin composition according to the embodiment of the present invention preferably contains a polymerizable compound. Examples of the polymerizable compound include a compound having an ethylenically unsaturated bond-containing group. Examples of the ethylenically unsaturated bond-containing group include a vinyl group, a (meth)allyl group, and a (meth)acryloyl group. The polymerizable compound is preferably a compound (radically polymerizable compound) which can be polymerized by radicals.

The polymerizable compound is preferably a compound having three or more ethylenically unsaturated bond-containing groups. The upper limit of the ethylenically unsaturated bond-containing group is preferably 15 or less, more preferably 10 or less, and still more preferably 6 or less. In addition, as the polymerizable compound, a (meth)acrylate compound having 3 or more functional groups is preferable, a (meth)acrylate compound having 3 to 15 functional groups is more preferable, a (meth)acrylate compound having 3 to 10 functional groups is still more preferable, and a (meth) acrylate compound having 3 to 6 functional groups is particularly preferable.

The molecular weight of the polymerizable compound is preferably 100 to 2000. The upper limit is preferably 1500 or less, more preferably 1000 or less, still more preferably 450 or less, and particularly preferably 400 or less. The lower limit is preferably 150 or more.

From the viewpoint of temporal stability of the composition and color loss resistance of a film to be obtained, an ethylenically unsaturated bond-containing group value (hereinafter, referred to as a C=C value) of the polymerizable compound is preferably 2 to 14 mmol/g. The lower limit is preferably 3 mmol/g or more, more preferably 4 mmol/g or more, and still more preferably 5 mmol/g or more. The upper limit is preferably 12 mmol/g or less, more preferably 10 mmol/g or less, and still more preferably 8 mmol/g or less. The C=C value of the polymerizable compound is calculated by dividing the number of ethylenically unsaturated bond-containing groups included in one molecule of the polymerizable compound by the molecular weight of the polymerizable compound.

The polymerizable compound is also preferably a compound including 3 or more ethylenically unsaturated bond-containing groups and having a molecular weight of 450 or less, more preferably a compound including 3 ethylenically unsaturated bond-containing groups and having a molecular weight of 450 or less, and still more preferably a trifunctional (meth)acrylate compound having a molecular weight of 450 or less. According to this aspect, solvent resistance of a film to be obtained can be further improved. The detailed reason for obtaining such an effect is not clear, but it is presumed that a very dense network structure can be formed by exposure. Examples of the polymerizable compound including three ethylenically unsaturated bond-containing groups and having a molecular weight of 450 or less include trimethylolpropane triacrylate, tris(2-acryloyloxyethyl) isocyanurate, and trimethylolpropane ethylene-modified triacrylate.

The polymerizable compound is also preferably a compound having an isocyanurate skeleton. By using a polymerizable compound having an isocyanurate skeleton, solvent resistance of a film to be obtained can be improved.

The polymerizable compound having an isocyanurate skeleton is preferably a compound represented by Formula (Mi-1).

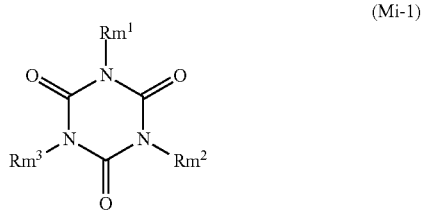

(Mi-1)

$R^{m1}$ to $R^{m3}$ are each independently a group represented by any one of Formulae (Rm-1) to (Rm-5), and at least one thereof is a group represented by any one of Formulae (Rm-1) to (Rm-4).

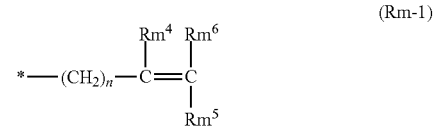

(Rm-1)

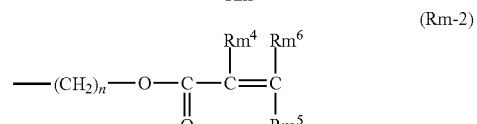

(Rm-2)

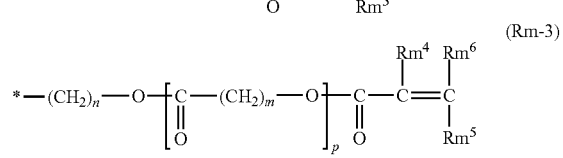

(Rm-3)

-continued

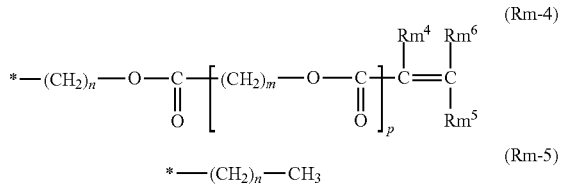

*—(CH$_2$)$_n$—CH$_3$ (Rm-5)

In the formulae, $R^{m4}$ to $R^{m6}$ each independently represent a hydrogen atom or a methyl group, n and m each independently represent an integer of 1 to 20, p represents an integer of 1 to 5, and * represents a bonding hand.

Specific examples of the polymerizable compound having an isocyanurate skeleton include tris(2-acryloyloxyethyl) isocyanurate and ε-caprolactone-modified tris(2-acryloxyethyl) isocyanurate. Examples of a commercially available product thereof include FANCRYL FA-731A (manufactured by Hitachi Chemical Co., Ltd.), NK ESTER A-9300, A-9300-1CL, and A9300-3CL (manufactured by Shin-Nakamura Chemical Co., Ltd.), and ARONIX M-315 (manufactured by TOAGOSEI CO., LTD.).

In the present invention, as the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., NK ESTER A-DPH-12E manufactured by Shin-Nakamura Chemical Co., Ltd.), a compound having a structure in which these (meth)acryloyl groups are bonded through an ethylene glycol and/or a propylene glycol residue (for example, SR454 and SR499 which are commercially available products from Sartomer), or the like can also be used.

In addition, as the polymerizable compound, ARONIX M-402 (manufactured by TOAGOSEI CO., LTD.; a mixture of dipentaerythritol hexaacrylate and dipentaerythritol pentaacrylate), NK ESTER A-TMMT (manufactured by Shin-Nakamura Chemical Co., Ltd.; pentacrythritol tetraacrylate), or the like can also be preferably used.

In addition, as the polymerizable compound, it is also preferable to use a polymerizable compound having an acid group. By using a polymerizable compound having an acid group, the resin composition layer in a non-exposed portion is easily removed during development and the generation of the development residue can be suppressed. Examples of the acid group include a carboxy group, a sulfo group, and a phosphoric acid group, and a carboxy group is preferable. Examples of the polymerizable compound having an acid group include succinic acid-modified dipentaerythritol penta (meth)acrylate. Examples of a commercially available product of the polymerizable compound having an acid group include ARONIX M-510, M-520, and ARONIX TO-2349 (manufactured by TOAGOSEI CO., LTD). The acid value of the polymerizable compound having an acid group is preferably 0.1 to 40 mgKOH/g and more preferably 5 to 30 mgKOH/g. In a case where the acid value of the polymerizable compound is 0.1 mgKOH/g or more, solubility in a developer is good, and in a case where the acid value of the polymerizable compound is 40 mgKOH/g or less, it is advantageous in production and handling.

In addition, as the polymerizable compound, it is also preferable to use a compound having a caprolactone structure. Examples of the polymerizable compound having a caprolactone structure include DPCA-20, DPCA-30, DPCA-60, and DPCA-120, each of which is commercially available as KAYARAD DPCA series from Nippon Kayaku Co., Ltd.

As the polymerizable compound, it is also preferable to use compounds described in JP2017-048367A, JP6057891B, and JP6031807B, compounds described in JP2017-194662A, 8UH-1006 and 8UH-1012 (both of which are manufactured by Taisei Fine Chemical Co., Ltd.), Light Acrylate POB-A0 (manufactured by Kyocisha Chemical Co., Ltd.), and the like.

In a case where the resin composition according to the embodiment of the present invention contains a polymerizable compound, the content of the polymerizable compound in the total solid content of the resin composition is preferably 2 to 30 mass %. The upper limit is preferably 20 mass % or less and more preferably 10 mass % or less. The lower limit is preferably 3 mass % or more and more preferably 5 mass % or more. The polymerizable compound contained in the resin composition may be only one kind or two or more kinds thereof. In a case of using two or more kinds thereof, the total amount thereof is preferably within the above-described range.

In addition, the total content of the resin and the polymerizable compound in the total solid content of the resin composition is preferably 10 to 50 mass %. The lower limit is preferably 15 mass % or more, more preferably 20 mass % or more, and still more preferably 25 mass % or more. The upper limit is preferably 45 mass % or less, more preferably 40 mass % or less, and still more preferably 35 mass % or less.

<<Compound Having Epoxy Group>>

The resin composition according to the embodiment of the present invention can contain a compound having an epoxy group (hereinafter, also referred to as an epoxy compound). Examples of the epoxy compound include a compound having one or more epoxy groups in one molecule, and a compound having two or more epoxy groups in one molecule is preferable. The epoxy compound preferably has 1 to 100 epoxy groups in one molecule. The upper limit of the number of epoxy groups may be, for example, 10 or less or 5 or less. The lower limit of the number of epoxy groups is preferably 2 or more. As the epoxy compound, the compounds described in paragraph Nos. 0034 to 0036 of JP2013-011869A, paragraph Nos. 0147 to 0156 of JP2014-043556A, and paragraph Nos. 0085 to 0092 of JP2014-089408A, and the compounds described in JP2017-179172A can also be used. The contents of the publications are incorporated herein by reference.

The epoxy compound may be either a low-molecular-weight compound (for example, having a molecular weight of less than 1000) or a high-molecular-weight compound (macromolecule) (for example, having a molecular weight of 1000 or more, and in a case of a polymer, having a weight-average molecular weight of 1000 or more). The weight-average molecular weight of the epoxy compound is preferably 200 to 100000 and more preferably 500 to 50000. The upper limit of the weight-average molecular weight is preferably 10000 or less, more preferably 5000 or less, and still more preferably 3000 or less.

Examples of a commercially available product of the epoxy compound include EHPE3150 (manufactured by Daicel Corporation) and EPICLON N-695 (manufactured by DIC Corporation).

In a case where the resin composition according to the embodiment of the present invention contains an epoxy compound, the content of the epoxy compound in the total solid content of the resin composition is preferably 0.1 to 20 mass %. The lower limit is, for example, preferably 0.5 mass % or more and more preferably 1 mass % or more. The upper limit is, for example, preferably 15 mass % or less and still more preferably 10 mass % or less. The epoxy compound contained in the resin composition may be only one kind or two or more kinds thereof. In a case of using two or more kinds thereof, the total amount thereof is preferably within the above-described range.

<<Photopolymerization Initiator>>

The resin composition according to the embodiment of the present invention preferably includes a photopolymerization initiator. In particular, in a case where the resin composition according to the embodiment of the present invention includes the polymerizable compound, it is preferable that the resin composition according to the embodiment of the present invention further includes a photopolymerization initiator. In a case where the resin composition according to the embodiment of the present invention contains a photopolymerization initiator, such a resin composition can be used as a photosensitive resin composition. The photopolymerization initiator is not particularly limited, and can be appropriately selected from known photopolymerization initiators. For example, a compound having photosensitivity to light in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. As the photopolymerization initiator, compounds described in paragraphs 0065 to 0111 of JP2014-130173A or in JP6301489B, peroxide-based photopolymerization initiators described in MATERIAL STAGE, p. 37 to 60, vol. 19, No. 3, 2019, photopolymerization initiators described in WO2018/221177A, photopolymerization initiators described in WO2018/110179A, photopolymerization initiators described in JP2019-043864A, and photopolymerization initiators described in JP2019-044030A, the contents of which are incorporated herein by reference.

Examples of a commercially available product of the α-hydroxyketone compound include Omnirad 184, Omnirad 1173, Omnirad 2959, and Omnirad 127 (all of which are manufactured by IGM Resins B.V.), Irgacure 184, Irgacure 1173, Irgacure 2959, and Irgacure 127 (all of which are manufactured by BASF). Examples of a commercially available product of the α-aminoketone compound include Omnirad 907, Omnirad 369, Omnirad 369E, and Omnirad 379EG (all of which are manufactured by IGM Resins B.V.), Irgacure 907, Irgacure 369, Irgacure 369E, and Irgacure 379EG (all of which are manufactured by BASF). Examples of a commercially available product of the acylphosphine compound include Omnirad 819 and Omnirad TPO (both of which are manufactured by IGM Resins B.V.), Irgacure 819 and Irgacure TPO (both of which are manufactured by BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, and the compounds described in WO2013/167515A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one.

Examples of a commercially available product thereof include Irgacure OXE01, Irgacure OXE02, Irgacure OXE03, and Irgacure OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

In the present invention, an oxime compound having a fluorene ring can also be used as the photopolymerization initiator. Specific examples of the oxime compound having a fluorene ring include the compounds described in JP2014-137466A.

In addition, as the photopolymerization initiator, an oxime compound having a skeleton in which at least one benzene ring of a carbazole ring is a naphthalene ring can also be used. Specific examples of such an oxime compound include the compounds described in WO2013/083505A.

An oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A.

An oxime compound having a nitro group can be used as the photopolymerization initiator. It is preferable that the oxime compound having a nitro group is a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

An oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

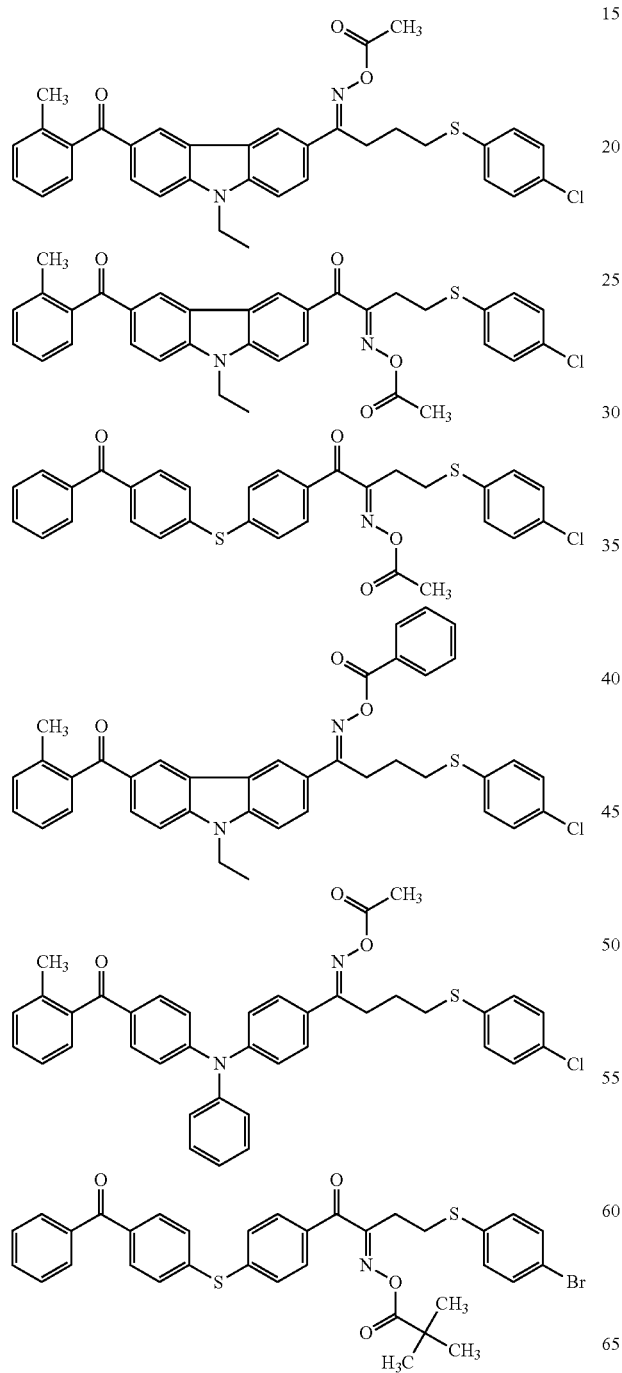

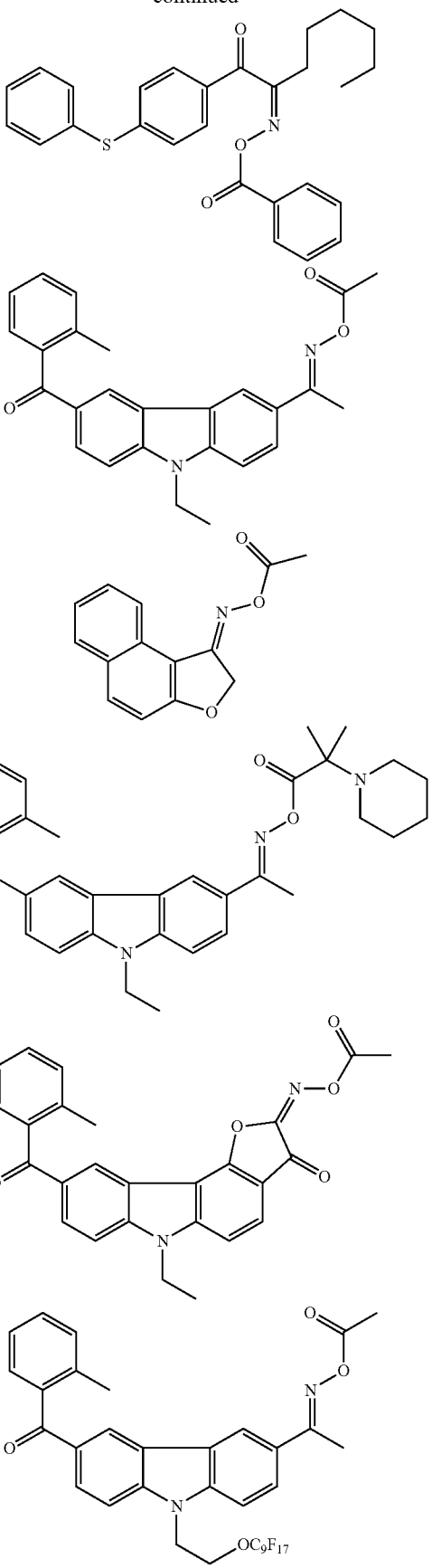

-continued

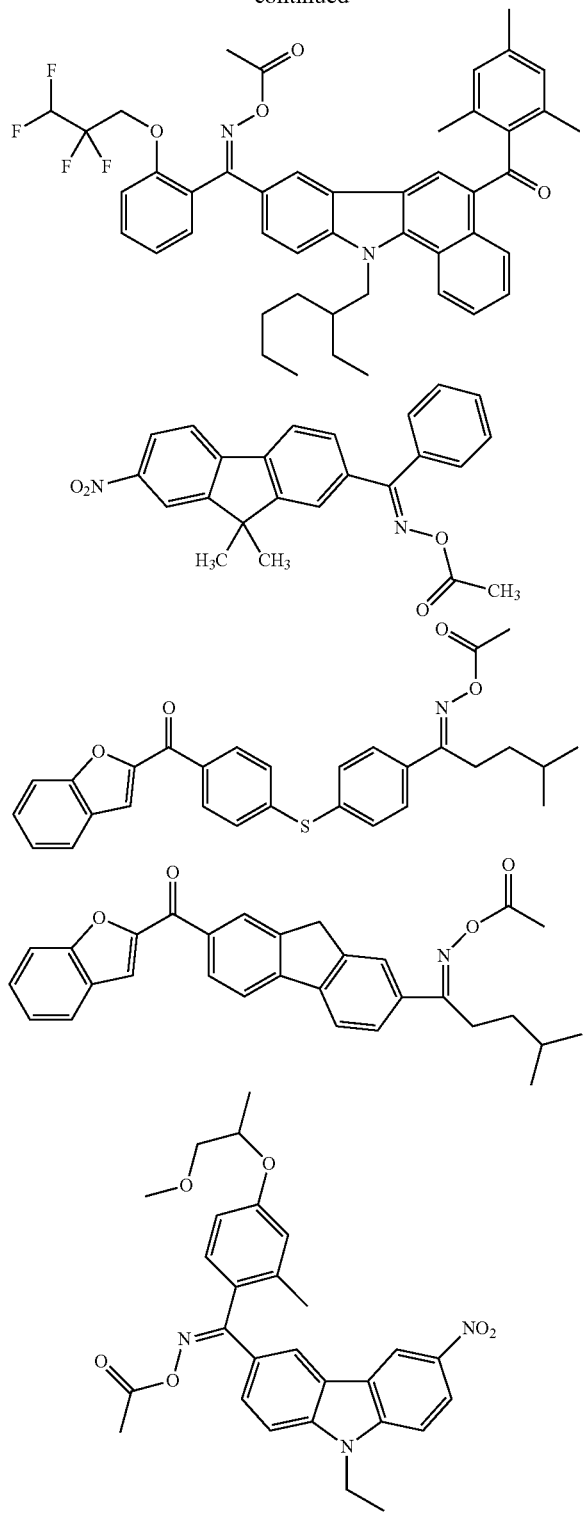

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, the molar absorption coefficient of the oxime compound at a wavelength of 365 nm or 405 nm is preferably high, more preferably 1000 to 300000, still more preferably 2000 to 300000, and particularly preferably 5000 to 200000. The molar absorption coefficient of a compound can be measured using a well-known method. For example, the molar absorption coefficient is preferably measured by a spectrophotometer (Cary-5 spectrophotometer, manufactured by Varian) using an ethyl acetate solvent at a concentration of 0.01 g/L.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case of using a compound having an asymmetric structure, crystallinity is reduced so that solubility in a solvent or the like is improved, precipitation is to be difficult over time, and temporal stability of the resin composition can be improved. Specific examples of the bifunctional or tri- or higher functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; the photopolymerization initiator (A) described in paragraph Nos. 0017 to 0026 of JP2017-151342A; and the oxime ester photoinitiators described in JP6469669B.

In a case where the resin composition according to the embodiment of the present invention contains a photopolymerization initiator, the content of the photopolymerization initiator in the total solid content of the resin composition is preferably 0.1 to 30 mass %. The lower limit is preferably 0.5 mass % or more and more preferably 1 mass % or more. The upper limit is preferably 20 mass % or less and more preferably 15 mass % or less. In the resin composition according to the embodiment of the present invention, the photopolymerization initiator may be used singly or in combination of two or more kinds thereof. In a case where two or more kinds thereof are used, the total amount thereof is preferably within the above-described range.

<<Thermal Polymerization Initiator>>

The resin composition according to the embodiment of the present invention can contain a thermal polymerization initiator. In a case where the resin composition according to the embodiment of the present invention contains a thermal polymerization initiator, such a resin composition can be used as a thermosetting resin composition. Examples of the thermal polymerization initiator include organic peroxides, azo compounds, and triazine compounds. Specific examples of the thermal polymerization initiator include tert-butylperoxybenzoate and compounds described in paragraph Nos. 0255 to 0257 of JP2008-088272A.

In a case where the resin composition according to the embodiment of the present invention contains a thermal polymerization initiator, the content of the thermal polymerization initiator in the total solid content of the resin composition is preferably 0.1 to 30 mass %. The lower limit is preferably 0.5 mass % or more and more preferably 1 mass % or more. The upper limit is preferably 20 mass % or less and more preferably 15 mass % or less. In the resin composition according to the embodiment of the present invention, the thermal polymerization initiator may be used singly or in combination of two or more kinds thereof. In a case where two or more kinds thereof are used, the total amount thereof is preferably within the above-described range.

<<Silane Coupling Agent>>

The resin composition according to the embodiment of the present invention can contain a silane coupling agent. According to this aspect, adhesiveness of a film to be obtained with a support can be further improved. In the present invention, the silane coupling agent means a silane compound having a hydrolyzable group and other functional groups. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group, and an alkoxy group is preferable. That is, it is preferable that the silane coupling agent is a compound having an alkoxysilyl group. Examples of the functional group other than the hydrolyzable group include a vinyl group, a (meth)allyl group, a (meth)acryloyl group, a mercapto group, an epoxy group, an oxetanyl group, an amino group, a ureido group, a sulfide group, an isocyanate group, and a phenyl group, and an amino group, a (meth)acryloyl group, or an epoxy group is preferable. Specific examples of the silane coupling agent include the compounds described in paragraph Nos. 0018 to 0036 of JP2009-288703A and the compounds described in paragraph Nos. 0056 to 0066 of JP2009-242604A, the contents of which are incorporated herein by reference.

The content of the silane coupling agent in the total solid content of the resin composition is preferably 0.1 to 5 mass %. The upper limit is preferably 3 mass % or less and more preferably 2 mass % or less. The lower limit is preferably 0.5 mass % or more and more preferably 1 mass % or more. The silane coupling agent may be used singly or in combination of two or more kinds thereof. In a case of using two or more kinds thereof, the total amount thereof is preferably within the above-described range.

<<Curing Accelerator>>

For the purpose of promoting the reaction of the polymerizable compound or the epoxy compound, and lowering the curing temperature, a curing accelerator may be added to the resin composition according to the embodiment of the present invention. As the curing accelerator, a methylol-based compound (for example, the compounds exemplified as a crosslinking agent in paragraph No. 0246 of JP2015-034963A), amines, phosphonium salts, amidine salts, and amide compounds (each of which is the curing agent described in, for example, paragraph No. 0186 of JP2013-041165A), base generators (for example, the ionic compounds described in JP2014-055114A), cyanate compounds (for example, the compounds described in paragraph No. 0071 of JP2012-150180A), alkoxysilane compounds (for example, the alkoxysilane compounds having an epoxy group, described in JP2011-253054A), onium salt compounds (for example, the compounds exemplified as an acid generator in paragraph No. 0216 of JP2015-034963A, and the compounds described in JP2009-180949A), or the like can be used.

In a case where the resin composition according to the embodiment of the present invention contains a curing accelerator, the content of the curing accelerator is preferably 0.3 to 8.9 mass % and more preferably 0.8 to 6.4 mass % with respect to the total solid content of the resin composition.

<<Polymerization Inhibitor>>

The resin composition according to the embodiment of the present invention can contain a polymerization inhibitor. Examples of the polymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol), and an N-nitrosophenylhydroxylamine salt (an ammonium salt, a cerous salt, or the like). Among these, p-methoxyphenol is preferable. The content of the polymerization inhibitor in the total solid content of the resin composition is preferably 0.0001 to 5 mass %.

<<Surfactant>>

The resin composition according to the embodiment of the present invention can contain a surfactant. As the surfactant, various surfactants such as a fluorine-based surfactant, a nonionic surfactant, a cationic surfactant, an anionic surfactant, and a silicon-based surfactant can be used. Examples of the surfactant include surfactants described in paragraph Nos. 0238 to 0245 of WO2015/166779A, the content of which is incorporated herein by reference.

It is preferable that the surfactant is a fluorine-based surfactant. By containing a fluorine-based surfactant in the coloring composition, liquid characteristics (particularly, fluidity) are further improved, and liquid saving properties can be further improved. In addition, it is possible to form a film with a small thickness unevenness.

The fluorine content in the fluorine-based surfactant is suitably 3 to 40 mass %, and more preferably 5 to 30 mass % and particularly preferably 7 to 25 mass %. The fluorine-based surfactant in which the fluorine content is within the above-described range is effective in terms of the evenness of the thickness of the coating film or liquid saving properties and the solubility of the surfactant in the coloring composition is also good.

Examples of the fluorine-based surfactant include surfactants described in paragraph Nos. 0060 to 0064 of JP2014-041318A (paragraph Nos 0060 to 0064 of the corresponding WO2014/017669A) and the like, and surfactants described in paragraph Nos 0117 to 0132 of JP2011-132503A, the contents of which are incorporated herein by reference. Examples of a commercially available product of the fluorine-based surfactant include: MEGAFACE F171, F172, F173, F176, F177, F141, F142, F143, F144, R30, F437, F475, F479, F482, F554, F780, EXP, and MFS-330 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC-1068, SC-381, SC-383, S-393, and KH-40 (all of which are manufactured by Asahi Glass Co., Ltd.); and POLYFOX PF636, PF656, PF6320, PF6520, and PF7002 (all of which are manufactured by OMNOVA Solutions Inc.).

In addition, it is also preferable that a polymer of a fluorine atom-containing vinyl ether compound having a fluorinated alkyl group or a fluorinated alkylene ether group, and a hydrophilic vinyl ether compound is used as the fluorine-based surfactant. Examples of such a fluorine-based surfactant include fluorine-based surfactants described in JP2016-216602A, the content of which is incorporated herein by reference. In addition, a block polymer can also be used as the fluorine-based surfactant. Examples thereof include the compounds described in JP2011-089090A. As the fluorine-based surfactant, a fluorine-containing polymer compound including a repeating unit derived from a (meth) acrylate compound having a fluorine atom and a repeating unit derived from a (meth)acrylate compound having 2 or more (preferably 5 or more) alkylencoxy groups (preferably ethyleneoxy groups or propyleneoxy groups) can also be preferably used. The following compounds are also exemplified as the fluorine-based surfactant used in the present invention.

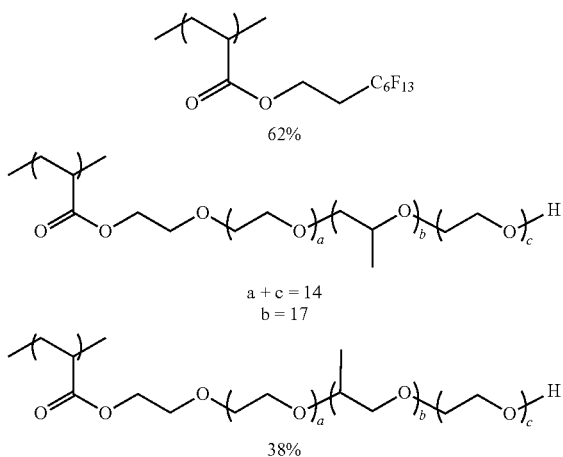

The weight-average molecular weight of the above-described compound is preferably 3000 to 50000, and is, for example, 14000. In the compound, "%" representing the proportion of a repeating unit is mol %.

In addition, as the fluorine-based surfactant, a fluorine-containing polymer having an ethylenically unsaturated bond-containing group in the side chain can be used. Specific examples thereof include compounds described in paragraph Nos. 0050 to 0090 and paragraph Nos. 0289 to 0295 of JP2010-164965A, and MEGAFACE RS-101, RS-102, RS-718K, and RS-72-K manufactured by DIC Corporation. In addition, as the fluorine-based surfactant, compounds described in paragraph Nos. 0015 to 0158 of JP2015-117327A can also be used.

The content of the surfactant in the total solid content of the resin composition is preferably 0.001 mass % to 5.0 mass % and more preferably 0.005 to 3.0 mass %. The surfactant may be used singly or in combination of two or more kinds thereof. In a case of using two or more kinds thereof, the total amount thereof is preferably within the above-described range.

<<Ultraviolet Absorber>>

The resin composition according to the embodiment of the present invention can contain an ultraviolet absorber. As the ultraviolet absorber, a conjugated diene compound, an aminodiene compound, a salicylate compound, a benzophenone compound, a benzotriazole compound, an acrylonitrile compound, a hydroxyphenyltriazine compound, an indole compound, a triazine compound, or the like can be used. Examples of such a compound include compounds described in paragraph Nos. 0052 to 0072 of JP2012-208374A, paragraph Nos. 0317 to 0334 of JP2013-068814A, and paragraph Nos. 0061 to 0080 of JP2016-162946A, the contents of which are incorporated herein by reference. Examples of a commercially available product of the ultraviolet absorber include UV-503 (manufactured by Daito Chemical Co., Ltd). In addition, examples of the benzotriazole compound include MYUA series manufactured by Miyoshi Oil & Fat Co., Ltd. (The Chemical Daily, Feb. 1, 2016). In addition, as the ultraviolet absorber, compounds described in paragraph Nos. 0049 to 0059 of JP6268967B can also be used. The content of the ultraviolet absorber in the total solid content of the resin composition is preferably 0.01 to 10 mass % and more preferably 0.01 to 5 mass %. In the present invention, the ultraviolet absorber may be used singly or in combination of two or more kinds thereof. In a case where two or more kinds thereof are used, it is preferable that the total amount thereof is within the above-described range.

<<Antioxidant>>

The resin composition according to the embodiment of the present invention can contain an antioxidant. Examples of the antioxidant include a phenol compound, a phosphite ester compound, and a thioether compound. As the phenol compound, any phenol compound which is known as a phenol-based antioxidant can be used. Preferred examples of the phenol compound include a hindered phenol compound. A compound having a substituent at a site (ortho position) adjacent to a phenolic hydroxy group is preferable. As the substituent, a substituted or unsubstituted alkyl group having 1 to 22 carbon atoms is preferable. In addition, as the antioxidant, a compound having a phenol group and a phosphite ester group in the same molecule is also preferable. In addition, as the antioxidant, a phosphorus antioxidant can also be suitability used. The content of the antioxidant in the total solid content of the resin composition is preferably 0.01 to 20 mass % and more preferably 0.3 to 15 mass %. The antioxidant may be used singly or in combination of two or more kinds thereof. In a case where two or more kinds thereof are used, it is preferable that the total amount thereof is within the above-described range.

<<Other Components>>

Optionally, the resin composition according to the embodiment of the present invention may further contain a sensitizer, a filler, a thermal curing accelerator, a plasticizer, and other auxiliary agents (for example, conductive particles, an anti-foaming agent, a flame retardant, a leveling agent, a peeling accelerator, an aromatic chemical, a surface tension adjuster, or a chain transfer agent). By appropriately containing these components, properties such as film properties can be adjusted. The details of the components can be found in, for example, paragraph No. 0183 of JP2012-003225A (corresponding to paragraph No. 0237 of US2013/0034812A) and paragraph Nos. 0101 to 0104 and 0107 to 0109 of JP2008-250074A, the contents of which are incorporated herein by reference. In addition, optionally, the coloring composition according to the embodiment of the present invention may contain a potential antioxidant. Examples of the potential antioxidant include a compound in which a site functioning as an antioxidant is protected by a protective group, and the protective group is eliminated by heating the compound at 100° C. to 250° C. or heating the compound at 80° C. to 200° C. in the presence of an acid or base catalyst so that the compound functions as an antioxidant. Examples of the potential antioxidant include compounds described in WO2014/021023A, WO2017/030005A, and JP2017-008219A. Examples of a commercially available product of the potential antioxidant include ADEKA ARKLS GPA-5001 (manufactured by ADEKA Corporation). In addition, as described in JP2018-155881A, C. I. Pigment Yellow 129 may be added for the purpose of improving weather fastness.

The moisture content in the resin composition according to the embodiment of the present invention is usually 3 mass % or less, preferably 0.01 to 1.5 mass % and more preferably in a range of 0.1 to 1.0 mass %. The moisture content can be measured by a Karl Fischer method.

The resin composition according to the embodiment of the present invention can be used after viscosity is adjusted for the purposes of adjusting the state of a film surface (flatness or the like), adjusting a film thickness, or the like. The value of the viscosity can be appropriately selected as desired, and is, for example, preferably 0.3 mPa×s to 50 mPa×s, and more preferably 0.5 mPa×s to 20 mPa×s at 25° C. As for a method for measuring the viscosity, the viscosity can be measured, for example, with a temperature being adjusted to 25° C., using a cone plate-type viscometer.

In a case where the resin composition according to the embodiment of the present invention is used as a color filter in applications for a liquid crystal display device, the voltage holding ratio of a liquid crystal display element comprising a color filter is preferably 70% or more, and more preferably 90% or more. A known method for obtaining a high voltage holding ratio can be appropriately incorporated, and examples of typical methods include use of high-purity materials (for example, reduction in ionic impurities) and control of the amount of acidic functional groups in a composition. The voltage holding ratio can be measured by, for example, the methods described in paragraph 0243 of JP2011-008004A and paragraphs 0123 to 0129 of JP2012-224847A.

A storage container of the resin composition according to the embodiment of the present invention is not particularly limited, and a known storage container can be used. In addition, as the storage container, in order to suppress infiltration of impurities into the raw materials or the composition, a multilayer bottle in which a container interior wall having a six-layer structure is formed of six kinds of resins or a bottle in which a container interior wall having a seven-layer structure is formed of six kinds of resins is preferably used. Examples of such a container include the containers described in JP2015-123351A.

<Method for Preparing Resin Composition>

The resin composition according to the embodiment of the present invention can be prepared by mixing the above-described components with each other. During the preparation of the resin composition, all the components may be dissolved and/or dispersed in a solvent at the same time to prepare the resin composition. Optionally, two or more solutions or dispersion liquids in which the respective components are appropriately blended may be prepared, and the solutions or dispersion liquids may be mixed with each other during use (during application) to prepare the resin composition.

In addition, in the preparation of the resin composition, a process of dispersing the pigment is preferably included. In the process of dispersing the pigment, examples of a mechanical force which is used for dispersing the pigment include compression, pressing, impact, shear, and cavitation. Specific examples of these processes include a beads mill, a sand mill, a roll mill, a ball mill, a paint shaker, a microfluidizer, a high-speed impeller, a sand grinder, a flow jet mixer, high-pressure wet atomization, and ultrasonic dispersion. In addition, in the pulverization of the pigment in a sand mill (beads mill), it is preferable to perform a treatment under the condition for increasing a pulverization efficiency by using beads having small diameters; increasing the filling rate of the beads; or the like. Incidentally, it is preferable to remove coarse particles by filtration, centrifugation, or the like after the pulverization treatment. In addition, as the process and the dispersing machine for dispersing the pigment, the process and the dispersing machine described in "Dispersion Technology Comprehension, published by Johokiko Co., Ltd., Jul. 15, 2005", "Actual comprehensive data collection on dispersion technology and industrial application centered on suspension (solid/liquid dispersion system), published by Publication Department, Management Development Center, Oct. 10, 1978", and paragraph No. 0022 of JP2015-157893A can be suitably used. In addition, in the process for dispersing the pigment, a refining treatment of particles in a salt milling step may be performed. With regard to the materials, equipment, treatment conditions, and the like used in the salt milling step, reference can be made to, for example, the description in JP2015-194521A and JP2012-046629A.

During the preparation of the resin composition, it is preferable that the resin composition is filtered through a filter, for example, in order to remove foreign matters or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including a high-density polypropylene) and nylon are preferable.

The pore size of the filter is preferably 0.01 to 7.0 µm, more preferably 0.01 to 3.0 µm, and still more preferably 0.05 to 0.5 µm. In a case where the pore size of the filter is within the above-described range, fine foreign matters can be reliably removed. With regard to the pore size value of the filter, reference can be made to a nominal value of filter manufacturers. As the filter, various filters provided by Nihon Pall Corporation (DFA4201NIEY and the like), Toyo Roshi Kaisha., Ltd., Nihon Entegris K.K. (formerly Nippon Microlith Co., Ltd.), Kitz Micro Filter Corporation, and the like can be used.

In addition, it is preferable that a fibrous filter material is used as the filter. Examples of the fibrous filter material include a polypropylene fiber, a nylon fiber, and a glass fiber. Examples of a commercially available product include SBP type series (SBP008 and the like), TPR type series (TPR002, TPR005, and the like), or SHPX type series (SHPX003 and the like), all manufactured by Roki Techno Co., Ltd. In a case of using a filter, different filters (for example, a first filter, a second filter, and the like) may be combined. In this case, the filtration with each of the filters may be performed once or may be performed twice or more times. In addition, filters having different pore sizes within the above-described range may be combined. In addition, the filtration through the first filter may be performed with only a dispersion liquid, the other components may be mixed therewith, and then the filtration through the second filter may be performed.

<Film>

The film according to the embodiment of the present invention is a film formed of the above-described resin composition according to the embodiment of the present invention. The film according to the embodiment of the present invention can be used for a color filter, a near-infrared transmission filter, a near-infrared cut filter, a black matrix, a light-shielding film, a refractive index adjusting film, and the like. The film according to the embodiment of the present invention can be preferably used as a colored pixel of a color filter. Examples of the colored pixel include a red pixel, a blue pixel, a green pixel, a yellow pixel, a cyan pixel, and a magenta pixel. The thickness of the film according to the embodiment of the present invention can be adjusted according to the purpose. For example, the film thickness is preferably 20 µm or less, more preferably 10 µm or less, and still more preferably 5 µm or less. The lower limit of the film thickness is preferably 0.1 µm or more, more preferably 0.2 µm or more, and still more preferably 0.3 µm or more.

<Method for Manufacturing Film>

The film according to the embodiment of the present invention can be manufactured through a step of applying the resin composition according to the embodiment of the present invention on a support. The method for manufacturing the film preferably further includes a step of forming a pattern (pixel). A photolithography method is preferable as a method of forming a pattern (pixel).

Pattern formation by the photolithography method preferably includes a step of forming a resin composition layer on a support using the resin composition according to the embodiment of the present invention, a step of exposing the resin composition layer in a patterned manner, and a step of removing a non-exposed portion of the resin composition layer by development to form a pattern (pixel). A step (pre-baking step) of baking the resin composition layer and a step (post-baking step) of baking the developed pattern (pixel) may be provided, optionally.

<<Step of Forming Resin Composition Layer>>

In the step of forming a resin composition layer, the resin composition layer is formed on a support using the resin composition according to the embodiment of the present invention. The support is not particularly limited, and can be appropriately selected depending on applications. Examples thereof include a glass substrate and a silicon substrate, and a silicon substrate is preferable. In addition, a charge coupled device (CCD), a complementary metal-oxide semiconductor (CMOS), a transparent conductive film, or the like may be formed on the silicon substrate. In some cases, a black matrix for isolating each pixel is formed on the silicon substrate. In addition, a base layer may be provided on the silicon substrate so as to improve adhesiveness to an upper layer, prevent the diffusion of materials, or planarize the surface of the substrate. The base layer may be formed of a composition obtained by removing a colorant such as a pigment or a dye from the resin composition described in the present specification, a composition including the resin, polymerizable compound, surfactant, and the like described in the present specification, or the like.

As a method of applying the resin composition, a known method can be used. Examples thereof include a dropping method (drop casting); a slit coating method; a spray method; a roll coating method; a spin coating method (spin coating); a cast coating method; a slit and spin method; a pre-wet method (for example, a method described in JP2009-145395A), various printing methods such as an ink jet (for example, on-demand type, piezo type, thermal type), a discharge printing such as nozzle jet, a flexo printing, a screen printing, a gravure printing, a reverse offset printing, and a metal mask printing; a transfer method using molds and the like; and a nanoimprint method. A method for applying the ink jet is not particularly limited, and examples thereof include a method described in "Extension of Use of Ink Jet-Infinite Possibilities in Patent—" (February 2005, S. B. Research Co., Ltd.) (particularly pp. 115 to 133) and methods described in JP2003-262716A, JP2003-185831A, JP2003-261827A, JP2012-126830A, and JP2006-169325A. In addition, with regard to the method for applying the resin composition, reference can be made to the description in WO2017/030174A and WO2017/018419A, the contents of which are incorporated herein by reference.

The resin composition layer formed on the support may be dried (pre-baked). In a case of producing a film by a low-temperature process, pre-baking may not be performed.

In a case of performing the pre-baking, the pre-baking temperature is preferably 150° C. or lower, more preferably 120° C. or lower, and still more preferably 110° C. or lower. The lower limit may be set to, for example, 50° C. or higher, or to 80° C. or higher. The pre-baking time is preferably 10 to 300 seconds, more preferably 40 to 250 seconds, and still more preferably 80 to 220 seconds. The pre-baking can be performed using a hot plate, an oven, or the like.

<<Exposing Step>>

Next, the resin composition layer is exposed in a patterned manner (exposing step). For example, the resin composition layer can be exposed in a patterned manner using a stepper exposure device or a scanner exposure device through a mask having a predetermined mask pattern. Thus, the exposed portion can be cured.

Examples of the radiation (light) which can be used during the exposure include g-rays and i-rays. In addition, light (preferably light having a wavelength of 180 to 300 nm) having a wavelength of 300 nm or less can be used. Examples of the light having a wavelength of 300 nm or less include KrF-rays (wavelength: 248 nm) and ArF-rays (wavelength: 193 nm), and KrF-rays (wavelength: 248 nm) are preferable. In addition, a long-wave light source of 300 nm or more can be used.

In addition, in a case of exposure, the photosensitive composition layer may be irradiated with light continuously to expose the photosensitive composition layer, or the photosensitive composition layer may be irradiated with light in a pulse to expose the photosensitive composition layer (pulse exposure). The pulse exposure refers to an exposing method in which light irradiation and resting are repeatedly performed in a short cycle (for example, millisecond-level or less).

The irradiation amount (exposure amount) is, for example, preferably 0.03 to 2.5 $J/cm^2$ and more preferably 0.05 to 1.0 $J/cm^2$. The oxygen concentration during the exposure can be appropriately selected, and the exposure may also be performed, for example, in a low-oxygen atmosphere having an oxygen concentration of 19% by volume or less (for example, 15% by volume, 5% by volume, and substantially oxygen-free) or in a high-oxygen atmosphere having an oxygen concentration of more than 21% by volume (for example, 22% by volume, 30% by volume, and 50% by volume), in addition to an atmospheric air. In addition, the exposure illuminance can be appropriately set, and can be usually selected from a range of 1000 $W/m^2$ to 100000 $W/m^2$ (for example, 5000 $W/m^2$, 15000 $W/m^2$, or 35000 $W/m^2$). Appropriate conditions of each of the oxygen concentration and the exposure illuminance may be combined, and for example, a combination of the oxygen concentration of 10% by volume and the illuminance of 10000 $W/m^2$, a combination of the oxygen concentration of 35% by volume and the illuminance of 20000 $W/m^2$, or the like is available.

<<Developing Step>>

Next, the non-exposed portion of the resin composition layer is removed by development to form a pattern (pixel). The non-exposed portion of the resin composition layer can be removed by development using a developer. Thus, the resin composition layer of the non-exposed portion in the exposing step is eluted into the developer, and as a result, only a photocured portion remains. For example, the temperature of the developer is preferably 20° C. to 30° C. The development time is preferably 20 to 180 seconds. In addition, in order to improve residue removing properties, a step of removing the developer by shaking off per 60 seconds and supplying a fresh developer may be repeated multiple times.

Examples of the developer include an organic solvent and an alkali developer, and an alkali developer is preferably used. As the alkali developer, an alkaline solution (alkali developer) in which an alkaline agent is diluted with pure water is preferable. Examples of the alkali agent include organic alkaline compounds such as ammonia, ethylamine, diethylamine, dimethylethanolamine, diglycol amine, diethanolamine, hydroxyamine, ethylenediamine, tetramethylammonium hydroxide, tetraethylammonium hydroxide, tetrapropylammonium hydroxide, tetrabutylammonium hydroxide, ethyltrimethylammonium hydroxide, benzyltrimethylammonium hydroxide, dimethylbis(2-hydroxyethyl) ammonium hydroxide, choline, pyrrole, piperidine, and 1,8-diazabicyclo-[5.4.0]-7-undecene, and inorganic alkaline compounds such as sodium hydroxide, potassium hydroxide, sodium carbonate, sodium hydrogen carbonate, sodium silicate, and sodium metasilicate. In consideration of environmental aspects and safety aspects, the alkali agent is preferably a compound having a high molecular weight. The concentration of the alkali agent in the aqueous alkaline solution is preferably 0.001 to 10 mass % and more preferably 0.01 to 1 mass %. In addition, the developer may further contain a surfactant. From the viewpoint of transportation, storage, and the like, the developer may be first produced as a concentrated liquid and then diluted to a concentration required upon the use. The dilution ratio is not particularly limited, and can be set to, for example, a range of 1.5 to 100 times. In addition, it is also preferable to wash (rinse) with pure water after development. In addition, it is preferable that the rinsing is performed by supplying a rinsing liquid to the resin composition layer after development while rotating the support on which the resin composition layer after development is formed. In addition, it is preferable that the rinsing is performed by moving a nozzle discharging the rinsing liquid from a center of the support to a peripheral edge of the support. In this case, in the movement of the nozzle from the center of the support to the peripheral edge of the support, the nozzle may be moved while gradually decreasing the moving speed of the nozzle. By performing rinsing in this manner, in-plane variation of rinsing can be suppressed. In addition, the same effect can be obtained by gradually decreasing the rotating speed of the support while moving the nozzle from the center of the support to the peripheral edge of the support.

After the development, it is preferable to carry out an additional exposure treatment or a heating treatment (post-baking) after carrying out drying. The additional exposure treatment or the post-baking is a curing treatment after development in order to complete curing. The heating temperature in the post-baking is preferably, for example, 100° C. to 240° C. and more preferably 200° C. to 240° C. The film after development is post-baked continuously or batch-wise using a heating unit such as a hot plate, a convection oven (hot air circulation dryer), and a high-frequency heater under the above-described conditions. In a case of performing the additional exposure treatment, light used for the exposure is preferably light having a wavelength of 400 nm or less. In addition, the additional exposure treatment may be carried out by the method described in KR10-2017-0122130A.

<Color Filter>

The color filter according to the embodiment of the present invention has the film according to the embodiment of the present invention. Preferably, the color filter according to the embodiment of the present invention has the film according to the embodiment of the present invention as a colored pixel of the color filter. In a case where the film according to the embodiment of the present invention is used for a color filter, as the pigment, it is preferable to use a chromatic pigment. In the color filter according to the embodiment of the present invention, the thickness of the film according to the embodiment of the present invention can be appropriately adjusted depending on the purposes. The film thickness is preferably 20 μm or less, more preferably 10 μm or less, and still more preferably 5 μm or less. The lower limit of the film thickness is preferably 0.1 μm or more, more preferably 0.2 μm or more, and still more preferably 0.3 μm or more. The color filter according to the embodiment of the present invention can be used for a solid-state imaging element such as a charge coupled device (CCD) and a complementary metal-oxide semiconductor (CMOS), an image display device, or the like.

In the color filter, the width of the pixel is preferably 0.5 to 20.0 μm. The lower limit is preferably 1.0 μm or more and more preferably 2.0 μm or more. The upper limit is preferably 15.0 μm or less and more preferably 10.0 μm or less. In addition, the Young's modulus of the pixel is preferably 0.5 to 20 GPa and more preferably 2.5 to 15 GPa.

It is preferable that the pixel has high flatness. Specifically, the surface roughness $R^a$ of the pixel is preferably 100 nm or less, more preferably 40 nm or less, and still more preferably 15 nm or less. The lower limit is not specified, but is preferably, for example, 0.1 nm or more. The surface roughness can be measured, for example, using an atomic force microscope (AFM) Dimension 3100 manufactured by Veeco Instruments, Inc. In addition, the contact angle of water on the pixel can be appropriately set to a preferred value and is typically in the range of 50° to 110°. The contact angle can be measured, for example, using a contact angle meter CV-DT-A Model (manufactured by Kyowa Interface Science Co., Ltd.). In addition, it is desired that the volume resistivity value of the pixel is high. Specifically, the volume resistivity value of the pixel is preferably $10^9$ Ω·cm or more and more preferably $10^{11}$ Ω·cm or more. The upper limit is not specified, but is, for example, preferably $10^{14}$ Ω·cm or less. The volume resistivity value of the pixel can be measured, for example, using an ultra-high resistance meter 5410 (manufactured by Advantest Corporation).

In the color filter, a protective layer may be provided on the surface of the film according to the embodiment of the present invention. By providing the protective layer, various functions such as oxygen shielding, low reflection, hydrophilicity/hydrophobicity, and shielding of light (ultraviolet rays, near-infrared rays, infrared rays, and the like) having a specific wavelength can be imparted. The thickness of the protective layer is preferably 0.01 to 10 μm and still more preferably 0.1 to 5 μm.

The protective layer may contain, as desired, an additive such as organic or inorganic fine particles, an absorber of a specific wavelength (for example, ultraviolet rays, near-infrared rays, infrared rays, and the like), a refractive index adjusting agent, an antioxidant, an adhesive agent, and a surfactant. With regard to details thereof, reference can be made to the description in paragraph Nos. 0052 to 0072 of JP2012-208374A, paragraph Nos. 0317 to 0334 of JP2013-068814A, paragraph Nos. 0061 to 0080 of JP2016-162946A, paragraph Nos. 0020 and 0072 of JP2018-054760A, JP2009-263614A, and WO2017/146092A, the contents of which are incorporated herein by reference. The content of these additives can be appropriately adjusted, but is preferably 0.1 to 70 mass % and still more preferably 1 to 60 mass % with respect to the total weight of the protective layer.

In addition, as the protective layer, the protective layers described in paragraph Nos. 0073 to 0092 of JP2017-151176A can also be used.

The color filter may have a structure in which each colored pixel is embedded in a space partitioned in, for example, a lattice form by a partition wall.

The color filter may have a base layer. The base layer can also be formed using, for example, a composition obtained by removing a colorant such as a pigment and a dye from the above-described resin composition according to the embodiment of the present invention. The surface contact angle of the base layer is preferably 20° to 70° in a case of being measured with diiodomethane. In addition, the surface contact angle of the base layer is preferably 30° to 80° in a case of being measured with water. In a case where the surface contact angle of the base layer is within the above-described range, coating property of the resin composition is good. The surface contact angle of the base layer can be adjusted by, for example, adding a surfactant.

<Solid-State Imaging Element>

The solid-state imaging element according to an embodiment of the present invention has the film according to the embodiment of the present invention. The configuration of the solid-state imaging element is not particularly limited as long as the solid-state imaging element is configured to include the film according to the embodiment of the present invention and functions as a solid-state imaging element. Examples of the configuration include the following configurations.

The solid-state imaging element is configured to have a plurality of photodiodes constituting a light receiving area of the solid-state imaging element (a charge coupled device (CCD) image sensor, a complementary metal-oxide semiconductor (CMOS) image sensor, or the like), and a transfer electrode formed of polysilicon or the like on a substrate; have a light-shielding film having openings only over the light receiving section of the photodiodes on the photodiodes and the transfer electrodes; have a device-protective film formed of silicon nitride or the like, which is formed to coat the entire surface of the light-shielding film and the light receiving section of the photodiodes, on the light-shielding film; and have a color filter on the device-protective film. Further, the solid-state imaging element may also be configured, for example, such that it has a light collecting unit (for example, a microlens, which is the same hereinafter) on a device-protective film under a color filter (a side closer to the substrate), or has a light collecting unit on a color filter. In addition, the color filter may have a structure in which each colored pixel is embedded in a space partitioned in, for example, a lattice shape by a partition wall. The partition wall in this case preferably has a low refractive index for each colored pixel. Examples of an imaging device having such a structure include the devices described in JP2012-227478A, JP2014-179577A, and WO2018/043654A. An imaging device including the solid-state imaging element according to the embodiment of the present invention can also be used as a vehicle camera or a surveillance camera, in addition to a digital camera or electronic apparatus (mobile phones or the like) having an imaging function.

<Image Display Device>

The image display device according to an embodiment of the present invention has the film according to the embodiment of the present invention. Examples of the image display device include a liquid crystal display device or an organic electroluminescent display device. The definitions of image display devices or the details of the respective image display devices are described in, for example, "Electronic Display Device (Akio Sasaki, Kogyo Chosakai Publishing Co., Ltd., published in 1990)", "Display Device (Sumiaki Ibuki, Sangyo Tosho Co., Ltd.)", and the like. In addition, the liquid crystal display device is described in, for example, "Liquid Crystal Display Technology for Next Generation (edited by Tatsuo Uchida, Kogyo Chosakai Publishing Co., Ltd., published in 1994)". The liquid crystal display device to which the present invention can be applied is not particularly limited, and can be applied to, for example, liquid crystal display devices employing various systems described in the "Liquid Crystal Display Technology for Next Generation".

<Compound>

Next, the compound according to the embodiment of the present invention will be described. The compound according to the embodiment of the present invention is a compound represented by Formula (10). The compound according to the embodiment of the present invention can be preferably used as a raw material for synthesizing the above-described resin A.

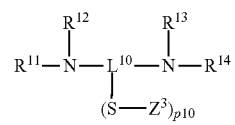

(10)

In Formula (10), $R^{11}$ to $R^{14}$ each independently represent a hydrogen atom or a substituent.

Examples of the substituent include the groups represented by the substituent T.

$R^{11}$ and $R^{14}$ are each independently preferably a hydrogen atom, an alkoxycarbonyl group, a phthaloyl group, an alkylsulfonyl group, or an arylsulfonyl group. Specific examples thereof include known amine protective groups such as a tert-butoxycarbonyl group, a 2,2,2-trichloroethoxycarbonyl group, a benzyloxycarbonyl group, a 9-fluorenylmethyloxycarbonyl group, an aryloxycarbonyl group, a 2-nitrobenzenesulfonyl group, a (2-trimethylsilyl)-ethanesulfonyl group, and a 2,2,2-trichloroethoxycarbonyl group.

$R^{12}$ and $R^{13}$ are each independently preferably a hydrogen atom or an alkyl group, more preferably a hydrogen atom or a methyl group, and still more preferably a hydrogen atom.

In Formula (10), $L^{10}$ represents a (2+p10)-valent hydrocarbon group. Examples of the hydrocarbon group include an aliphatic hydrocarbon group and an aromatic hydrocarbon group. The number of carbon atoms in the aliphatic hydrocarbon group is preferably 1 to 30, more preferably 1 to 20, and still more preferably 1 to 15. The aliphatic hydrocarbon group may be linear, branched, or cyclic. The number of carbon atoms in the aromatic hydrocarbon group is preferably 6 to 30, more preferably 6 to 20, and still more preferably 6 to 10.

In Formula (10), p10 represents 1 or 2, and is preferably 1.

In Formula (10), $Z^3$ represents a polymer chain having a weight-average molecular weight of 500 or more. The polymer chain having a weight-average molecular weight of 500 or more, represented by $Z^3$, is synonymous with the polymer chain having a weight-average molecular weight of 500 or more, represented by $Z^1$ of Formula (1) described above, and the preferred range is also the same.

The weight-average molecular weight of the compound represented by Formula (10) is preferably 500 to 20000, more preferably 1000 to 20000, and still more preferably 1000 to 10000.

Specific examples of the compound represented by Formula (10) include compounds shown below.

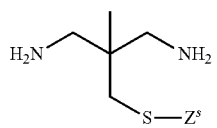
(10-1)

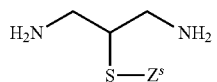
(10-2)

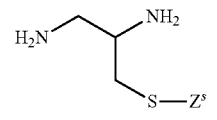
(10-3)

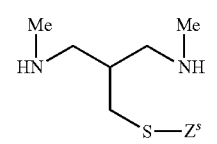
(10-4)

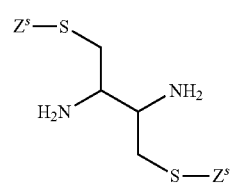
(10-5)

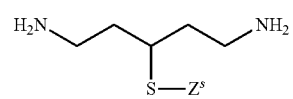
(10-6)

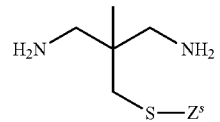
(10-7)

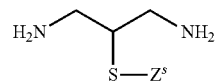
(10-8)

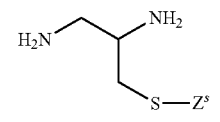
(10-9)

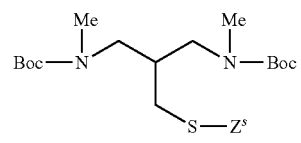
(10-10)

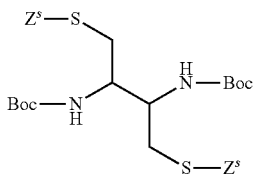
(10-11)

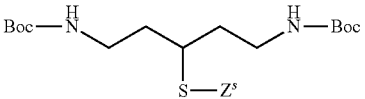
(10-12)

In the formulae, Me represents a methyl group, Boc represents a tert-butoxycarbonyl group, and $Z^s$ represents any of the following $Z^s$-1 to $Z^s$-13.

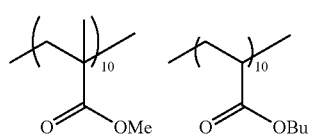
($Z^s$-1)

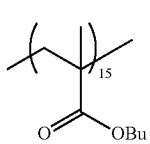
($Z^s$-2)

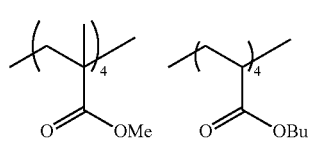
($Z^s$-3)

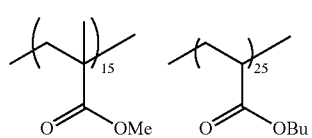
($Z^s$-4)

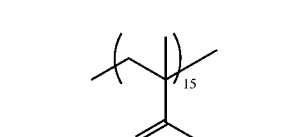
($Z^s$-5)

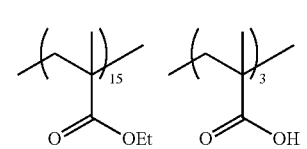
($Z^s$-6)

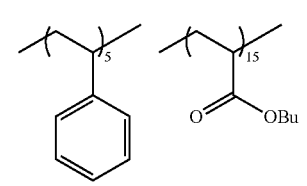
($Z^s$-7)

-continued (Z$^s$-8)

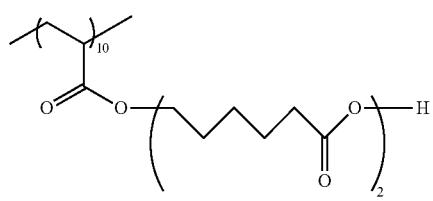

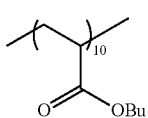

(Z$^s$-9)

(Z$^s$-10)

(Z$^s$-11)

(Z$^s$-12)

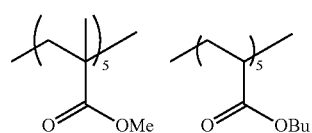

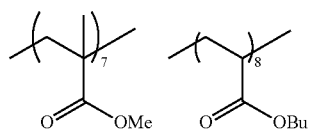

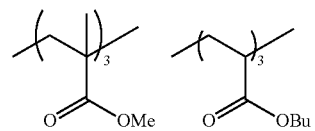

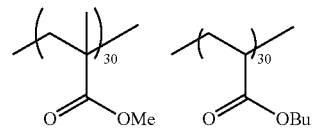

(Z$^s$-13)

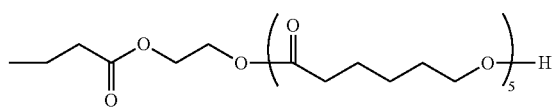

In the formulae, Me represents a methyl group, Et represents an ethyl group, Bu represents a butyl group, and a numerical value added to the repeating unit represents the number of repeating units.

EXAMPLES

Hereinafter, the present invention will be described in more detail with reference to the examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention is not limited to the specific examples shown below. In the following structural formula, Me represents a methyl group, Et represents an ethyl group, Bu represents a butyl group, and Boc represents a tert-butoxycarbonyl group.

<Measurement of Weight-Average Molecular Weight (Mw)>

The weight-average molecular weight (Mw) of a measurement sample was measured by gel permeation chromatography (GPC) according to the following conditions.

Types of columns: columns formed by connection of TOSOH TSKgel Super HZM-H, TOSOH TSKgel Super HZ4000, and TOSOH TSKgel Super HZ2000

Developing solvent: tetrahydrofuran

Column temperature: 40° C.

Flow rate (amount of a sample to be injected): 1.0 µL (sample concentration: 0.1 mass %)

Device name: HLC-8220GPC manufactured by Tosoh Corporation

Detector: refractive index (RI) detector

Calibration curve base resin: polystyrene resin

<Method of Measuring Acid Value>

The acid value of a resin represents a mass of potassium hydroxide required to neutralize acidic components per 1 g of solid content of the sample. The acid value of the resin was measured as follows. That is, a measurement sample was dissolved in a mixed solvent of tetrahydrofuran/water=9/1 (mass ratio), and the obtained solution was subjected to neutralization titration with a 0.1 mol/L sodium hydroxide aqueous solution at 25° C. using a potentiometric titrator (trade name: AT-510, manufactured by KYOTO ELECTRONICS MANUFACTURING CO., LTD.). An inflection point of a titration pH curve was set as a titration end point, and the acid value was calculated from the following equation.

$$A = 56.11 \times Vs \times 0.5 \times f/w$$

A: acid value (mgKOH/g)

Vs: amount (mL) of the 0.1 mol/L sodium hydroxide aqueous solution used for the titration f: titer of the 0.1 mol/L sodium hydroxide aqueous solution w: mass (g) of the measurement sample (expressed in terms of solid contents)

Synthesis of Resin (Synthesis Example 1) Synthesis of Resin (B-1)

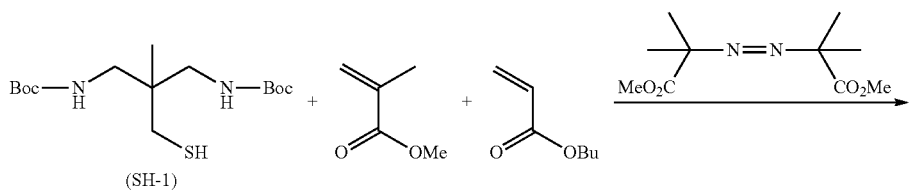

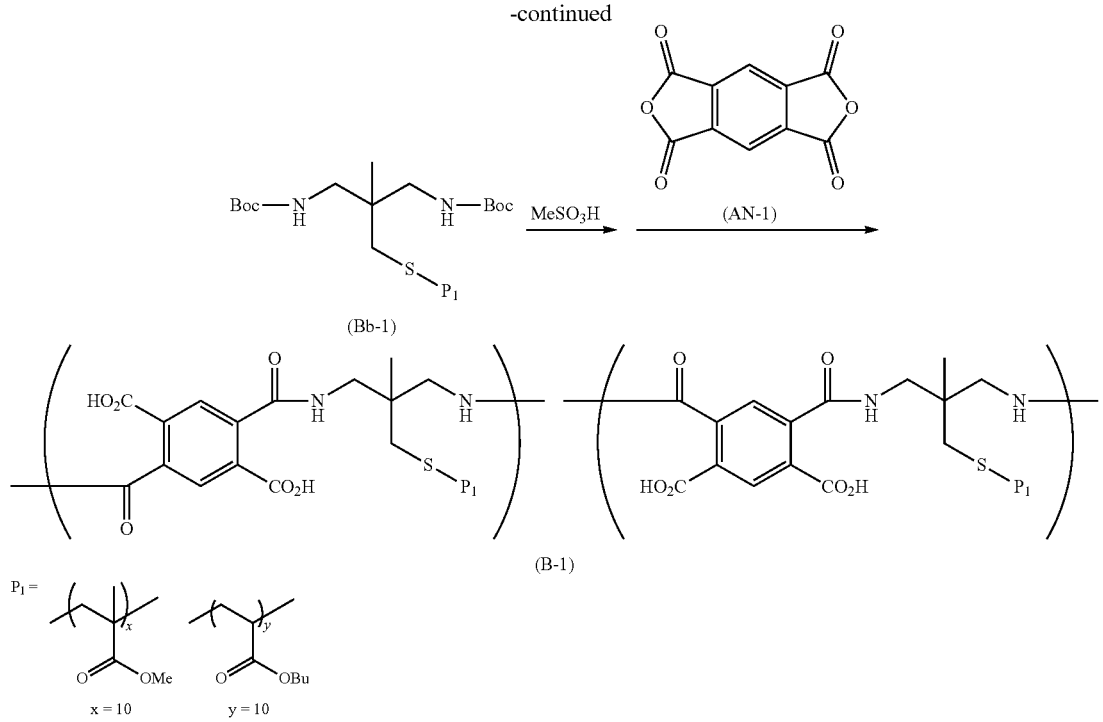

Under a nitrogen stream, 20 parts by mass of diglyme was heated to 80° C., a mixed solution of 11.7 parts by mass of a thiol compound (SH-1), 35.0 parts by mass of a methyl methacrylate as a monomer 1, 44.8 parts by mass of butyl acrylate as a monomer 2, 0.81 parts by mass of dimethyl 2,2'-azobis(isobutyrate) (V-601) as a polymerization initiator, and 80 parts by mass of diglyme was added dropwise thereto over 2 hours, and the mixture was heated for 3 hours to synthesize a target compound (Bb-1). It was confirmed by a matrix-assisted laser desorption/ionization mass spectrometry (MALDI-MS method) that the obtained compound was the compound (Bb-1). In addition, the weight-average molecular weight of the compound (Bb-1) was 3600.

Next, 0.10 parts by mass of methanesulfonic acid was added thereto, and the mixture was heated at 110° C. for 4 hours. After cooling to 10° C., 7.6 parts by mass of acid anhydride (AN-1) was added thereto, and the mixture was stirred for 2 hours. The obtained solution was added dropwise to a mixed solution of 700 mL of methanol and 300 mL of ion exchange water, and the separated solid was filtered and washed with ion exchange water. The obtained solid was dried at 50° C. for 24 hours in a blast dryer to obtain 90.3 parts by mass of a resin (B-1). The weight-average molecular weight (Mw) of the resin (B-1) was 15000, and the acid value was 41 mgKOH/g.

(Synthesis Examples 2 to 12) Synthesis of Resins (B-2) to (B-12)

The same operation as in Synthesis Example 1 was carried out except that the compound and the amount charged in Synthesis Example 1 were changed as shown in Table 1, thereby synthesizing resins (B-2) to (B-12).

TABLE 1

| | | Thiol compound | | Monomer 1 | | Monomer 2 | | Polymerization initiator V-601 | Acid anhydride | |
|---|---|---|---|---|---|---|---|---|---|---|
| | Resin | Type | Charged amount (part by mass) | Type | Charged amount (part by mass) | Type | Charged amount (part by mass) | Charged amount (part by mass) | Type | Charged amount (part by mass) |
| Synthesis example 1 | B-1 | SH-1 | 11.7 | MMA | 35.0 | BA | 44.8 | 0.81 | AN-1 | 7.6 |
| Synthesis example 2 | B-2 | SH-1 | 14.6 | BMA | 78.6 | — | — | 0.9 | AN-2 | 8.3 |
| Synthesis example 3 | B-3 | SH-2 | 21 | MMA | 27.4 | BA | 35.1 | 1.6 | AN-1 | 14.8 |
| Synthesis example 4 | B-4 | SH-3 | 5.86 | MMA | 28.7 | BA | 61.2 | 0.99 | AN-3 | 3.8 |

TABLE 1-continued

| | Resin | Thiol compound Type | Thiol compound Charged amount (part by mass) | Monomer 1 Type | Monomer 1 Charged amount (part by mass) | Monomer 2 Type | Monomer 2 Charged amount (part by mass) | Polymerization initiator V-601 Charged amount (part by mass) | Acid anhydride Type | Acid anhydride Charged amount (part by mass) |
|---|---|---|---|---|---|---|---|---|---|---|
| Synthesis example 5 | B-5 | SH-4 | 15.3 | EMA | 75.1 | — | — | 1.0 | AN-4 | 8.6 |
| Synthesis example 6 | B-6 | SH-1 | 12.7 | EMA | 64.9 | MAA | 9.8 | 0.87 | AN-5 | 11.8 |
| Synthesis example 7 | B-7 | SH-1/SH-2 | 5.1/5.0 | ST | 16.6 | BA | 61.1 | 0.73 | AN-6 | 11.4 |
| Synthesis example 8 | B-8 | SH-5 | 10.1 | AEL | 17.2 | BA | 65.9 | 0.66 | AN-1 | 6.2 |
| Synthesis example 9 | B-9 | SH-7 | 18.8 | MMA | 29.3 | BA | 37.6 | 1.4 | AN-1/AN-2 | 6.4/6.6 |
| Synthesis example 10 | B-10 | SH-1 | 14.1 | MMA | 29.5 | BA | 43.2 | 0.97 | AN-7 | 12.1 |
| Synthesis example 11 | B-11 | SH-6 | 26.7 | MMA | 24.0 | BA | 30.7 | 1.8 | AN-8 | 16.8 |
| Synthesis example 12 | B-12 | SH-6 | 4.5 | MMA | 40.5 | BA | 51.8 | 0.31 | AN-8 | 2.8 |

In the above table, structures of thiol compounds (SH-1) to (SH-7) and acid anhydrides (AN-1) to (AN-8) are as follows.

MMA is methyl methacrylate, BMA is butyl methacrylate, EMA is ethyl methacrylate, BA is butyl acrylate, MAA is methacrylic acid, ST is styrene, and AEL is ω-carboxy-polycaprolactone (n≈2) monoacrylate.

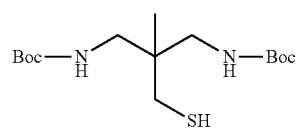 (SH-1)

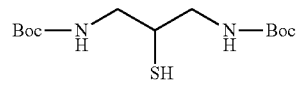 (SH-2)

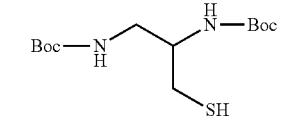 (SH-3)

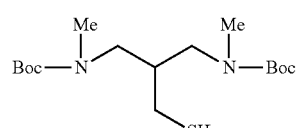 (SH-4)

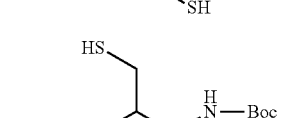 (SH-5)

-continued

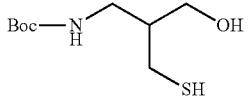 (SH-6)

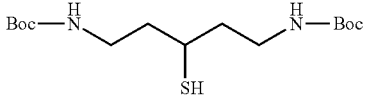 (SH-7)

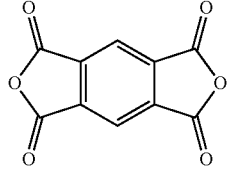 (AN-1)

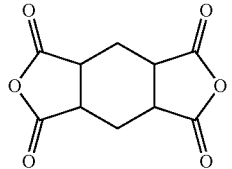 (AN-2)

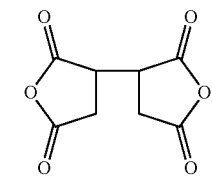 (AN-3)

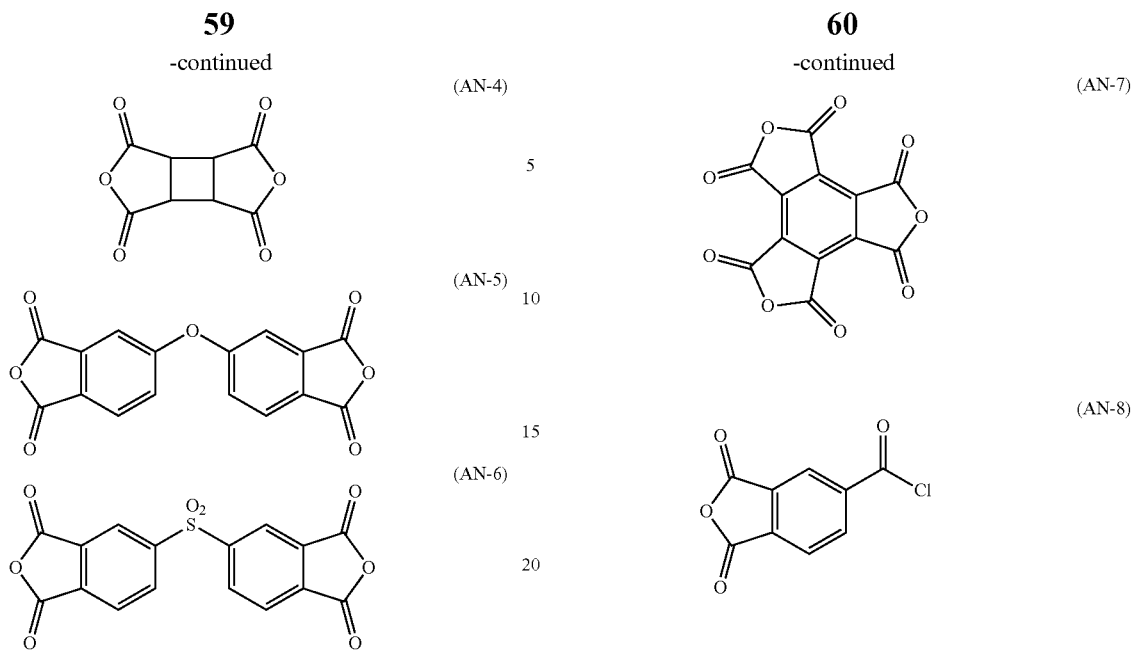
(Synthesis Example 13) Synthesis of Resin (B-13)
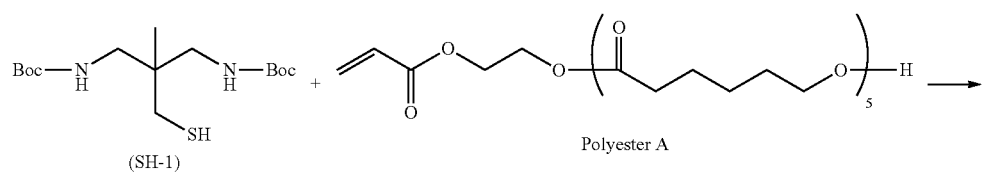
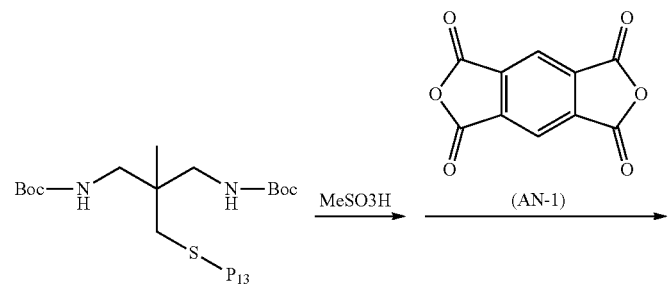
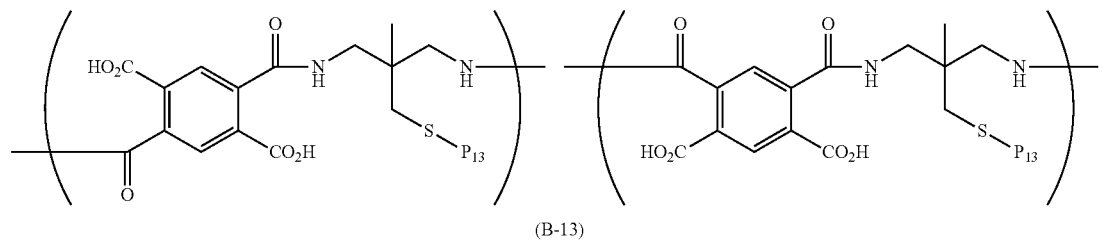
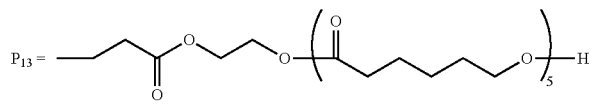

Under a nitrogen stream, 100 parts by mass of diglyme, 26.8 parts by mass of the thiol compound (SH-1), 55.0 parts by mass of a polyester A, and 1.6 parts by mass of triethylamine were mixed, and the mixture was stirred at 80° C. for 3 hours. Next, 2.6 parts by mass of methanesulfonic acid was added thereto, and the mixture was heated at 110° C. for 4 hours. After cooling to 10° C., 17.5 parts by mass of acid anhydride (AN-1) was added thereto, and the mixture was stirred for 2 hours. The obtained solution was added dropwise to a mixed solution of 700 mL of methanol and 300 mL of ion exchange water, and the separated solid was filtered and washed with ion exchange water. The obtained solid was dried at 50° C. for 24 hours in a blast dryer to obtain 95.1 parts by mass of a resin (B-13). The weight-average molecular weight (Mw) of the resin (B-13) was 14000, and the acid value was 90 mgKOH/g.

Structures of the resins (B-1) to (B-13) synthesized in Synthesis Examples 1 to 13 are represented by Formula (Ia). The structure or numerical value of each element constituting Formula (Ia) is shown in the tables below. In the tables below, groups $A_1$, $A_2$, $A_3$, $B_1$, $B_2$, $B_3$, and D shown in the column of $W^1$ are connection positions with groups surrounded by the dotted line of Formula (Ia). However, with regard to B-1 to B-9, and B-13, either one of $A_1$ or $B_1$ and either one of $A_2$ or $B_2$ are connection positions with $R^3$. In addition, with regard to B-10, either one of $A_1$ or $B_1$, either one of $A_2$ or $B_2$, and either one of $A_3$ or $B_3$ are connection positions with $R^3$. In addition, with regard to B-11 and B-12, either one of $A_1$ or $B_1$ is a connection position with $R^3$.

In addition, in the tables below, a group #shown in the columns of $X^1$ and $X^2$ represents a connection position with a nitrogen atom adjacent to $X^1$ or $X^2$ in Formula (Ia) and a connection position with $Y^1$ or $Y^2$, and * represents a connection position with $Z^1$ or $Z^2$. In addition, numerical values added to the repeating units shown in the columns of $Z^1$ and $Z^2$ represent the number of repeating units. The weight-average molecular weights of the polymer chains $Z^1$ and $Z^2$ shown in the tables below are both 500 or more.

Here, all of the resins (B-1) to (B-13) were synthesized using a compound represented by Formula (10) (hereinafter, also referred to as a raw material macromonomer) as a raw material. Therefore, the weight-average molecular weight of the raw material macromonomer was measured by a gel permeation chromatography (GPC) method, and the weight-average molecular weights of the polymer chains $Z^1$ and $Z^2$ were calculated by subtracting the molecular weight of the portion of the raw material macromonomer other than $Z^3$ from the measured weight-average molecular weight of the raw material macromonomer. The weight-average molecular weight of the above-described compound (Bb-1) which was the raw material macromonomer of the resin (B-1) was 3600, the weight-average molecular weight of the raw material macromonomer of the resin (B-2) was 2800, the weight-average molecular weight of the raw material macromonomer of the resin (B-3) was 1500, the weight-average molecular weight of the raw material macromonomer of the resin (B-4) was 7500, the weight-average molecular weight of the raw material macromonomer of the resin (B-5) was 2600, the weight-average molecular weight of the raw material macromonomer of the resin (B-6) was 3300, the weight-average molecular weight of the raw material macromonomer of the resin (B-7) was 3800, the weight-average molecular weight of the raw material macromonomer of the resin (B-8) was 3500, the weight-average molecular weight of the raw material macromonomer of the resin (B-9) was 1700, the weight-average molecular weight of the raw material macromonomer of the resin (B-10) was 2600, the weight-average molecular weight of the raw material macromonomer of the resin (B-11) was 900, the weight-average molecular weight of the raw material macromonomer of the resin (B-12) was 11000, and the weight-average molecular weight of the raw material macromonomer of the resin (B-13) was 1500.

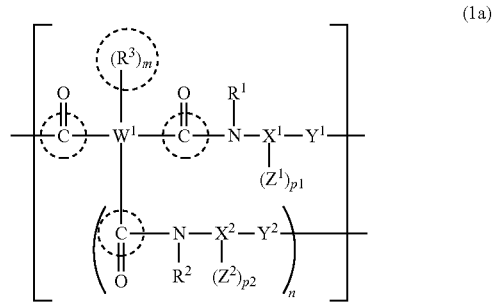

(Ia)

TABLE 2

| Synthesis Example | Resin | $W^1$ | $R^3$ | m | $R^1, R^2$ | $X^1, X^2$ | $Y^1, Y^2$ | $Z^1, Z^2$ | p1, p2 n |
|---|---|---|---|---|---|---|---|---|---|
| Synthesis Example 1 | B-1 |  | $CO_2H$ | 2 | $R^1 = H$ |  | $Y^1, Y^2 = NH$ |  | p1 = 1 0 |
| Synthesis Example 2 | B-2 |  | $CO_2H$ | 2 | $R^1 = H$ |  | $Y^1, Y^2 = NH$ | $Z^1 =$  | p1 = 1 0 |
| Synthesis Example 3 | B-3 |  | $CO_2H$ | 2 | $R^1 = H$ |  | $Y^1, Y^2 = NH$ |  | p1 = 1 0 |
| Synthesis Example 4 | B-4 |  | $CO_2H$ | 2 | $R^1 = H$ |  | $Y^1, Y^2 = NH$ |  | p1 = 1 0 |
| Synthesis Example 5 | B-5 |  | $CO_2H$ | 2 | $R^1 = Me$ |  | $Y^1, Y^2 = NMe$ | $Z^1 =$  | p1 = 1 0 |
| Synthesis Example 6 | B-6 |  | $CO_2H$ | 2 | $R^1 = H$ |  | $Y^1, Y^2 = NH$ |  | p1 = 1 0 |

TABLE 2-continued

| Synthesis Example | Resin | W¹ | R³ | m | R¹, R² | X¹, X² | Y¹, Y² | Z¹, Z² | p1, p2 n |
|---|---|---|---|---|---|---|---|---|---|
| Synthesis Example 7 | B-7 | (diphenyl sulfone with A₁, B₁, A₂, B₂ substituents, SO₂ linker) | CO₂H | 2 | R¹ = H | X¹ = (neopentyl dithioether structure) / (3-carbon dithioether structure) 50/50 (molar ratio) | Y¹ = NH | Z¹ = (styrene unit, n=5); (n-butyl acrylate unit, n=15) | p1 = 1 0 |
| Synthesis Example 8 | B-8 | (benzene ring with A₁, B₁, A₂, B₂ substituents) | CO₂H | 2 | R¹ = H, R² = H | X¹ = (3-carbon dithioether structure) | Y¹ = NH | Z¹ = (caprolactone-ester unit, n=10, m=2); (n-butyl acrylate unit, n=10) | p1 = 2 0 |

TABLE 3

| Synthesis Example | Resin | $W^1$ | $R^3$ | m | $R^1, R^2$ | $X^1, X^2$ | $Y^1, Y^2$ | $Z^1, Z^2$ | p1, p2 | n |
|---|---|---|---|---|---|---|---|---|---|---|
| Synthesis Example 9 | B-9 | 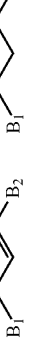 50/50 (molar ratio) | $CO_2H$ | 2 | $R^1 = H$ | 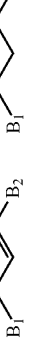 $X^1 =$ | $Y^1 = NH$ |  | p1 = 1 | 0 |
| Synthesis Example 10 | B-10 |  | $CO_2H$ | 3 | $R^1 = H$ |  $X^1, X^2 =$ | $Y^1, Y^2 = NH$ | 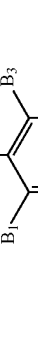 $Z^1, Z^2 =$ | p1, p2 = 1 | 1 |
| Synthesis Example 11 | B-11 |  | $CO_2H$ | 1 | $R^1 = H$ |  $X^1 =$ | $Y^1 = O$ |  $Z^1 =$ | p1 = 1 | 0 |
| Synthesis Example 12 | B-12 |  | $CO_2H$ | 1 | $R^1 = H$ |  $X^1 =$ | $Y^1 = O$ |  $Z^1 =$ | p1 = 1 | 0 |
| Synthesis Example 13 | B-13 |  | $CO_2H$ | 2 | $R^1 = H$ | 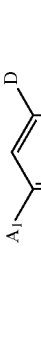 $X^1 =$ | $Y^1 = NH$ |  $Z^1 =$ | p1 = 1 | 0 |

(Synthesis Example 14) Synthesis of Resin (B-14)

Under air, 50 parts by mass of the resin (B-6), 5 parts by mass of 4-hydroxybutyl acrylate glycidyl ether, 150 parts by mass of diglyme, 1 part by mass of tetrabutylammonium bromide, and 0.1 parts by mass of p-methoxyphenol were mixed, and the mixture was heated and stirred at 90° C. for 48 hours. It was confirmed by a high performance liquid chromatography (HPLC) measurement that 4-hydroxybutyl acrylate glycidyl ether was consumed. After allowing to cool, the obtained solution was added dropwise to a mixed solution of 700 mL of methanol and 300 mL of ion exchange water, and the separated solid was filtered and washed with ion exchange water. The obtained solid was dried at 50° C. for 24 hours in a blast dryer to obtain 53.2 parts by mass of a resin (B-14). The weight-average molecular weight (Mw) of the resin (B-14) was 12000, the acid value was 75 mgKOH/g, and the C=C value measured by a nuclear magnetic resonance (NMR) method was 0.45 mmol/g.

(Synthesis Example 15) Synthesis of Resin (B-15)

The same operation was carried out except that 4-hydroxybutyl acrylate glycidyl ether of Synthesis Example 14 was changed to the same amount of glycidyl methacrylate, thereby obtaining a resin (B-15). The weight-average molecular weight (Mw) of the resin (B-15) was 12000, the acid value was 62 mgKOH/g, and the C=C value measured by a nuclear magnetic resonance (NMR) method was 0.65 mmol/g.

(Synthesis Example 16) Synthesis of Resin (B-16)

Under a nitrogen stream, 100 parts by mass of diglyme, 8.7 parts by mass of the thiol compound (SH-3), 6.2 parts by mass of the acid anhydride (AN-1), and 2.1 parts by mass of methanesulfonic acid were mixed, and the mixture was stirred at 80° C. for 3 hours. After cooling to 10° C., under a nitrogen stream, 48.5 parts by mass of (3-ethyloxetane-3-yl)methyl acrylate (OXE-10) as a monomer 1 and 36.5 parts by mass of tert-butyl acrylate (tBA) as a monomer 2 were added thereto, and the mixture was heated to 80° C. 0.33 parts by mass of dimethyl 2,2'-azobis(isobutyrate) (V-601) as a polymerization initiator was added thereto, and the mixture was heated for 8 hours. The obtained solution was added dropwise to a mixed solution of 700 mL of methanol and 300 mL of ion exchange water, and the separated solid was filtered and washed with ion exchange water. The obtained solid was dried at 50° C. for 24 hours in a blast dryer to obtain 93.2 parts by mass of a resin (B-16). The weight-average molecular weight (Mw) of the resin (B-16) was 14000, and the acid value was 32 mgKOH/g.

(Synthesis Examples 17 to 32) Synthesis of Resins (B-17) to (B-32)

The same operation as in Synthesis Example 16 was carried out except that the type and amount charged in each compound were changed as shown in the table below, thereby synthesizing resins (B-17) to (B-32).

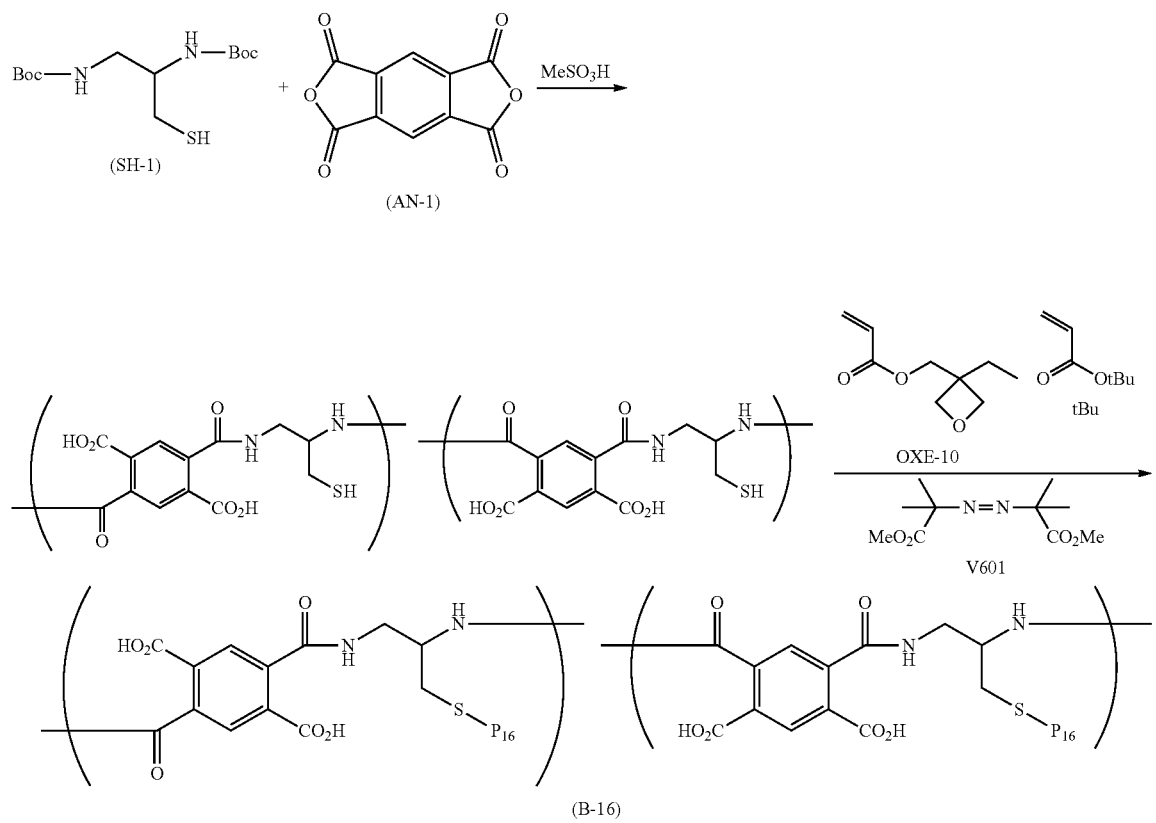

(B-16)

TABLE 4

| | Resin | Thiol compound Type | Charged amount part by mass | Acid anhydride Type | Charged amount part by mass | Monomer 1 Type | Charged amount part by mass | Monomer 2 Type | Charged amount part by mass | Polymerization initiator V-601 Charged amount part by mass |
|---|---|---|---|---|---|---|---|---|---|---|
| Synthesis example 16 | B-16 | SH-3 | 8.7 | AN-1 | 6.2 | OXE-10 | 48.5 | tBA | 36.5 | 0.33 |
| Synthesis example 17 | B-17 | SH-3 | 8.3 | AN-1 | 5.9 | OXE-10 | 64.8 | tBA | 20.9 | 0.31 |
| Synthesis example 18 | B-18 | SH-3 | 8.1 | AN-1 | 5.8 | OXE-30 | 58.8 | tBA | 27.3 | 0.31 |
| Synthesis example 19 | B-19 | SH-3 | 8.3 | AN-1 | 5.9 | OXE-10 | 64.8 | BA | 20.9 | 0.31 |
| Synthesis example 20 | B-20 | SH-3 | 8.1 | AN-2 | 5.9 | OXE-10 | 80.7 | BA | 5.3 | 0.30 |
| Synthesis example 21 | B-21 | SH-3 | 8.7 | AN-1 | 6.2 | BA | 67.9 | MMA | 17.1 | 0.33 |
| Synthesis example 22 | B-22 | SH-3 | 8.5 | AN-1 | 6.0 | OXE-10 | 56.6 | HEMA | 28.9 | 0.32 |
| Synthesis example 23 | B-23 | SH-3 | 8.2 | AN-5 | 8.3 | OXE-10 | 72.5 | ST | 11.1 | 0.31 |
| Synthesis example 24 | B-24 | SH-3 | 7.8 | AN-1 | 5.6 | OXE-10 | 86.6 | — | — | 0.29 |
| Synthesis example 25 | B-25 | SH-1 | 8.1 | AN-1 | 5.3 | OXE-30 | 80.4 | tBA | 6.2 | 0.28 |
| Synthesis example 26 | B-26 | SH-4 | 9.0 | AN-1 | 5.6 | OXE-10 | 78.8 | tBA | 6.6 | 0.30 |
| Synthesis example 27 | B-27 | SH-5 | 9.9 | AN-1 | 6.1 | OXE-10 | 76.7 | tBA | 7.2 | 0.32 |
| Synthesis example 28 | B-28 | SH-6 | 5.9 | AN-1 | 5.8 | OXE-10 | 81.5 | tBA | 6.8 | 0.31 |
| Synthesis example 29 | B-29 | SH-3 | 9.5 | AN-1 | 6.8 | GMA | 44.0 | tBA | 39.7 | 0.36 |
| Synthesis example 30 | B-30 | SH-3 | 8.0 | AN-1 | 5.7 | 4HBAGE | 52.6 | tBA | 33.7 | 0.30 |
| Synthesis example 31 | B-31 | SH-3 | 7.1 | AN-1 | 5.0 | MOI-BP | 57.9 | HEMA | 30.0 | 0.27 |
| Synthesis example 32 | B-32 | SH-3 | 7.2 | AN-1 | 5.1 | MOI-BM | 57.0 | HEMA | 30.6 | 0.27 |

In the above table, SH-1, SH-3, SH-4, SH-5, SH-6, AN-1, AN-2, and AN-5 are compounds having the above-described structures. In addition, OXE-10 is (3-ethyloxetane-3-yl) methyl acrylate, OXE-30 is (3-ethyloxetane-3-yl)methyl methacrylate, BA is butyl acrylate, GMA is glycidyl methacrylate, 4HBAGE is 4-hydroxybutyl acrylate glycidyl ether, MOI-BP is 2-[(3,5-dimethylpyrazolyl) carbonylamino]ethyl methacrylate, MOI-BM is 2-[0-(1'-methylpropylideneamino)carboxyamino]ethyl methacrylate, tBA is tert-butyl acrylate, MMA is methacrylic acid, HEMA is 2-hydroxyethyl methacrylate, and ST is styrene.

(Synthesis Example 33) Synthesis of Resin (B-33)

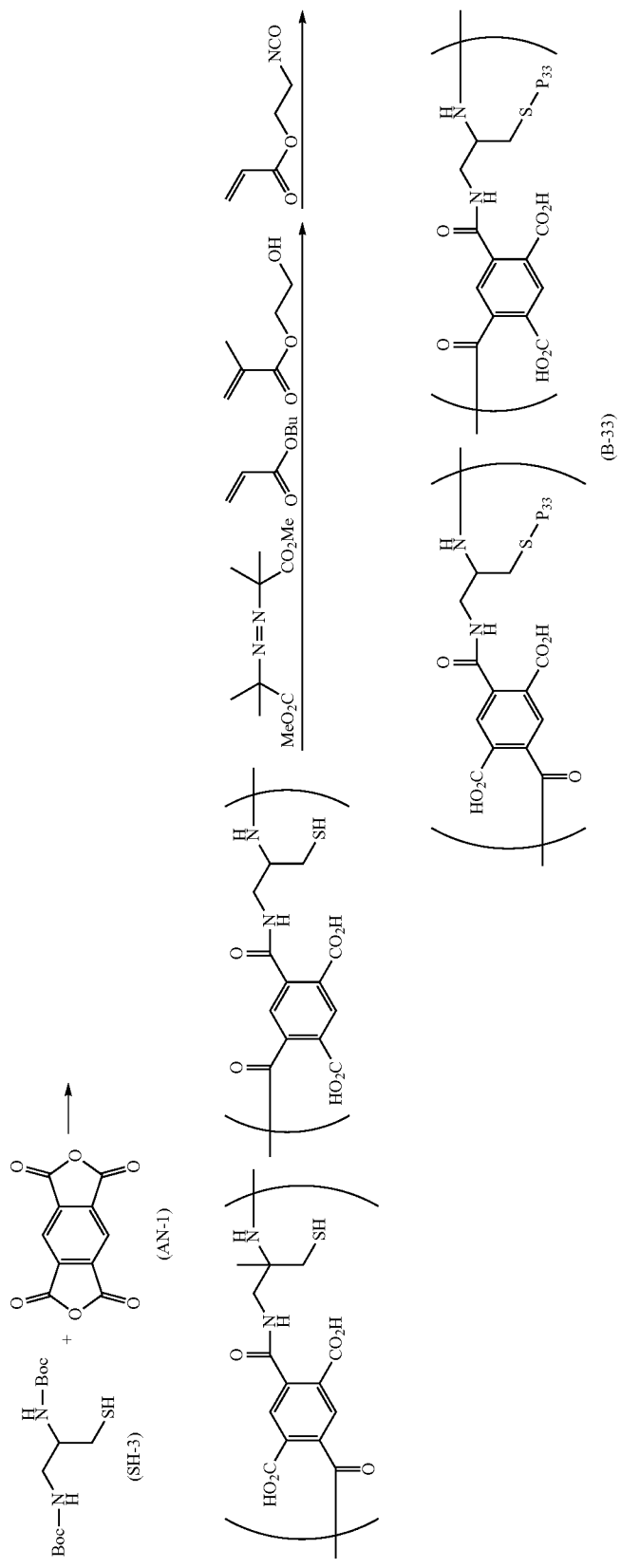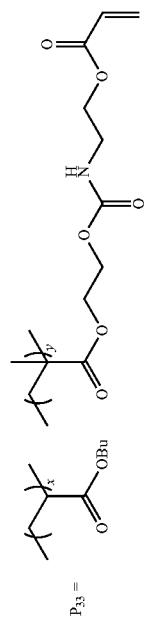

Under a nitrogen stream, 100 parts by mass of diglyme, 6.8 parts by mass of the thiol compound (SH-3), 4.8 parts by mass of the acid anhydride (AN-1), and 2.1 parts by mass of methanesulfonic acid were mixed, and the mixture was stirred at 80° C. for 3 hours. After cooling to 10° C., under a nitrogen stream, 52.5 parts by mass of butyl acrylate as a monomer 1 and 17.2 parts by mass of 2-hydroxyethyl methacrylate as a monomer 2 were added thereto, and the mixture was heated to 80° C. 0.25 parts by mass of dimethyl 2,2'-azobis(isobutyrate) (V-601) as a polymerization initiator was added thereto, and the mixture was heated for 8 hours and further heated at 90° C. for 2 hours. To this solution, 0.1 parts by mass of NEOSTANN U-600 (manufactured by Nitto Kasei Co., Ltd.) was added and then 19.0 parts by mass of 2-isocyanatoethyl acrylate was added dropwise, and the mixture was heated and stirred for 6 hours. After cooling to room temperature, the obtained solution was added dropwise to a mixed solution of 700 mL of methanol and 300 mL of ion exchange water, and the separated solid was filtered and washed with ion exchange water. The obtained solid was dried at 50° C. for 24 hours in a blast dryer to obtain 92.2 parts by mass of a resin (B-33). The weight-average molecular weight (Mw) of the resin (B-33) was 17000, and the acid value was 25 mgKOH/g.

(Synthesis Example R1) Synthesis of Resin (R-1) for Comparative Example

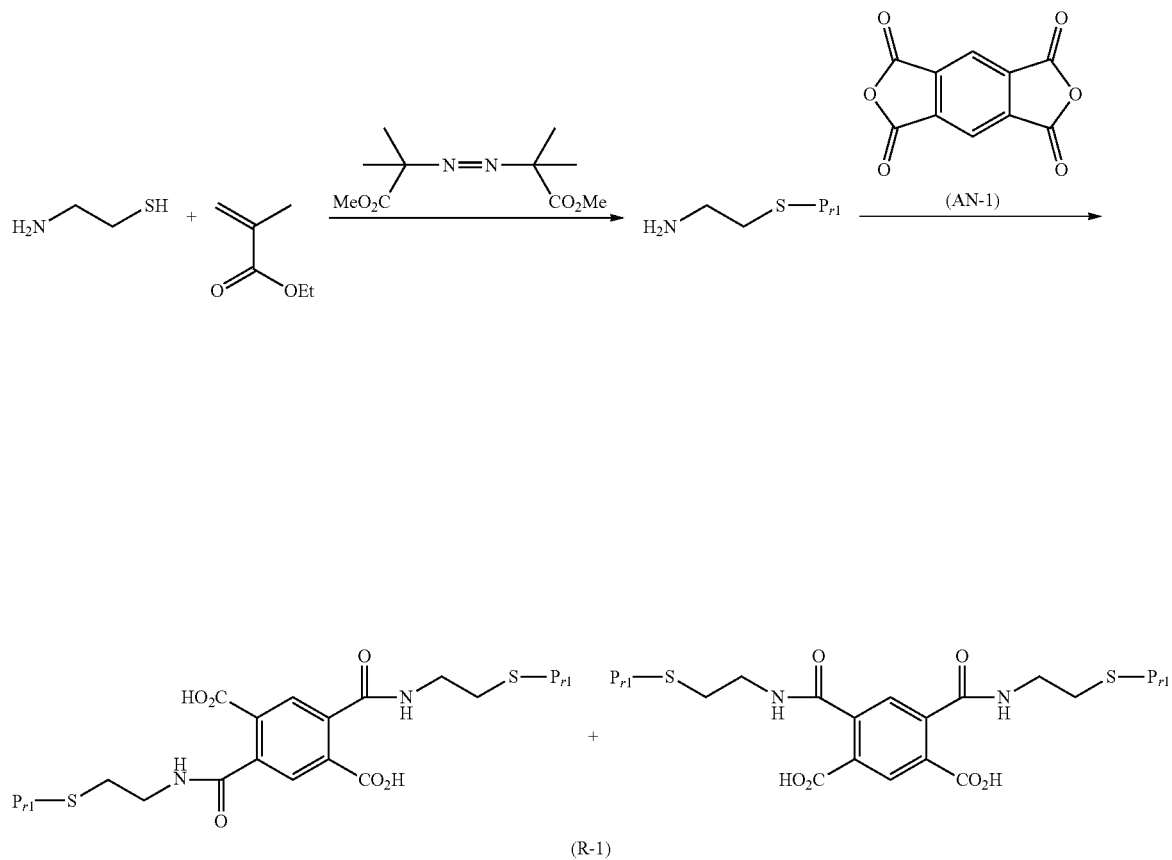

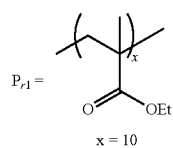

x = 10

Under a nitrogen stream, 20 parts by mass of diglyme was heated to 80° C., a mixed solution of 3.8 parts by mass of 2-aminoethanethiol, 84.3 parts by mass of ethyl methacrylate, 1.1 parts by mass of dimethyl 2,2'-azobis(isobutyrate) (V-601), and 80 parts by mass of diglyme was added dropwise thereto over 2 hours, and the mixture was heated for 3 hours. After cooling to 10° C., 10.7 parts by mass of acid anhydride (AN-1) was added thereto, and the mixture was stirred for 2 hours. The obtained solution was added dropwise to a mixed solution of 700 ml of methanol and 300 mL of ion exchange water, and the separated solid was filtered and washed with ion exchange water. The obtained solid was dried at 50° C. for 24 hours in a blast dryer to obtain 97.4 parts by mass of a resin (R-1). The weight-average molecular weight (Mw) of the resin (R-1) was 8000, and the acid value was 56 mgKOH/g.

(Synthesis Example R²) Synthesis of Resin (R-2) for Comparative Example

The table below shows the weight-average molecular weight (Mw), acid value, and ethylenically unsaturated bond-containing group value (C=C value) of the resins (B-1) to (B-33), (R-1), and (R-2).

TABLE 5

| Synthesis example | Resin | Mw | Acid value mgKOH/g | C = C VALUE mmol/g |
|---|---|---|---|---|
| Synthesis example 1 | B-1 | 15000 | 41 | — |
| Synthesis example 2 | B-2 | 12000 | 44 | — |
| Synthesis example 3 | B-3 | 7500 | 81 | — |
| Synthesis example 4 | B-4 | 32000 | 23 | — |
| Synthesis example 5 | B-5 | 10000 | 51 | — |
| Synthesis example 6 | B-6 | 11000 | 110 | — |
| Synthesis example 7 | B-7 | 17000 | 40 | — |
| Synthesis example 8 | B-8 | 16000 | 68 | — |
| Synthesis example 9 | B-9 | 11000 | 70 | — |
| Synthesis example 10 | B-10 | 12000 | 73 | — |
| Synthesis example 11 | B-11 | 4200 | 48 | — |
| Synthesis example 12 | B-12 | 41000 | 12 | — |

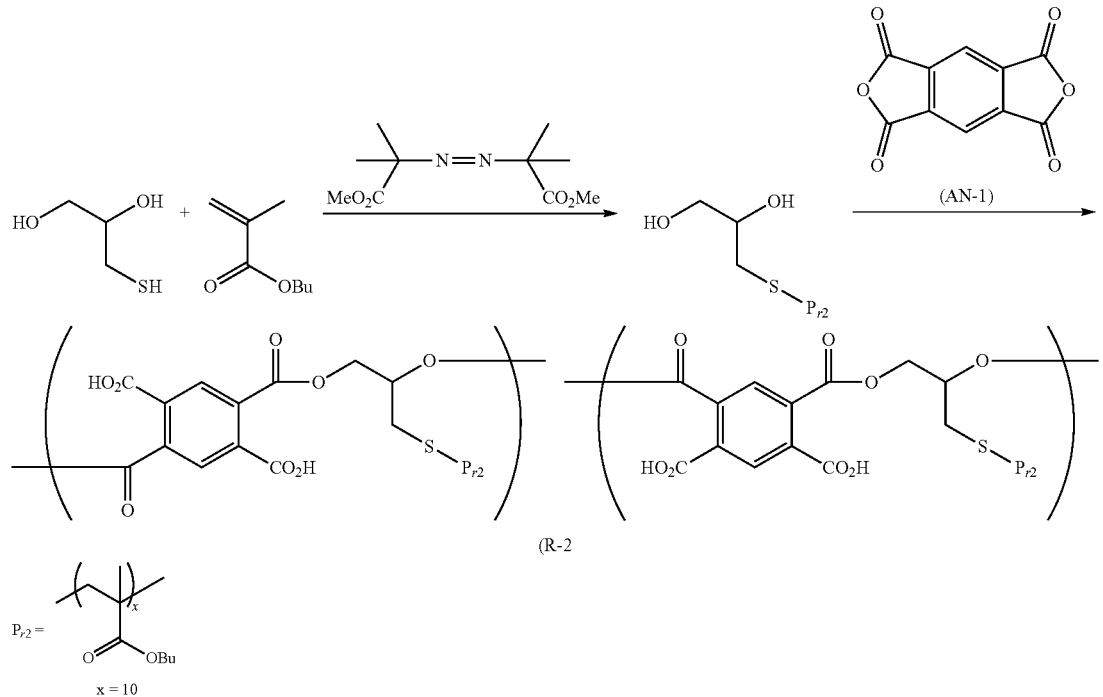

Under a nitrogen stream, 20 parts by mass of diglyme was heated to 80° C., a mixed solution of 4.4 parts by mass of α-thioglycerol, 85.9 parts by mass of butyl methacrylate, 0.92 parts by mass of dimethyl 2,2'-azobis(isobutyrate) (V-601), and 80 parts by mass of diglyme was added dropwise thereto over 2 hours, and the mixture was heated for 3 hours. After heating to 120° C., 8.8 parts by mass of the acid anhydride (AN-1) was added thereto, 1.0 part by mass of 1,8-diazabicyclo-[5.4.0]-7-undecene was added thereto, and the mixture was stirred for 7 hours. The obtained solution was added dropwise to a mixed solution of 700 mL of methanol and 300 mL of ion exchange water, and the separated solid was filtered and washed with ion exchange water. The obtained solid was dried at 50° C. for 24 hours in a blast dryer to obtain 93.2 parts by mass of a resin (R-2). The weight-average molecular weight (Mw) of the resin (R-2) was 11000, and the acid value was 44 mgKOH/g.

TABLE 5-continued

| Synthesis example | Resin | Mw | Acid value mgKOH/g | C = C VALUE mmol/g |
|---|---|---|---|---|
| Synthesis example 13 | B-13 | 14000 | 90 | — |
| Synthesis example 14 | B-14 | 12000 | 75 | 0.45 |
| Synthesis example 15 | B-15 | 12000 | 62 | 0.65 |
| Synthesis example 16 | B-16 | 14000 | 32 | — |
| Synthesis example 17 | B-17 | 12000 | 31 | — |
| Synthesis example 18 | B-18 | 15000 | 30 | — |
| Synthesis example 19 | B-19 | 16000 | 31 | — |
| Synthesis example 20 | B-20 | 17000 | 30 | — |
| Synthesis example 21 | B-21 | 19000 | 32 | — |
| Synthesis example 22 | B-22 | 11000 | 31 | — |
| Synthesis example 23 | B-23 | 9000 | 30 | — |
| Synthesis example 24 | B-24 | 10000 | 29 | — |
| Synthesis example 25 | B-25 | 8000 | 27 | — |
| Synthesis example 26 | B-26 | 12000 | 29 | — |

TABLE 5-continued

| Synthesis example | Resin | Mw | Acid value mgKOH/g | C = C VALUE mmol/g |
|---|---|---|---|---|
| Synthesis example 27 | B-27 | 14000 | 32 | — |
| Synthesis example 28 | B-28 | 12000 | 30 | — |
| Synthesis example 29 | B-29 | 13000 | 35 | — |
| Synthesis example 30 | B-30 | 11000 | 29 | — |
| Synthesis example 31 | B-31 | 17000 | 26 | — |
| Synthesis example 32 | B-32 | 14000 | 26 | — |
| Synthesis example 33 | B-33 | 17000 | 25 | 1.32 |
| Synthesis example R1 | R-1 | 8000 | 56 | — |
| Synthesis example R2 | R-2 | 11000 | 44 | — |

Production of Resin Composition (Pigment Dispersion Liquid)

Examples 1 to 43 and Comparative Examples 1 and 2

A mixed solution obtained by mixing the types of resins, pigments, pigment derivatives, and solvents shown in the tables below in the proportions shown in the tables below was mixed and dispersed for 3 hours using a beads mill (zirconia beads having a diameter of 0.3 mm) to prepare a dispersion liquid. Next, using a high-pressure disperser NANO-3000-10 (manufactured by Nippon BEE Chemical Co., Ltd.) equipped with a pressure reducing mechanism, the pigment dispersion liquid was further dispersed under a pressure of 2000 kg/cm$^3$ at a flow rate of 500 g/min. The dispersion treatment was repeated 10 times to obtain a pigment dispersion liquid.

TABLE 6

| Example | Dispersion liquid | Resin Type | Added amount (part by mass) | Pigment Type | Added amount (part by mass) | Pigment derivative Type | Added amount (part by mass) | Solvent Type | Added amount (part by mass) |
|---|---|---|---|---|---|---|---|---|---|
| Example 1 | (D-1) | (B-1) | 4.5 | PB15:6 PV23 | 10 4 | SY-1 | 1 | PGMEA | 80.5 |
| Example 2 | (D-2) | (B-2) | 4.5 | PR254 PY139 | 10 4 | SY-2 | 1 | CPN | 80.5 |
| Example 3 | (D-3) | (B-3) | 4.5 | PG58 PY185 | 10 4 | SY-4 | 1 | PGMEA | 80.5 |
| Example 4 | (D-4) | (B-4) | 4.5 | PG63 PY139 | 11 3 | SY-2 | 1 | CPN | 80.5 |
| Example 5 | (D-5) | (B-5) | 4.5 | PG36 Y-1 | 11 3 | SY-2 | 1 | PGMEA | 80.5 |
| Example 6 | (D-6) | (B-6) | 4.5 | PR254 Y-2 | 11 3 | SY-3 | 1 | PGMEACPN | 40.5 40.0 |
| Example 7 | (D-7) | (B-7) | 4.5 | PR272 PY139 | 11 3 | SY-2 | 1 | PGMEA | 80.5 |
| Example 8 | (D-8) | (B-8) | 4.5 | PG36 PY185 PY150 | 12 1 1 | SY-2 | 1 | PGMEA | 80.5 |
| Example 9 | (D-9) | (B-9) | 4.5 | PB15:6 | 14 | SY-1 | 1 | PGMEA | 80.5 |
| Example 10 | (D-10) | (B-10) | 4.5 | PY150 | 14 | SY-2 | 1 | PGMEA | 80.5 |
| Example 11 | (D-11) | (B-11) | 4.5 | PR122 | 14 | SY-2 | 1 | PGMEA | 80.5 |
| Example 12 | (D-12) | (B-12) | 4.5 | PY139 | 14 | SY-2 | 1 | PGMEA | 80.5 |
| Example 13 | (D-13) | (B-13) | 4.5 | PV23 | 14 | SY-5 | 1 | PGMEA | 80.5 |
| Example 14 | (D-14) | (B-14) | 4.5 | PO71 PY139 | 12 2 | SY-2 | 1 | PGMEA | 80.5 |
| Example 15 | (D-15) | (B-14) (B-1) | 3.0 1.5 | PR264 PY139 | 12 2 | SY-2 | 1 | PGMEA | 80.5 |
| Example 16 | (D-16) | (B-14) | 4.5 | PB15:6 PR254 | 7 7 | SY-1 | 1 | PGMEA | 80.5 |
| Example 17 | (D-17) | (B-14) | 4.5 | Titanium oxide | 15 | — | — | PGMEA | 80.5 |
| Example 18 | (D-18) | (B-14) | 4.5 | Titanium nitride | 15 | — | — | PGMEA | 80.5 |
| Example 19 | (D-19) | (B-14) | 4.5 | Titanium oxynitride | 15 | — | — | PGMEA | 80.5 |
| Example 20 | (D-20) | (B-14) | 4.5 | Carbon black | 15 | — | — | PGMEA | 80.5 |
| Example 21 | (D-21) | (B-15) | 3.0 | PB15:6 PV23 | 10 4 | SY-1 | 1 | PGMEA | 81.5 |
| Example 22 | (D-2) | (B-14) | 2.5 | PR254 PY139 | 10 4 | SY-3 | 1 | PGMEA | 82.5 |
| Example 23 | (D-23) | (B-14) | 5.5 | PR272 PY139 | 10 4 | SY-2 | 1 | PGMEA | 83.5 |
| Example 24 | (D-24) | (B-14) (R-1) | 2.5 2.0 | PR272 PY139 | 10 4 | SY-2 | 1 | PGMEA | 80.5 |

TABLE 7

| Example | Dispersion liquid | Resin Type | Resin Added amount (part by mass) | Pigment Type | Pigment Added amount (part by mass) | Pigment derivative Type | Pigment derivative Added amount (part by mass) | Solvent Type | Solvent Added amount (part by mass) |
|---|---|---|---|---|---|---|---|---|---|
| Example 25 | (D-25) | B-16 | 4.5 | PB15:6<br>PR264<br>PY150 | 5<br>5<br>4 | SY-2 | 1 | PGMEA | 80.5 |
| Example 26 | (D-26) | B-17 | 4.5 | PB15:6<br>PR264 | 10<br>4 | SY-2 | 1 | PGMEA | 80.5 |
| Example 27 | (D-27) | B-18 | 4.5 | PB15:6<br>PR264 | 10<br>4 | SY-2 | 1 | PGMEA | 80.5 |
| Example 28 | (D-28) | B-19 | 4.5 | PR254<br>PY139 | 10<br>4 | SY-2 | 1 | PGMEA | 80.5 |
| Example 29 | (D-29) | B-20 | 4.5 | PB15:6<br>PR264 | 10<br>4 | SY-2 | 1 | PGMEA | 80.5 |
| Example 30 | (D-30) | B-21 | 4.5 | PB15:6<br>PR264 | 10<br>4 | SY-2 | 1 | PGMEA | 80.5 |
| Example 31 | (D-31) | B-22 | 4.5 | PB15:6<br>PR264 | 10<br>4 | SY-2 | 1 | PGMEA | 80.5 |
| Example 32 | (D-32) | B-23 | 4.5 | PB15:6<br>PV23 | 10<br>4 | SY-2 | 1 | PGMEA | 80.5 |
| Example 33 | (D-33) | B-24 | 4.5 | PB15:6<br>PR264 | 10<br>4 | SY-2 | 1 | PGMEA | 80.5 |
| Example 34 | (D-34) | B-25 | 4.5 | PO71<br>PY139 | 10<br>4 | SY-2 | 1 | PGMEA | 80.5 |
| Example 35 | (D-35) | B-26 | 4.5 | PB15:6<br>PR264 | 10<br>4 | SY-2 | 1 | PGMEA | 80.5 |
| Example 36 | (D-36) | B-27 | 4.5 | PB15:6<br>PR264 | 10<br>4 | SY-2 | 1 | PGMEA | 80.5 |
| Example 37 | (D-37) | B-28 | 4.5 | PB15:6<br>PR264 | 10<br>4 | SY-2 | 1 | PGMEA | 80.5 |
| Example 38 | (D-38) | B-29 | 4.5 | PB15:6<br>PR264 | 10<br>4 | SY-2 | 1 | PGMEA | 80.5 |
| Example 39 | (D-39) | B-30 | 4.5 | PB15:6<br>PR264 | 10<br>4 | SY-2 | 1 | PGMEA | 80.5 |
| Example 40 | (D-40) | B-31 | 4.5 | PB15:6<br>PR264 | 10<br>4 | SY-2 | 1 | PGMEA | 80.5 |
| Example 41 | (D-41) | B-32 | 4.5 | PB15:6<br>PR264 | 10<br>4 | SY-2 | 1 | PGMEA | 80.5 |
| Example 42 | (D-42) | B-33 | 4.5 | PB15:6<br>PR264 | 10<br>4 | SY-2 | 1 | PGMEA | 80.5 |
| Example 43 | (D-43) | B-33 | 4.5 | PB15:6<br>PR264 | 10<br>4 | SY-2 | 1 | PGMEA | 80.5 |
| Comparative example 1 | (D-44) | (R-1) | 4.5 | PB15:6<br>PV23 | 10<br>4 | SY-1 | 1 | PGMEA | 80.5 |
| Comparative example 2 | (D-45) | (R-2) | 4.5 | PB15:6<br>PV23 | 10<br>4 | SY-1 | 1 | PGMEA | 80.5 |

The raw materials described by abbreviations shown in the above tables are as follows.
(Resin)
(B-1) to (B-33), (R-1), (R-2): resins (B-1) to (B-33), (R-1), and (R-2) described above
(Pigment)
PB15:6: C. I. Pigment Blue 15:6
PV23: C. I. Pigment Violet 23
PG36: C. I. Pigment Green 36
PG58: C. I. Pigment Green 58
PG63: C. I. Pigment Green 63
PY139: C. I. Pigment Yellow 139
PY150: C. I. Pigment Yellow 150
PY185: C. I. Pigment Yellow 185
Y-1: compound having the following structure
Y-2: compound having the following structure
PR122: C. I. Pigment Red 122
PR254: C. I. Pigment Red 254
PR264: C. I. Pigment Red 264
PR272: C. I. Pigment Red 272
PO71: C. I. Pigment Orange 71

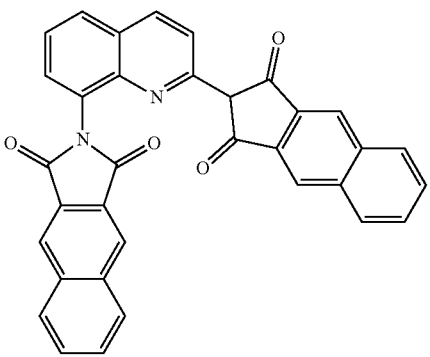

Y-1

-continued
Y-2
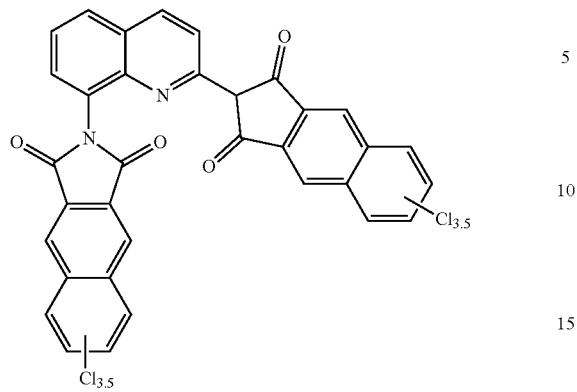
(Solvent)
    PGMEA: propylene glycol monomethyl ether acetate
    CPN: cyclopentanone
(Pigment Derivative)
    SY-1 to SY-5: compounds having the following structures
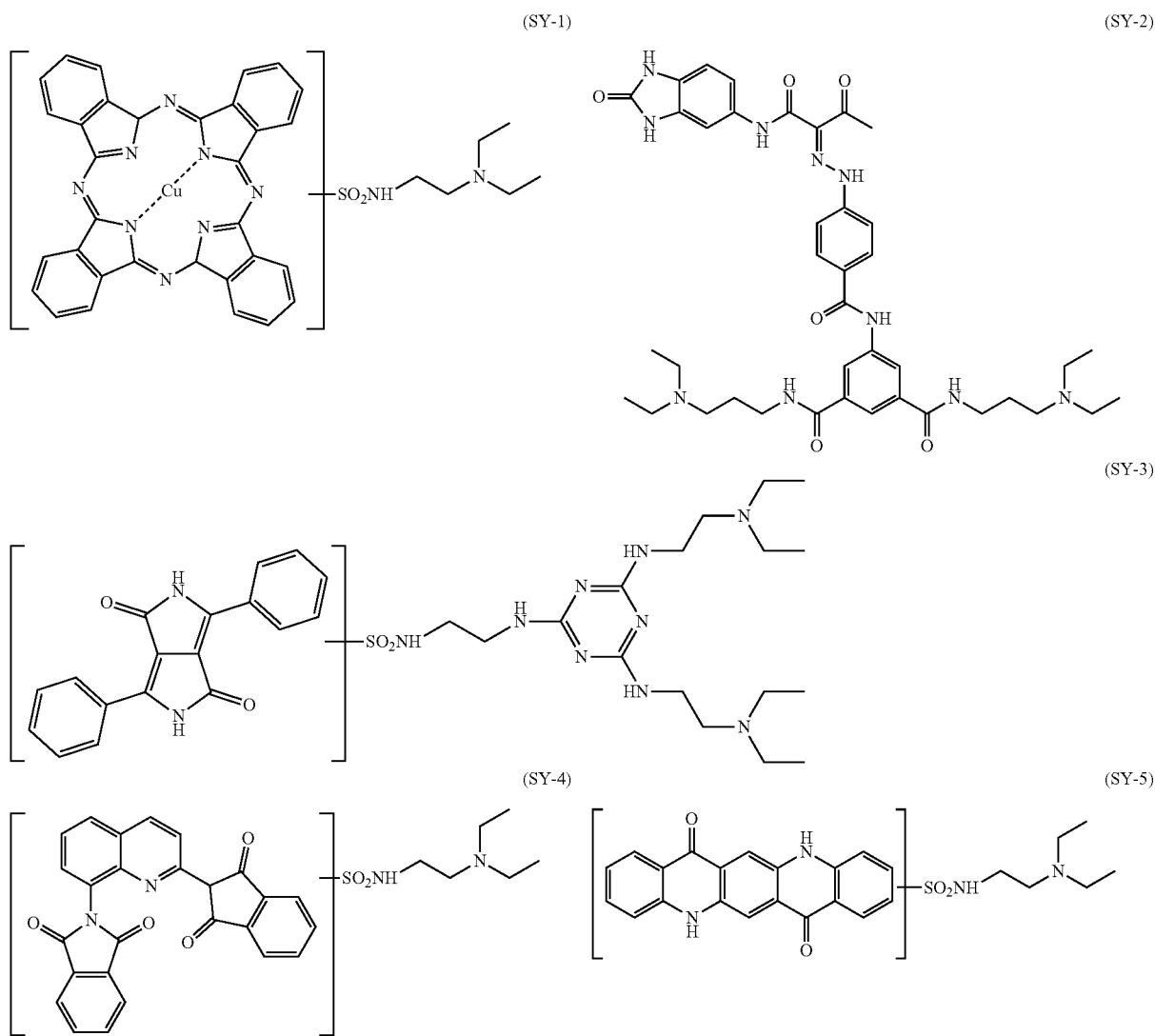

<Evaluation of Dispersibility of Pigment>
[Average Particle Diameter]

Using a particle size distribution meter (Nanotrac UPA-EX150, manufactured by Nikkiso Co., Ltd.), the average particle diameter (secondary particle diameter) of the pigment in the obtained pigment dispersion liquid was measured by a dynamic light scattering method. It is preferable that the average particle diameter of the pigment is smaller.

A: average particle diameter of the pigment was less than 30 nm.
B: average particle diameter of the pigment was 30 nm or more and less than 40 nm.
C: average particle diameter of the pigment was 40 nm or more.

[Viscosity]

The viscosity of the obtained pigment dispersion liquid immediately after production was measured using a viscometer (TV-22 type viscometer cone plate-type, manufactured by Toki Sangyo Co., Ltd.). The viscosity of the pigment dispersion liquid was measured by adjusting the temperature of the pigment dispersion liquid to 25° C.

A: viscosity was less than 5 mPa·s.
B: viscosity was 5 mPa's or more and less than 8 mPa·s.
C: viscosity was 8 mPa's or more.

[Temporal Stability]

The obtained pigment dispersion liquid was heated at a temperature of 45° C. for 7 days. The viscosity of the pigment dispersion liquid before and after heating was measured, and the absolute value of the difference between the viscosity of the pigment dispersion liquid before heating and the viscosity of the pigment dispersion liquid after heating was calculated. The viscosity of the pigment dispersion liquid was measured using a viscometer (TV-22 type viscometer cone plate-type, manufactured by Toki Sangyo Co., Ltd.). The viscosity of the pigment dispersion liquid was measured by adjusting the temperature of the pigment dispersion liquid to 25° C.

A: absolute value of the difference in viscosity was less than 0.5 mPa·s.
B: absolute value of the difference in viscosity was 0.5 mPas or more and less than 1.0 mPa·s.
C: absolute value of the difference in viscosity was 1.0 mPa's or more.

TABLE 8

| Example | Average particle diameter | Viscosity | Temporal stability |
| --- | --- | --- | --- |
| Example 1 | A | A | A |
| Example 2 | A | A | A |
| Example 3 | A | A | A |
| Example 4 | A | A | A |
| Example 5 | A | A | A |
| Example 6 | A | A | A |
| Example 7 | A | A | A |
| Example 8 | A | A | A |
| Example 9 | A | A | A |
| Example 10 | A | A | A |
| Example 11 | A | B | A |
| Example 12 | A | B | A |
| Example 13 | A | B | A |
| Example 14 | A | A | A |
| Example 15 | A | A | A |
| Example 16 | A | A | A |
| Example 17 | A | A | A |
| Example 18 | A | A | A |
| Example 19 | A | A | A |
| Example 20 | A | A | A |
| Example 21 | A | A | A |
| Example 22 | A | A | B |
| Example 23 | A | A | A |
| Example 24 | A | A | B |
| Example 25 | A | A | A |
| Example 26 | A | A | A |
| Example 27 | A | A | A |
| Example 28 | A | A | A |
| Example 29 | A | A | A |
| Example 30 | A | A | A |
| Example 31 | A | A | A |
| Example 32 | A | A | A |
| Example 33 | A | A | A |
| Example 34 | A | A | A |
| Example 35 | A | A | A |
| Example 36 | A | A | A |
| Example 37 | A | B | A |
| Example 38 | A | A | A |
| Example 39 | A | A | A |
| Example 40 | A | A | B |
| Example 41 | A | A | B |
| Example 42 | A | A | A |
| Example 43 | A | A | A |
| Comparative example 1 | C | C | C |
| Comparative example 2 | C | C | C |

As shown in the above table, in all of Examples, the particle diameter, viscosity, and temporal stability were evaluated well, and the dispersibility of the pigment was excellent.

<Production of Resin Composition (Coloring Composition)>

Examples 44 to 88 and Comparative Examples 3 and 4

The types of pigment dispersion liquid, resin, polymerizable compound, and photopolymerization initiator shown in the tables below in an amount of parts by mass shown in the tables below, 1.0 parts by mass of a surfactant $W^1$, and 0.01 parts by mass of p-methoxyphenol as a polymerization inhibitor were mixed to prepare a coloring composition.

Surfactant W1:1 mass % PGMEA solution of the following compound ("%" representing the proportion of a repeating unit is mol %; weight-average molecular weight: 14000)

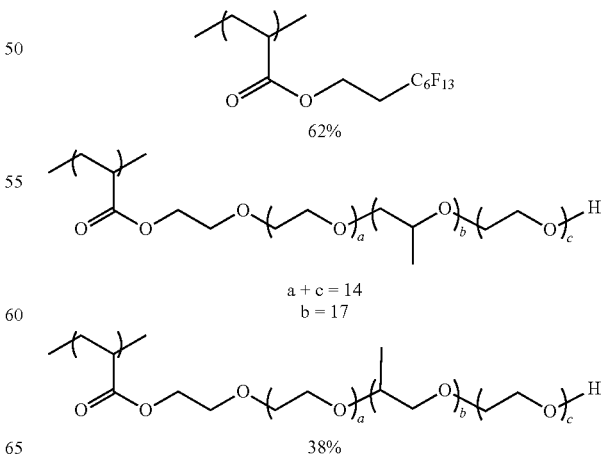

TABLE 9

| Example | Pigment dispersion liquid Type | Pigment dispersion liquid Added amount (part by mass) | Resin Type | Resin Added amount (part by mass) | Polymerizable monomer Type | Polymerizable monomer Added amount (part by mass) | Photopolymerization initiator Type | Photopolymerization initiator Added amount (part by mass) |
|---|---|---|---|---|---|---|---|---|
| Example 44 | (D-1) | 100 | B2 | 2 | M1 | 2 | I-1 | 1 |
| Example 45 | (D-2) | 100 | B2 | 2 | M2 | 2 | I-2 | 1 |
| Example 46 | (D-3) | 100 | B2 | 2 | M1 | 2 | I-3 | 1 |
| Example 47 | (D-4) | 100 | B2 | 2 | M4 | 2 | I-1 | 0.5 |
|  |  |  |  |  |  |  | I-4 | 0.5 |
| Example 48 | (D-5) | 100 | B2 | 2 | M1 | 2 | I-5 | 1 |
| Example 49 | (D-6) | 100 | B2 | 1 | M1 | 2 | I-6 | 0.5 |
|  |  |  | B3 | 1 |  |  | I-7 | 0.5 |
| Example 50 | (D-7) | 100 | B2 | 2 | M1 | 2 | I-1 | 1 |
| Example 51 | (D-8) | 100 | B2 | 2 | M1 | 2 | I-2 | 1 |
| Example 52 | (D-9) | 100 | B2 | 2 | M1 | 2 | I-1 | 1 |
| Example 53 | (D-10) | 100 | B2 | 2 | M1 | 2 | I-4 | 1 |
| Example 54 | (D-11) | 100 | B2 | 2 | M1 | 2 | I-1 | 1 |
| Example 55 | (D-12) | 100 | B2 | 2 | M1 | 1 | I-5 | 1 |
|  |  |  |  |  | M5 | 1 |  |  |
| Example 56 | (D-13) | 100 | B2 | 2 | M1 | 2 | I-2 | 0.5 |
|  |  |  |  |  |  |  | I-8 | 0.5 |
| Example 57 | (D-14) | 100 | B2 | 2 | M3 | 2 | I-3 | 1 |
| Example 58 | (D-15) | 100 | B2 | 2 | M1 | 2 | I-3 | 1 |
| Example 59 | (D-16) | 100 | B2 | 2 | M1 | 2 | I-6 | 1 |
| Example 60 | (D-17) | 100 | B2 | 2 | M1 | 2 | I-2 | 0.5 |
|  |  |  |  |  |  |  | I-10 | 0.5 |
| Example 61 | (D-18) | 100 | B2 | 2 | M1 | 1 | I-4 | 0.5 |
|  |  |  |  |  | M2 | 1 | I-9 | 0.5 |
| Example 62 | (D-19) | 100 | B2 | 2 | M1 | 2 | I-5 | 0.5 |
|  |  |  |  |  |  |  | I-7 | 0.5 |
| Example 63 | (D-20) | 100 | B2 | 2 | M1 | 1 | I-6 | 1 |
|  |  |  |  |  | M5 | 1 |  |  |
| Example 64 | (D-21) | 100 | B2 | 2 | M5 | 2 | I-3 | 1 |
| Example 65 | (D-22) | 100 | B2 | 2 | M1 | 2 | I-2 | 1 |
| Example 66 | (D-23) | 100 | B2 | 2 | M1 | 2 | I-3 | 1 |

TABLE 10

| Example | Pigment dispersion liquid Type | Pigment dispersion liquid Added amount (part by mass) | Resin Type | Resin Added amount (part by mass) | Polymerizable monomer Type | Polymerizable monomer Added amount (part by mass) | Photopolymerization initiator Type | Photopolymerization initiator Added amount (part by mass) |
|---|---|---|---|---|---|---|---|---|
| Example 67 | (D-24) | 100 | B2 | 2 | M1 | 2 | I-1 | 1 |
| Example 68 | (D-24) | 100 | B2 | 2 | M1 | 2 | I-7 | 1 |
| Example 69 | (D-24) | 100 | B1 | 2 | M1 | 2 | I-1 | 1 |
| Example 70 | (D-25) | 100 | B2 | 2 | M1 | 2 | I-1 | 1 |
| Example 71 | (D-26) | 100 | B2 | 2 | M1 | 2 | I-1 | 1 |
| Example 72 | (D-27) | 100 | B2 | 2 | M1 | 2 | I-2 | 1 |
| Example 73 | (D-28) | 100 | B2 | 2 | M1 | 2 | I-3 | 1 |
| Example 74 | (D-29) | 100 | B2 | 2 | M1 | 2 | I-1 | 1 |
| Example 75 | (D-30) | 100 | B2 | 2 | M1 | 2 | I-1 | 1 |
| Example 76 | (D-31) | 100 | B2 | 2 | M1 | 2 | I-1 | 1 |
| Example 77 | (D-32) | 100 | B2 | 2 | M1 | 2 | I-1 | 1 |
| Example 78 | (D-33) | 100 | B2 | 2 | M1 | 2 | I-1 | 1 |
| Example 79 | (D-34) | 100 | B2 | 2 | M1 | 2 | I-6 | 1 |
|  |  |  |  |  |  |  | I-7 |  |
| Example 80 | (D-35) | 100 | B2 | 2 | M1 | 2 | I-1 | 1 |
| Example 81 | (D-36) | 100 | B2 | 2 | M1 | 2 | I-1 | 1 |
| Example 82 | (D-37) | 100 | B2 | 2 | M1 | 2 | I-1 | 1 |
| Example 83 | (D-38) | 100 | B2 | 2 | M1 | 2 | I-1 | 1 |
| Example 84 | (D-39) | 100 | B2 | 2 | M1 | 2 | I-1 | 1 |
| Example 85 | (D-40) | 100 | B2 | 2 | M1 | 2 | I-1 | 1 |
| Example 86 | (D-41) | 100 | B2 | 2 | M1 | 2 | I-1 | 1 |
| Example 87 | (D-42) | 100 | B2 | 2 | M1 | 2 | I-1 | 1 |
| Example 88 | (D-43) | 100 | B2 | 2 | M1 | 2 | I-1 | 1 |
| Comparative example 3 | (D-44) | 100 | B1 | 2 | M1 | 2 | I-7 | 1 |
| Comparative example 4 | (D-45) | 100 | B1 | 2 | M1 | 2 | I-7 | 1 |

The raw materials described by abbreviations shown in the above tables are as follows.

(Pigment Dispersion Liquid)

(D-1) to (D-45) pigment dispersion liquids (D-1) to (D-45) described above (Resin)

B1: resin having the following structure (the numerical value described together with the main chain indicates a molar ratio, Mw: 30000)

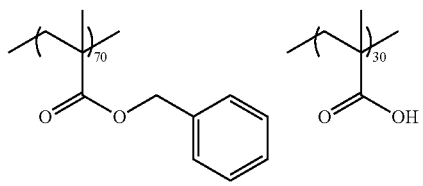

B2: resin having the following structure (the numerical value described together with the main chain indicates a molar ratio, Mw: 11000)

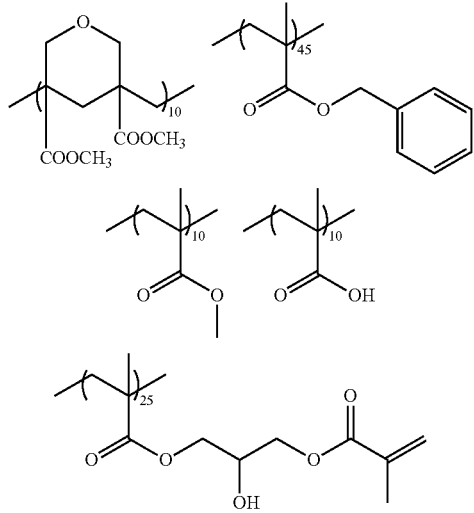

B3: resin having the following structure (the numerical value described together with the main chain indicates a molar ratio, Mw: 10000)

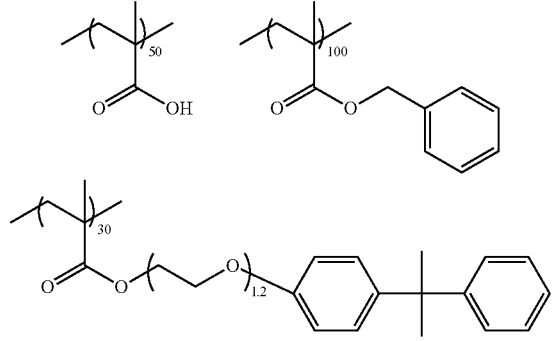

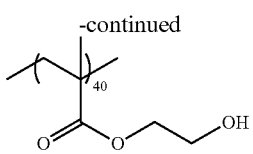

(Polymerizable Compound)

M1: KAYARAD DPHA (manufactured by Nippon Kayaku Co., Ltd.)

M2: NK ESTER A-DPH-12E (manufactured by Shin-Nakamura Chemical Co., Ltd.)

M3: NK ESTER A-TMMT (manufactured by Shin-Nakamura Chemical Co., Ltd.)

M4: succinic acid-modified dipentaerythritol pentaacrylate

M5: dipentaerythritol hexaacrylate (Photopolymerization Initiator)

I-1 to I-10: compounds having the following structures

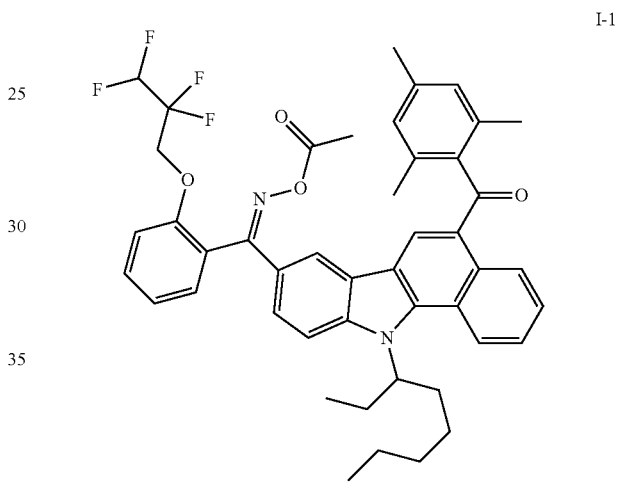

I-1

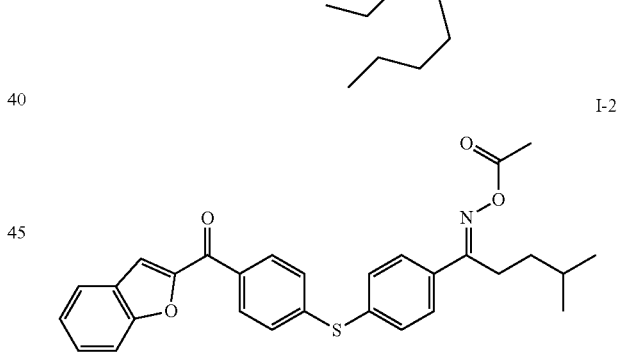

I-2

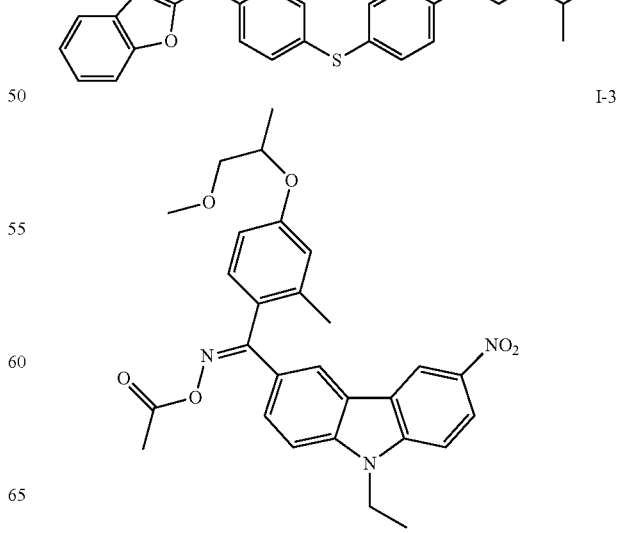

I-3

I-4
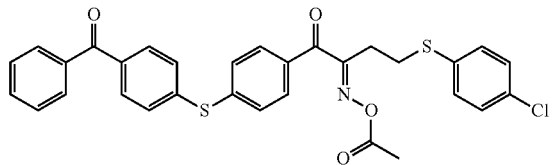

I-5
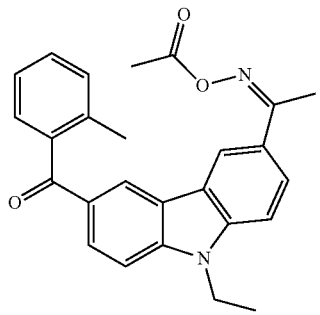

I-6
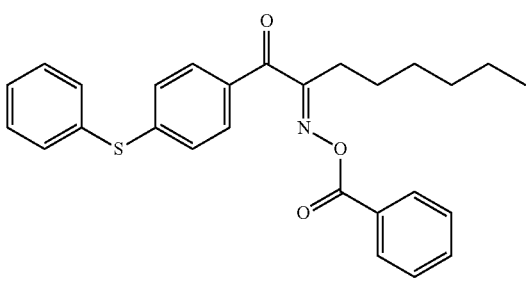

I-7
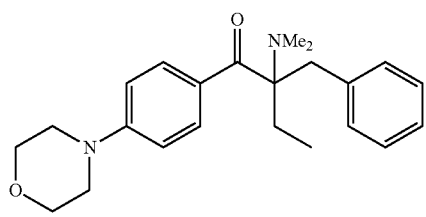

I-8
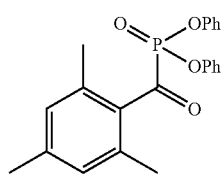

I-9
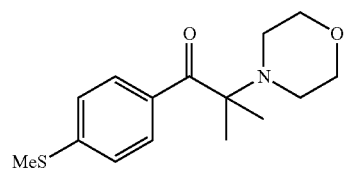

I-10
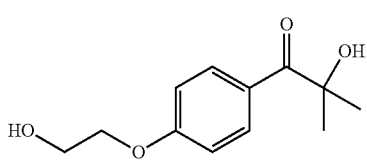

<Performance Evaluation>

(Evaluation of Heat Resistance)

A CT-4000L solution (manufactured by Fujifilm Electronic Materials Co., Ltd.; transparent base coat agent) was applied to a glass substrate so that the thickness of a dried film was 0.1 µm, and dried to form a transparent film, and a heating treatment was performed at 220° C. for 5 minutes.

Next, the glass substrate was coated with each coloring composition by a spin coating method so that the film thickness after pre-baking was 0.6 µm. Next, the glass substrate was pre-baked using a hot plate at 100° C. for 2 minutes.

Next, using an i-ray stepper exposure device FPA-3000 i5+ (manufactured by Canon Inc.), the glass substrate was exposed with light at a wavelength of 365 nm at an exposure amount of 500 mJ/cm² to produce a film.

Next, the glass substrate was placed on a horizontal rotary table of a spin-shower developing machine (DW-30 Type, manufactured by Chemitronics Co., Ltd.), and was subjected to a puddle development at 23° C. for 60 seconds using CD-2000 (manufactured by FUJIFILM Electronic Materials Co., Ltd.). Thereafter, while rotating the glass substrate by a rotation device at a rotation speed of 50 r.p.m., the glass substrate was rinsed by supplying pure water from above the center of rotation in shower-like from an ejection nozzle, and then post-baked at 200° C. for 3 minutes to produce a film.

Next, the glass substrate on which the film was formed was placed on a hot plate at 230° C. and heated for 1 hour. Using a chromaticity meter MCPD-3000 (manufactured by OTSUKA ELECTRONICS Co., LTD.), the color difference (ΔE*ab value) of the film before and after heating was measured to evaluate the heat resistance. As the ΔE*ab value is smaller, the heat resistance is better. The evaluation was performed according to the following standards.

A: ΔE*ab value was 0 or more and less than 0.5.
B: ΔE*ab value was 0.5 or more and less than 1.5.
C: ΔE*ab value was 1.5 or more and less than 3.0.
D: ΔE*ab value is 3.0 or more.

(Evaluation of Moisture Resistance)

A CT-4000L solution (manufactured by Fujifilm Electronic Materials Co., Ltd.; transparent base coat agent) was applied to a glass substrate so that the thickness of a dried film was 0.1 µm, and dried to form a transparent film, and a heating treatment was performed at 220° C. for 5 minutes.

Next, the glass substrate was coated with each coloring composition by a spin coating method so that the film thickness after pre-baking was 0.6 µm. Next, the glass substrate was pre-baked using a hot plate at 100° C. for 2 minutes.

Next, using an i-ray stepper exposure device FPA-3000 i5+ (manufactured by Canon Inc.), the glass substrate was exposed with light at a wavelength of 365 nm at an exposure amount of 500 mJ/cm² to produce a film.

Next, the glass substrate was placed on a horizontal rotary table of a spin-shower developing machine (DW-30 Type, manufactured by Chemitronics Co., Ltd.), and was subjected to a puddle development at 23° C. for 60 seconds using CD-2000 (manufactured by FUJIFILM Electronic Materials Co., Ltd.). Thereafter, while rotating the glass substrate by a rotation device at a rotation speed of 50 r.p.m., the glass substrate was rinsed by supplying pure water from above the center of rotation in shower-like from an ejection nozzle, and then post-baked at 200° C. for 3 minutes to produce a film.

Using a constant temperature and humidity chamber (manufactured by Yamato Scientific co., ltd., IW222), the obtained film was left to stand for 96 hours in an atmosphere of a temperature of 110° C. and a relative humidity of 85% to perform a moisture resistance test.

With regard to each of the films before and after the moisture resistance test, using a spectrophotometer (UV3600, manufactured by Shimadzu Corporation; reference: glass substrate), the transmittance in a wavelength range of 300 to 800 nm was measured, the rate (%) of change in transmittance, represented by |{(transmittance (%) of film before moisture resistance test−transmittance (%) of film after moisture resistance test)/transmittance (%) of film before moisture resistance test}×100|, was calculated, and the moisture resistance was evaluated according to the following standard.

- A: variation in transmittance in the entire wavelength region of 300 to 800 nm was less than 2%.
- B: variation in transmittance in the entire wavelength region of 300 to 800 nm was less than 5%, and variation in transmittance in at least a part thereof was 2% or more and less than 5%
- C: variation in transmittance in the entire wavelength region of 300 to 800 nm was less than 10%, and variation in transmittance in at least a part thereof was 5% or more and less than 10%.
- D: variation in transmittance in at least a part of a wavelength of 300 to 800 nm was 10% or more.

(Evaluation of Pattern Rectangularity)

A CT-4000L solution (manufactured by Fujifilm Electronic Materials Co., Ltd.; transparent base coat agent) was applied to a silicon wafer so that the thickness of a dried film was 0.1 μm, and dried to form a transparent film, and a heating treatment was performed at 220° C. for 5 minutes.

Next, the silicon wafer was coated with each coloring composition by a spin coating method so that the film thickness after pre-baking was 0.6 μm. Next, the silicon wafer was pre-baked using a hot plate at 100° C. for 2 minutes.

Next, with regard to Examples 44 to 59 and 63 to 88 and Comparative Examples 3 and 4, using an i-ray stepper exposure device FPA-3000 i5+ (manufactured by Canon Inc.), the composition layer was exposed to light having a wavelength of 365 nm through a mask pattern in which each of the square pixels with a side length of 1.0 μm was arranged on the substrate in a region of 4 mm×3 mm with an exposure amount of 500 mJ/cm². With regard to Examples 60 to 62, using an i-ray stepper exposure device FPA-3000 i5+ (manufactured by Canon Inc.), the composition layer was exposed to light having a wavelength of 365 nm through a mask pattern in which each of the square pixels with a side length of 5.0 μm was arranged on the substrate in a region of 4 mm×3 mm with an exposure amount of 500 mJ/cm².

Next, the composition layer after exposure was placed on a horizontal rotary table of a spin-shower developing machine (DW-30 Type, manufactured by Chemitronics Co., Ltd.), and was subjected to a puddle development at 23° C. for 60 seconds using CD-2000 (manufactured by FUJIFILM Electronic Materials Co., Ltd.). Thereafter, while rotating the silicon wafer substrate by a rotation device at a rotation speed of 50 r.p.m., the silicon wafer substrate was rinsed by supplying pure water from above the center of rotation in shower-like from an ejection nozzle, and then spray-dried.

With regard to the obtained pattern (pixel), using a length measuring scanning electron microscope (SEM) (S-7800H, manufactured by Hitachi, Ltd.), 100 patterns near the center of the silicon wafer were observed. The pattern rectangularity was evaluated according to the following standard.

- A: no distortion or chipping of the pattern was observed, and all were rectangular.
- B: there were 1 to 5 patterns in which distortion or chipping of the pattern was observed.
- C: there were 6 to 10 patterns in which distortion or chipping of the pattern was observed.
- D: there were 11 or more patterns in which distortion or chipping of the pattern was observed.

(Evaluation of Cracks)

The pattern obtained in the above-described evaluation of pattern rectangularity was heated using an oven at 300° C. for 5 minutes. Thereafter, using a length measuring scanning electron microscope (SEM) (S-7800H, manufactured by Hitachi, Ltd.), 100 patterns near the center of the silicon wafer were observed to examine the presence or absence of cracks. The cracks were evaluated according to the following standard.

- AA: no crack was observed for all 100 patterns.
- A: 1 to 3 patterns with cracks on the surface were observed.
- B: 4 to 8 patterns with cracks on the surface were observed.
- C: 9 to 12 patterns with cracks on the surface were observed.
- D: 13 or more patterns with cracks on the surface were observed.

TABLE 11

| Example | Heat resistance | Moisture resistance | Pattern rectangularity | Cracks |
|---|---|---|---|---|
| Example 44 | A | A | A | A |
| Example 45 | A | A | A | A |
| Example 46 | A | A | A | A |
| Example 47 | A | A | A | A |
| Example 48 | A | A | A | A |
| Example 49 | A | A | A | A |
| Example 50 | A | A | A | A |
| Example 51 | A | A | A | A |
| Example 52 | A | A | A | A |
| Example 53 | A | A | A | A |
| Example 54 | B | B | A | B |
| Example 55 | B | B | A | B |
| Example 56 | B | B | A | B |
| Example 57 | A | A | A | AA |
| Example 58 | A | A | A | A |
| Example 59 | A | A | A | AA |
| Example 60 | A | A | A | AA |
| Example 61 | A | A | A | AA |
| Example 62 | A | A | A | AA |
| Example 63 | A | A | A | AA |
| Example 64 | A | A | A | AA |
| Example 65 | A | A | A | AA |
| Example 66 | A | A | A | AA |
| Example 67 | B | B | B | B |
| Example 68 | B | B | C | C |
| Example 69 | B | C | B | C |
| Example 70 | A | A | A | AA |
| Example 71 | A | A | A | AA |
| Example 72 | A | A | A | AA |
| Example 73 | A | A | A | AA |
| Example 74 | A | A | A | AA |
| Example 75 | A | A | A | A |
| Example 76 | A | A | A | AA |
| Example 77 | A | A | A | AA |
| Example 78 | A | A | A | AA |
| Example 79 | A | A | A | AA |
| Example 80 | A | A | A | AA |
| Example 81 | A | A | A | AA |
| Example 82 | B | B | A | A |
| Example 83 | A | A | A | AA |
| Example 84 | A | A | A | AA |
| Example 85 | A | A | A | AA |
| Example 86 | A | A | A | AA |

TABLE 11-continued

| Example | Heat resistance | Moisture resistance | Pattern rectangularity | Cracks |
|---|---|---|---|---|
| Example 87 | A | A | A | AA |
| Example 88 | A | A | A | AA |
| Comparative example 3 | D | D | D | D |
| Comparative example 4 | D | D | D | D |

As shown in the above table, in all of Examples, the heat resistance, moisture resistance, and pattern rectangularity were good. In addition, in Examples 46, 47, 48, and 51, a green pattern (pixel) could be formed. In Examples 44, 64, and 77, a blue pattern (pixel) could be formed. In Examples 45, 49, 50, 58, 65, 66, 67, and 73, a red pattern (pixel) could be formed. In Examples 53 and 55, a yellow pattern (pixel) could be formed. In Example 52, a cyan pattern (pixel) could be formed. In Example 54, a magenta pattern (pixel) could be formed. In addition, in Examples 59, 70, 74, 75, 76, 78, and 80 to 88, a pattern (pixel) of an infrared transmission filter could be formed.

In addition, the coloring compositions of Examples 54 to 56 had good application properties, and in the evaluation of pattern rectangularity, in a case where the coating film immediately after pre-baking was visually observed, the coated surface was smooth and good. In addition, in a case of being observed with an optical microscope, there were no abnormalities such as cracks.

In addition, using the coloring compositions of Examples 57 and 64, patterns (pixels) were formed in the same manner except that the exposure amount was changed to 100 mJ/cm² in the above-described evaluation of pattern rectangularity. Using a length measuring scanning electron microscope (SEM) (S-7800H, manufactured by Hitachi, Ltd.), in a case where 100 patterns (pixels) were observed from the silicon wafer at a magnification of 30000, regardless of whether the coloring composition of Example 57 or the coloring composition of Example 64 was used, all the patterns were closely attached with each other without being peeled off by development.

Example 101

A coloring composition of Example 101 was prepared in the same manner as in Example 44, except that, in the coloring composition of Example 44, the photopolymerization initiator was changed to the same amount of thermal polymerization initiator (tert-butylperoxybenzoate).

A CT-4000L solution (manufactured by Fujifilm Electronic Materials Co., Ltd.; transparent base coat agent) was applied to a glass substrate so that the thickness of a dried film was 0.1 µm, and dried to form a transparent film, and a heating treatment was performed at 220° C. for 5 minutes.

Next, the glass substrate was coated with the coloring composition 101 by a spin coating method so that the film thickness after pre-baking was 0.6 µm. Next, the glass substrate was pre-baked using a hot plate at 100° C. for 2 minutes.

Next, the glass substrate was heated at 150° C. for 30 minutes to form a thermosetting film.

The glass substrate on which the above-described thermosetting film was formed was placed on a hot plate at 230° C. and heated for 1 hour. Using a chromaticity meter MCPD-3000 (manufactured by OTSUKA ELECTRONICS Co., LTD.), the color difference (AF*ab value) of the film before and after heating was measured to evaluate the heat resistance.

In addition, using a constant temperature and humidity chamber (manufactured by Yamato Scientific co., ltd., IW222), the above-described thermosetting film was left to stand for 96 hours in an atmosphere of a temperature of 110° C. and a relative humidity of 85% to perform a moisture resistance test.

Both heat resistance and moisture resistance were evaluated as A, which were good.

Example 1001

A silicon wafer was coated with a green coloring composition by a spin coating method so that the thickness of a film after film formation was 1.0 µm. Next, the silicon wafer was heated using a hot plate at 100° C. for 2 minutes. Next, using an i-ray stepper exposure device FPA-3000 i5+ (manufactured by Canon Inc.), exposure was performed with light having an exposure amount of 1000 mJ/cm² through a mask having a dot pattern of 2 µm square. Next, puddle development was performed at 23° C. for 60 seconds using a 0.3 mass % of tetramethylammonium hydroxide (TMAH) aqueous solution. Next, the coating film was rinsed by spin showering and was cleaned with pure water. Next, the green coloring composition was patterned by heating at 200° C. for 5 minutes using a hot plate to form a green pixel. In the same process, a red coloring composition and a blue coloring composition were patterned to sequentially form a red pixel and a blue pixel, thereby forming a color filter having the green pixel, red pixel, and blue pixel. In this color filter, the green pixel was formed in a Bayer pattern, and the red pixel and blue pixel were formed in an island pattern in an adjacent region thereof. As the green coloring composition, the coloring composition of Example 51 was used. As the red coloring composition, the coloring composition of Example 45 was used. As the blue coloring composition, the coloring composition of Example 44 was used.

Example 1002

A silicon wafer was coated with a cyan coloring composition by a spin coating method so that the thickness of a film after film formation was 1.0 µm. Next, the silicon wafer was heated using a hot plate at 100° C. for 2 minutes. Next, using an i-ray stepper exposure device FPA-3000 i5+ (manufactured by Canon Inc.), exposure was performed with light having an exposure amount of 1000 mJ/cm² through a mask having a dot pattern of 2 µm square. Next, puddle development was performed at 23° C. for 60 seconds using a 0.3 mass % of tetramethylammonium hydroxide (TMAH) aqueous solution. Next, the coating film was rinsed by spin showering and was cleaned with pure water. Next, the cyan coloring composition was patterned by heating at 200° C. for 5 minutes using a hot plate to form a cyan pixel. In the same process, a magenta coloring composition and a yellow coloring composition were patterned to sequentially form a magenta pixel and a yellow pixel, thereby forming a color filter having the cyan pixel, magenta pixel, and yellow pixel. In this color filter, the cyan pixel was formed in a Bayer pattern, and the magenta pixel and yellow pixel were formed in an island pattern in an adjacent region thereof. As the cyan coloring composition, the coloring composition of Example 52 was used. As the magenta coloring composition, the coloring composition of Example 54 was used. As the yellow coloring composition, the coloring composition of Example 53 was used.

What is claimed is:

1. A resin composition comprising:
a pigment;
a resin including a repeating unit represented by Formula (1); and
a solvent,

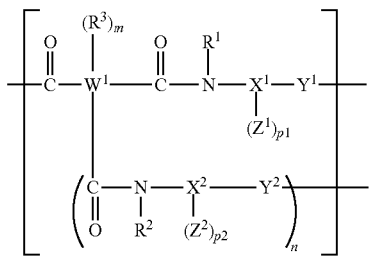

in Formula (1),
m represents an integer of 0 to 4, n represents 0 or 1, and m+n is 0 to 4, p1 and p2 each independently represent 1 or 2,
$W^1$ represents a (2+m+n)-valent linking group,
$R^1$ and $R^2$ each independently represent a hydrogen atom, an alkyl group, an aryl group, or a heterocyclic group,
$R^3$ represents a substituent, and m pieces of $R^3$'s may be the same or different from each other,
$X^1$ represents a (2+p1)-valent linking group,
$X^2$ represents a (2+p2)-valent linking group,
$Y^1$ and $Y^2$ each independently represent —O— or —NRy-, where Ry represents a hydrogen atom, an alkyl group, an aryl group, or a heterocyclic group, and
$Z^1$ and $Z^2$ each independently represent a polymer chain having a weight-average molecular weight of 500 or more,
wherein the polymer chain represented by $Z^1$ and $Z^2$ in Formula (1) includes a repeating unit represented by any one of Formula (P1-1) to Formula (P1-6),

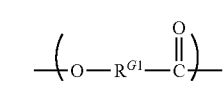 (P1-1)

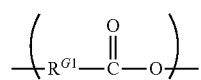 (P1-2)

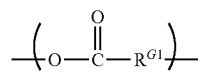 (P1-3)

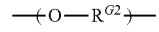 (P1-4)

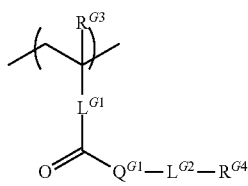 (P1-5)

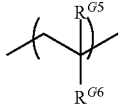 (P1-6)

in the formulae, $R^{G1}$ and $R^{G2}$ each represent an alkylene group,
$R^{G3}$ represents a hydrogen atom, a methyl group, a fluorine atom, a chlorine atom, or a hydroxymethyl group,
$Q^{G1}$ represents —O— or —NR$^q$—, where $R^q$ represents a hydrogen atom, an alkyl group, an aryl group, or a heterocyclic group,
$L^{G1}$ represents a single bond or an arylene group,
$L^{G2}$ represents a single bond or a divalent linking group,
$R^{G4}$ represents a hydrogen atom or a substituent, and
$R^{G5}$ represents a hydrogen atom or a methyl group and $R^{G6}$ represents an aryl group.

2. The resin composition according to claim 1, wherein n in Formula (1) is 0.

3. The resin composition according to claim 1, wherein m in Formula (1) represents an integer of 1 to 4, and
in a case where m is 1, $R^3$ represents a carboxy group, and in a case where m is 2 to 4, at least one of m pieces of $R^3$'s is a carboxy group.

4. The resin composition according to claim 1, wherein $Y^1$ and $Y^2$ in Formula (1) each independently represent —NRy-, where Ry represents a hydrogen atom, an alkyl group, an aryl group, or a heterocyclic group.

5. The resin composition according to claim 1, wherein $R^{G4}$ in Formula (P1-5) is an ethylenically unsaturated bond-containing group, an epoxy group, an oxetanyl group, or a blocked isocyanate group.

6. The resin composition according to claim 1, wherein the (2+p1)-valent linking group represented by $X^1$ in Formula (1) and the (2+p2)-valent linking group represented by $X^2$ are groups including a sulfur atom.

7. The resin composition according to claim 1, wherein the (2+p1)-valent linking group represented by $X^1$ in Formula (1) is a group represented by Formula (X-1), and
the (2+p2)-valent linking group represented by $X^2$ is a group represented by Formula (X-2),

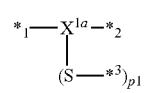 (X-1)

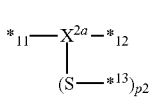 (X-2)

in Formula (X-1), $X^{1a}$ represents a (2+p1)-valent hydrocarbon group, p1 represents 1 or 2, *1 is a bonding site with a nitrogen atom adjacent to $X^1$ in Formula (1), *2 is a bonding site with $Y^1$ in Formula (1), and *3 is a bonding site with $Z^1$ in Formula (1),
in Formula (X-2), $X^{2a}$ represents a (2+p2)-valent hydrocarbon group, p2 represents 1 or 2, *11 is a bonding site with a nitrogen atom adjacent to $X^2$ in Formula (1), *12 is a bonding site with $Y^2$ in Formula (1), and *13 is a bonding site with $Z^2$ in Formula (1).

8. The resin composition according to claim 1, further comprising:
a polymerizable compound.

9. The resin composition according to claim 1, further comprising:
a photopolymerization initiator.

10. A film formed of the resin composition according to claim 1.

11. A color filter comprising:
the film according to claim 10.

12. A solid-state imaging element comprising:
the film according to claim 10.

13. An image display device comprising:
the film according to claim 10.

14. A resin comprising:
a repeating unit represented by Formula (1),

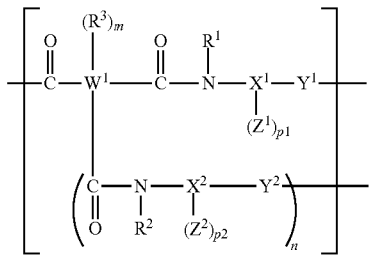
(1)

in Formula (1), m represents an integer of 0 to 4, n represents 0 or 1, and m+n is 0 to 4, p1 and p2 each independently represent 1 or 2, $W^1$ represents a (2+m+n)-valent linking group, $R^1$ and $R^2$ each independently represent a hydrogen atom, an alkyl group, an aryl group, or a heterocyclic group, $R^3$ represents a substituent, and m pieces of $R^3$'s may be the same or different from each other, $X^1$ represents a (2+p1)-valent linking group, $X^2$ represents a (2+p2)-valent linking group, $Y^1$ and $Y^2$ each independently represent —O— or —NRy-, where Ry represents a hydrogen atom, an alkyl group, an aryl group, or a heterocyclic group, and $Z^1$ and $Z^2$ each independently represent a polymer chain having a weight-average molecular weight of 500 or more, wherein the polymer chain represented by $Z^1$ and $Z^2$ in Formula (1) includes a repeating unit represented by any one of Formula (P1-1) to Formula (P1-6),

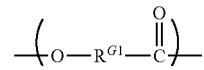
(P1-1)

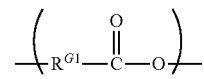
(P1-2)

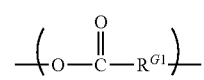
(P1-3)

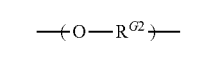
(P1-4)

(P1-5)

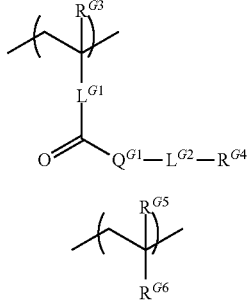
(P1-6)

in the formulae, $R^{G1}$ and $R^{G2}$ each represent an alkylene group, $R^{G3}$ represents a hydrogen atom, a methyl group, a fluorine atom, a chlorine atom, or a hydroxymethyl group, $Q^{G1}$ represents —O— or —NR$^q$—, where $R^q$ represents a hydrogen atom, an alkyl group, an aryl group, or a heterocyclic group, $L^{G1}$ represents a single bond or an arylene group, $L^{G2}$ represents a single bond or a divalent linking group, $R^{G4}$ represents a hydrogen atom or a substituent, and $R^{G5}$ represents a hydrogen atom or a methyl group and $R^{G6}$ represents an aryl group.

* * * * *